US011711022B2

(12) United States Patent
Van Zyl

(10) Patent No.: US 11,711,022 B2
(45) Date of Patent: Jul. 25, 2023

(54) SERIES STACK SWITCH CIRCUIT WITH VOLTAGE CLAMPING AND POWER RECOVERY

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

(21) Appl. No.: 17/560,397

(22) Filed: Dec. 23, 2021

(65) Prior Publication Data

US 2022/0329169 A1    Oct. 13, 2022

Related U.S. Application Data

(63) Continuation-in-part of application No. 17/229,858, filed on Apr. 13, 2021.

(51) Int. Cl.
*H02M 3/335* (2006.01)
*H02M 1/32* (2007.01)
*H03H 7/38* (2006.01)

(52) U.S. Cl.
CPC ......... *H02M 3/33571* (2021.05); *H02M 1/32* (2013.01); *H03H 7/38* (2013.01)

(58) Field of Classification Search
CPC ............................ H02M 3/33592; H02M 1/32
See application file for complete search history.

(56) References Cited

U.S. PATENT DOCUMENTS 5,606,284 A * 2/1997 Tamesue ............ H03G 3/3026
                                                    330/135
8,929,107 B2 * 1/2015 Kang ................... H02H 7/125
                                                    361/118
(Continued)

FOREIGN PATENT DOCUMENTS

CN     106341925 B *  5/2018
CN     208316381 U *  1/2019  ............ H02M 1/32
(Continued)

OTHER PUBLICATIONS

Rodriquez, Kari, "International Search Report and Written Opinion Regarding International Application No. PCT/US21/27081", dated Jul. 27, 2021, pp. 19, Published in: US.
(Continued)

*Primary Examiner* — Sisay G Tiku
(74) *Attorney, Agent, or Firm* — Neugeboren O'Dowd PC

(57) ABSTRACT

Various embodiments are directed to a switch circuit comprising: two terminal nodes, comprising an upper node and a lower node; a plurality of switch modules, connected in series between the upper node and the lower node, wherein each of the switch modules comprises a switch, a rectifier, and a capacitor; a connecting circuit, coupled to the switch modules; and a power converter, coupled to the connecting circuit and to a power sink. The switch circuit is configured to limit a voltage or a component of a voltage in the switch circuit, and to recover power from the limiting of the voltage, wherein recovering the power comprises diverting power from the switch modules via the connecting circuit to the power converter, and the power converter outputting the power to the power sink.

20 Claims, 48 Drawing Sheets

(56) References Cited

U.S. PATENT DOCUMENTS

| | | |
|---|---|---|
| 9,019,669 B1 | 4/2015 | Ransijn |
| 10,148,188 B2 | 12/2018 | Koo et al. |
| 10,587,206 B1 | 3/2020 | Xiao et al. |
| 2006/0139823 A1* | 6/2006 | Shoji ................. H02M 1/34 361/56 |
| 2008/0074909 A1* | 3/2008 | Mehta ............... H05B 41/2853 363/52 |
| 2010/0283395 A1 | 11/2010 | Van Zyl et al. |
| 2011/0101898 A1 | 5/2011 | Shinomoto et al. |
| 2012/0235504 A1 | 9/2012 | Kesler et al. |
| 2014/0210508 A1 | 7/2014 | Valcore, Jr. et al. |
| 2015/0263511 A1 | 9/2015 | Sandner et al. |
| 2016/0380425 A1* | 12/2016 | Chapman .......... H02M 3/33573 363/21.01 |
| 2018/0006448 A1 | 1/2018 | Glaser et al. |
| 2019/0131940 A1 | 5/2019 | Moise et al. |
| 2019/0273496 A1* | 9/2019 | Van Zyl ................. H03K 17/74 |
| 2021/0320594 A1* | 10/2021 | Van Zyl ................... H03H 7/52 |
| 2022/0329169 A1* | 10/2022 | Van Zyl ............ H02M 3/33576 |
| 2022/0329170 A1* | 10/2022 | Van Zyl ............ H02M 3/33573 |

FOREIGN PATENT DOCUMENTS

| | | | | |
|---|---|---|---|---|
| EP | 3514907 A1 | | 7/2019 | |
| JP | H0767318 A | * | 3/1995 | |
| JP | 2021035205 A | | 3/2021 | |
| WO | WO-2010013344 A1 | * | 2/2010 | ............ H02M 1/126 |
| WO | WO-2010064284 A1 | * | 6/2010 | .......... H02M 1/4225 |
| WO | 2021211582 A1 | | 10/2021 | |
| WO | WO-2022155837 A1 | * | 7/2022 | |

OTHER PUBLICATIONS

ISA/KR, "International Search Report and Written Opinion Regarding International Application No. PCT/US2022/020515", dated Jul. 14, 2022, pp. 9, Published in: KR.

Jang, GI Jeong, "International Search Report and Written Opinion Regarding Application No. PCT/US2022/053313", dated May 3, 2022, p. 10, Published in: KR.

* cited by examiner

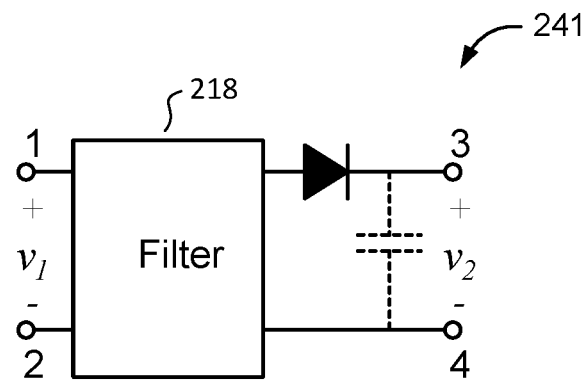
FIG. 2D
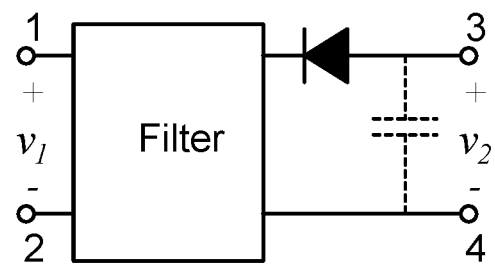
FIG. 2E
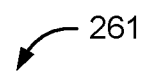
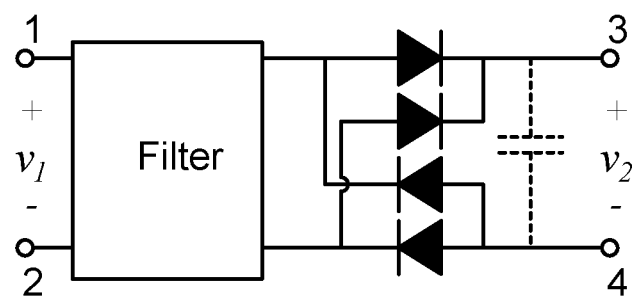
FIG. 2F

SERIES STACK SWITCH CIRCUIT WITH VOLTAGE CLAMPING AND POWER RECOVERY

RELATED APPLICATION

This application is a continuation-in-part of application Ser. No. 17/229,858, filed on Apr. 13, 2021, the entirety of which is incorporated by reference herein.

TECHNICAL FIELD

Aspects of the present disclosure relate generally to power supplies and impedance matching networks.

BACKGROUND

Power supplies and impedance matching networks that apply power to plasma systems, such as power amplifiers, radio frequency (RF) generators, electron volt-type (eV-type) source generators, impedance matching networks, direct current (DC) power supplies, and alternating current (AC) power supplies, are frequently subject to damaging events such as sudden changes in the load impedance presented by the plasma system, arcing, and unstable plasma systems. Damage caused by overvoltage events generally happen much more quickly than control systems are able to react to, as opposed to damage caused by high dissipation and high current events, in which the thermal capacity of the components provides some ability to absorb the impact of the event until the control system can react. In some cases, for example, in silicon carbide devices, overcurrent events can also cause damage more quickly than the reaction time of many control systems. Circuits that clamp voltage and/or current can temporarily protect sensitive devices, circuits, and systems from overvoltage and/or overcurrent events, but in the process of doing so, the voltage and/or current clamp absorbs power from the circuit, typically limiting the length of time the clamp can perform the clamping function.

SUMMARY

Various aspects disclosed herein provide voltage clamps and current clamps with power recovery, and generators, match networks, and systems comprising the same. Voltage clamps and current clamps of the present disclosure may implement safe and sustainable power recovery to a power reservoir, in contrast to prior art voltage clamps and current clamps which typically divert power to dissipative circuit elements, are constrained by internal circuit heat dissipation rates, are only able to operate for a short period of time before overheating, and waste the power from the clamping into waste heat. Voltage clamps and current clamps of the present disclosure may be capable of clamping voltage and/or current for extended or indefinite periods of time, and for longer periods of time than may be needed to provide as much voltage clamping and/or current clamping as may be desired within the entire performance envelope of associated systems. Voltage clamps and current clamps of the present disclosure may provide the further advantage of recovering and recycling the power of overvoltage or overcurrent conditions back to a power reservoir, where such recovered power may be usefully drawn from again, rather than wasting such power on dissipative heating of circuit elements. Systems incorporating such voltage clamps and/or current clamps of the present disclosure may provide these and other specialized advantages in various applications.

Systems of the present disclosure incorporating current clamps and/or voltage clamps with power recovery may include single-switch and multiple-switch systems, RF systems such as RF generators and RF impedance matching networks, other types of generators, series stack switch circuits, and parallel connected switch circuits, among other systems.

Various illustrative aspects are directed to a switch circuit that includes two terminal nodes, comprising an upper node and a lower node; a plurality of switch modules, connected in series between the upper node and the lower node, wherein each of the switch modules comprises a switch, a rectifier, and a capacitor; a connecting circuit, coupled to the switch modules; and a power converter, coupled to the connecting circuit and to a power sink. The switch circuit is configured to limit a voltage or a component of a voltage in the switch circuit, and to recover power from the limiting of the voltage, wherein recovering the power comprises diverting power from the switch modules via the connecting circuit to the power converter, and the power converter outputting the power to the power sink. In some examples, the switch circuit is further configured to limit a component of a voltage across one or more respective switch modules, and/or across one or more respective switches of the switch modules. The voltage across a switch may also be referred to as the voltage drop or the voltage difference across the switch.

Various illustrative aspects are directed to a method comprising applying voltage across a plurality of switch modules connected in series between two terminal nodes, comprising an upper node and a lower node, wherein each of the switch modules comprises a switch, a rectifier, and a capacitor. The method further includes diverting power from the switch modules via a connecting circuit, coupled to the switch modules, to a power converter, coupled to the connecting circuit and to a power sink, thereby limiting a component of a voltage over one or more of the switches and/or switch modules, and recovering power from the limiting of the voltage to the power sink.

Various illustrative aspects are directed to a computing system that includes one or more processing devices, one or more tangible computer-readable memory devices, and one or more tangible computer-readable data storage devices. The computing system further includes program instructions, stored on the one or more data storage devices for execution by the one or more processing devices using the one or more memory devices, to configure a switch circuit applying voltage across a plurality of switch modules connected in series between two terminal nodes, comprising an upper node and a lower node, wherein each of the switch modules comprises a switch, a rectifier, and a capacitor. The computing system further includes program instructions, stored on the one or more data storage devices for execution by the one or more processing devices using the one or more memory devices, to configure the power converter and the rectifier to divert power from the switch modules via a connecting circuit, coupled to the switch modules, to a power converter, coupled to the connecting circuit and to a power sink, thereby limiting a component of a voltage over one or more of the switches and/or switch modules, and recovering power from the limiting of the voltage to the power sink.

Various further aspects are depicted in the accompanying figures and described below, and will be further apparent based thereon.

BRIEF DESCRIPTION OF THE DRAWINGS

Various features and advantages of the technology of the present disclosure will be apparent from the following description of particular embodiments of those technologies, and as illustrated in the accompanying drawings. The drawings are not necessarily to scale; the emphasis instead is placed on illustrating the principles of the technological concepts. In the drawings, like reference characters may refer to the same parts throughout the different views. The drawings depict only illustrative embodiments of the present disclosure and, therefore, are not to be considered limiting in scope.

FIGS. 2A-2F illustrate various example rectifier circuits that can be used in connection with a voltage clamp with power recovery in various embodiments of the present disclosure.

DETAILED DESCRIPTION

Figure 1A:
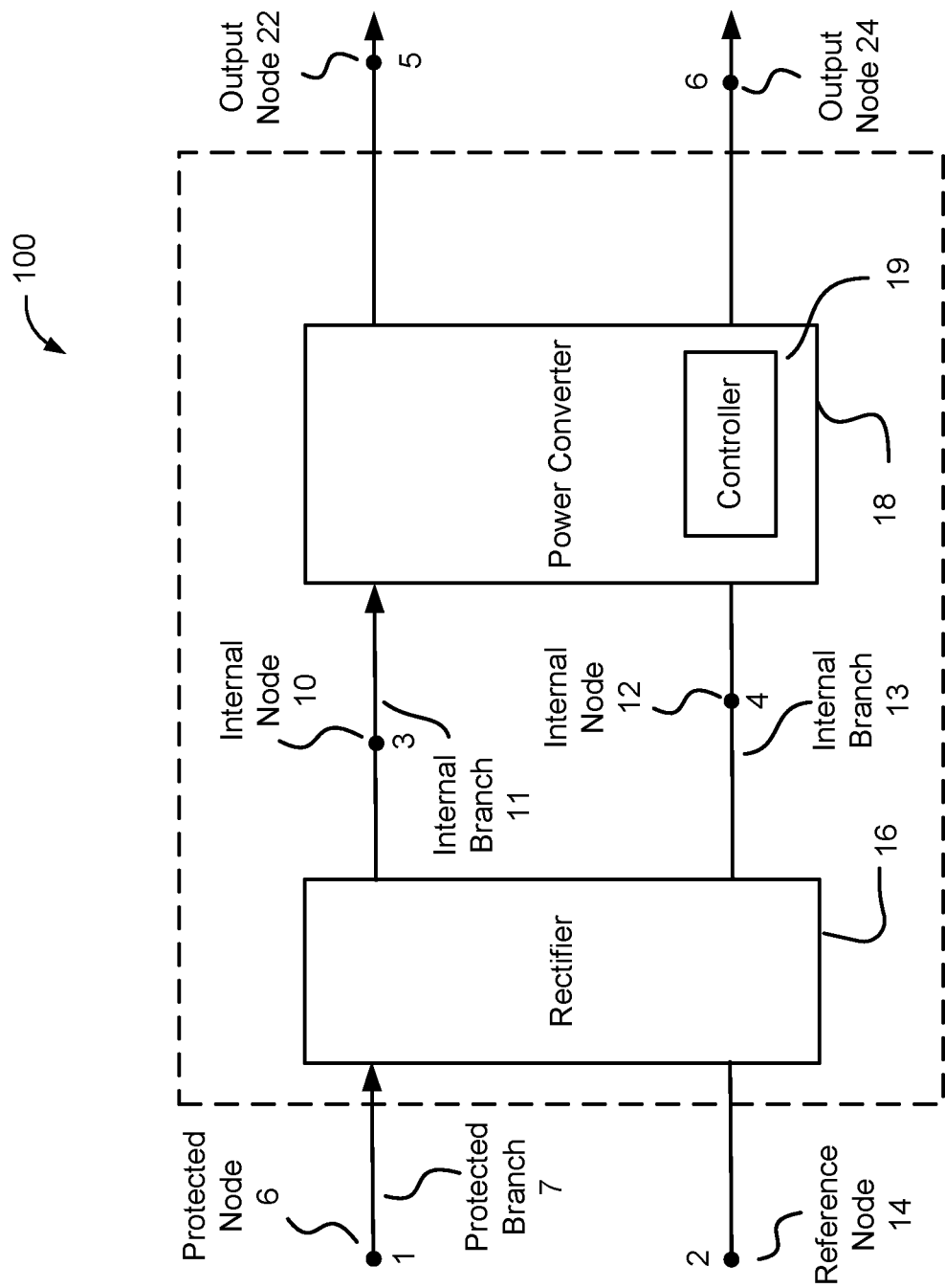
FIG. 1A illustrates a block diagram of an example clamp with power recovery, according to an embodiment of the present disclosure.

Embodiments of the present disclosure may provide voltage clamping and/or current clamping circuits with power recovery, such as for clamping voltages between protected and reference nodes, and limiting current in protected branches in circuits, respectively. By recovering power to a power sink, which may be, e.g., a DC bus or an AC utility power supply to a building, the clamping circuits can operate in a clamping mode for extended time periods, unlike clamping circuits that dissipate power to perform a clamping function. Power recovery also improves overall system efficiency. A power converter that maintains a constant input voltage or input current for voltage clamping circuits or current clamping circuits, respectively, allows for control over the level at which voltage or current is clamped, and accepts power from the clamping circuit and directs it to a power sink while the clamping operation is active.

In some embodiments, circuits for clamping the voltage over each of multiple devices stacked in series, and using a special arrangement of diodes to direct current to the input of a single converter, allows for a single power converter to recover power to a power sink while clamping the voltages over each individual device in the stack.

In some embodiments, circuits for clamping the current through each of multiple devices in parallel and using a special arrangement of diodes to direct current to a single power converter allows for a single power converter to recover power to a power sink while clamping the currents through each individual device connected in parallel.

In some embodiments, voltage clamps can be used to, e.g., limit the maximum voltage over a protected device, such as a metal-oxide semiconductor field effect transistor (MOSFET) used in a power amplifier, or a capacitor or PIN diode in a solid-state match. In some embodiments and applications, there may be no protected device between the protected and reference nodes that the voltage clamp is limiting, but limiting voltage between those specific nodes may provide useful functions such as limiting impedance excursions or voltage and current elsewhere in a circuit, among other advantageous functions.

In some embodiments, current clamps may be used, e.g., to enforce a maximum current through a device such as an inductor or the drain current of a MOSFET. In some embodiments and applications, there may be no protected device in the current branch that the current clamp is limiting, but limiting the current in that specific branch, as noted above with reference to voltage clamp embodiments, may provide useful functions such as limiting impedance excursions or voltage and current elsewhere in a circuit, among other advantageous functions.

In this disclosure, "applying voltage" to or across a device, circuit, or system (e.g., a switch) may mean causing a voltage across the device, circuit, or system by for example opening a switch while current is flowing through the switch, causing a voltage over the switch because of the current flowing through the increased switch impedance. Similarly, "conducting a current" through or in a device, circuit, or system (e.g., a switch) may mean causing a current to flow through the device, circuit, or system by, for example, closing a switch while a voltage exists across the switch because of the voltage applied over the increased switch admittance; i.e., it is not necessary to use a voltage source to apply a voltage, nor a current source to conduct a current, nor a power source to apply power. Any one of a voltage, current, power, Thévenin equivalent source, etc. can be used to apply any one of voltage, current, or power.

FIG. 1A depicts a block diagram of an example clamp 100 with power recovery, in accordance with one embodiment. Clamp 100 may function as a voltage clamp with power recovery or a current clamp with power recovery, in various embodiments. Clamp 100 includes a rectifier 16 and a power converter 18, coupled to each other via internal nodes 10 and 12 on internal branches 11 and 13. Rectifier 16 is coupled to a protected node 6 configured to connect to an external protected device, and a reference node 14. Power converter 18 comprising controller 19 is coupled to power recovery output nodes 22, 24, and is configured to connect thereby to a power sink. Rectifier 16 is configured to connect with a protected device via protected node 6 on protected branch 7, and thereby to provide voltage clamping of the voltage between the protected node 6 and reference node 14 or current clamping of the current through the protected device, while providing power recovery via power recovery output nodes 22 and 24. These functions for both voltage clamp and current clamp embodiments are explained further below, with reference to a number of additional embodiments. In some embodiments there is no protected device but either clamping the voltage between the protected node 6 and reference node 14 or clamping the current in the protected branch 7 provides a benefit such as controlling impedance excursions, protecting against voltage breakdown, protecting against excessive dissipation, or limiting voltage and current elsewhere in a circuit or system, among various other novel and useful advantages.

Figure 1B:
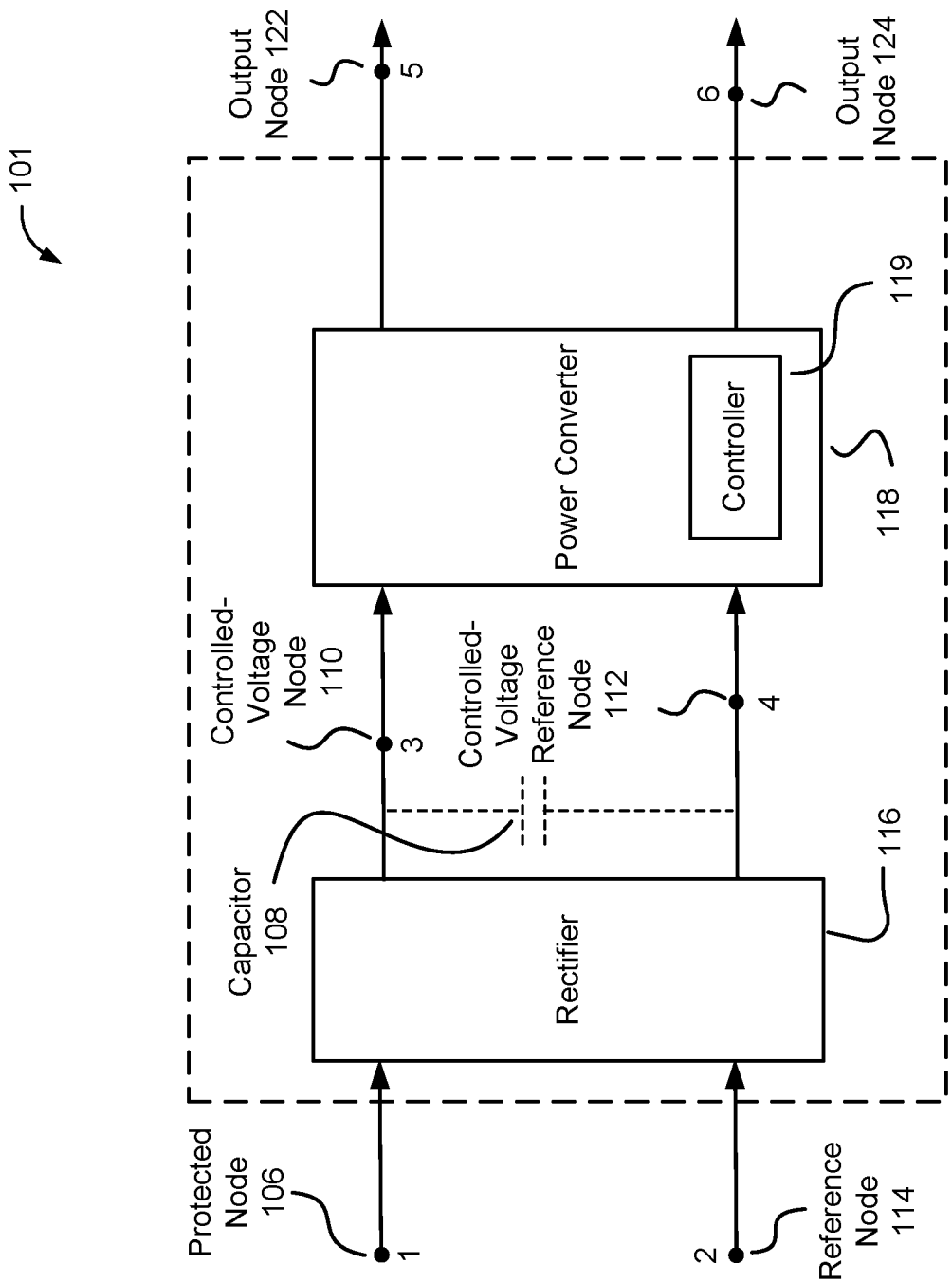
FIG. 1B illustrates a block diagram of an example voltage clamp with power recovery according to an embodiment of the present disclosure.

FIG. 1B illustrates a block diagram of an example voltage clamp 101 with power recovery, according to one embodiment of the present disclosure. Voltage clamp 101 has a protected node 106 and a reference node 114, and two power recovery output nodes 122, 124. Voltage clamp 101 includes a rectifier 116, a power converter 118, and a capacitor 108. Power converter 118 comprises controller 119 and is coupled to rectifier 116 via a controlled-voltage node 110 and a controlled-voltage reference node 112. Capacitor 108 is coupled between controlled-voltage node 110 and a controlled-voltage reference node 112. Rectifier 116 is coupled to protected node 106 and a reference node 114, and power converter 118 is coupled to power recovery output nodes 122 and 124. Voltage clamp 101 may be configured to connect protected node 106 and reference node 114 to a power sink (not shown in FIG. 1B) via power recovery output nodes 122 and 124. Voltage clamp 101 may be configured to connect to a protected device (not shown in FIG. 1B) via protected node 106 and reference node 114 and to limit the voltage, or a component of the voltage, between the protected node 106 and reference node 114 by diverting power via power recovery output nodes 122 and 124 to a power sink. In various embodiments, the power sink may be external to voltage clamp 101. In other embodiments, a voltage clamp may include a power sink (not shown in FIG. 1B). Rectifier 116 thus connects protected node 106 and reference node 114 to the input of power converter 118. The power converter 118 is configured to maintain a constant voltage over the input nodes of the power converter by directing power to a power sink. Capacitor 108 assists in maintaining the voltage between the controlled voltage node 110 and the controlled voltage reference node 112. The capacitor may be a discrete capacitor of be part of the power converter, or may not be needed if the power converter is capable of maintaining the voltage at the converter input without the capacitor 108.

Figure 1C:
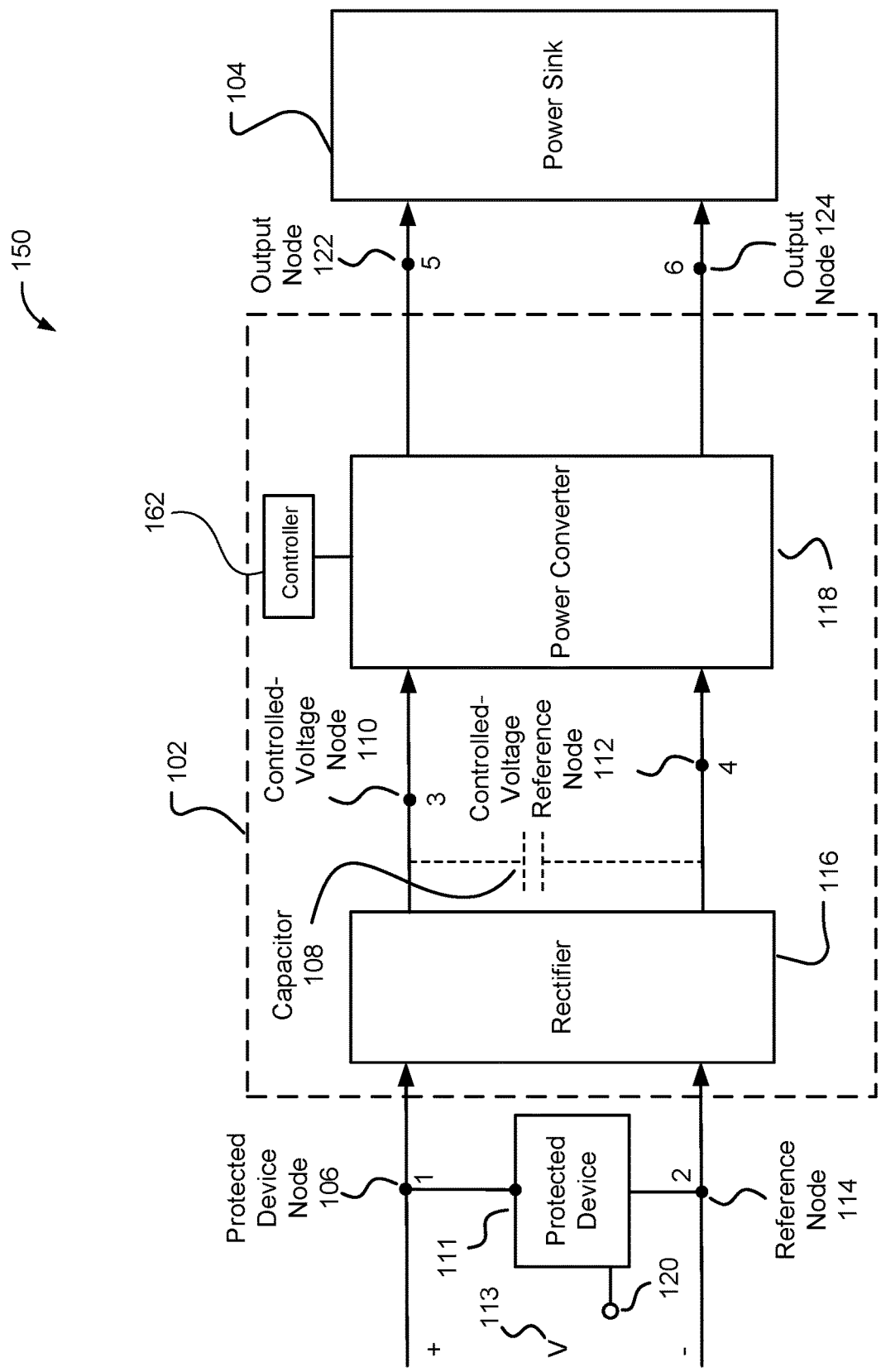
FIG. 1C illustrates a block diagram of an example voltage clamp with power recovery, coupled to a protected device and a power sink, according to an embodiment of the present disclosure.

FIG. 1C illustrates a block diagram of an example circuit 150 comprising a voltage clamp 102 with power recovery according to an embodiment of the present disclosure. The voltage clamp 102 connects protected node 106 and reference node 114 of voltage clamp 102 to a power sink 104. The voltage clamp 102 limits the voltage or a component of a voltage V 113 between the protected node 106 and reference node 114, including by diverting power to the power sink 104. As described above, rectifier 116 connects the protected node 106 and reference node 114 to the input of power converter 118. Protected node 106 and reference node 114 may be considered indirectly connected to the input of power converter 118, in that protected node 106 and reference node 114 are connected to the input of power converter 118 through rectifier 116, rather than protected node 106 and reference node 114 being directly connected to the input of power converter 118. Power converter 118 maintains a constant voltage over the input nodes of the power converter, i.e., controlled-voltage node 110 and controlled-voltage reference node 112, by directing power to power sink 104, as needed to maintain that constant voltage over the input nodes of power converter 118, i.e., controlled-voltage node 110 and controlled-voltage reference node 112. In some examples, a controller 162 is connected to or comprised in power converter 118 and executes control processes or methods to direct the function of power converter 118. Any of the functions or effects of power converter 118 may be performed, executed, or embodied by controller 162, in various embodiments. The power sink 104 may be, e.g., a DC rail in a power amplifier, or an AC utility supply. A DC rail or DC bus in this context is a node that is held at a DC voltage with respect to a reference node by a DC power supply and from which power is drawn, e.g., a DC power supply may provide 150 V between a DC rail and a reference node, and a RF power amplifier may connect to both the DC rail and the reference node to draw power from the DC power supply and produce RF power. Using a DC rail as a power sink generally may mean that the DC power supply connected to the rail can deliver less DC power than what it would have in the absence of using the rail as a power sink. In the embodiment of FIG. 1C, voltage clamp 102 also includes a capacitor 108, connected between the power converter input nodes, i.e., controlled-voltage node 110 and controlled-voltage reference node 112. In this embodiment, capacitor 108 may help maintain the voltage between the controlled-voltage node 110 and controlled-voltage reference node 112. In various other embodiments, depending on the design of power converter 118 and the distance between the rectifier 116 and power converter 118, a power recovery voltage clamp of this disclosure may not include a capacitor between controlled-voltage node 110 and controlled-voltage reference node 112 (as in the embodiment of FIG. 1A).

Not all the nodes need to be distinct nodes. In some embodiments of the power recovery voltage clamp, the reference node 114 and controlled-voltage reference node 112 may both be embodied in a single node. Terminals of a protected device 111 may connect to the protected node 106 and reference node 114. These terminals may be, e.g., the drain and source or gate and source terminals of a MOSFET device. The protected device may have other terminals, e.g., terminal 120. The design of the rectifier 116 and the power converter 118 may help determine which component of the voltage between the protected node 106 and reference node 114 will be limited, of a number of various voltage components that may be limited. The limited voltage component may be, for example, the maximum voltage value, the minimum voltage value, the absolute value of voltage, the maximum of the low frequency component of the voltage, or the absolute value of the high frequency component of the voltage, among other potential examples.

In some embodiments, voltage clamp 102 may be provided by itself, with no protected device attached, and ready to connect to a protected device. In other embodiments, voltage clamp 102 may include protected device 111 attached thereto. In various embodiments, voltage clamp 102 may be packaged together with protected device 111, or one or more components of voltage clamp 102 may be packaged together with protected device 111. For example, rectifier 116 and protected device 111 may be packaged together. In another example, protected device 111, rectifier 116, and capacitor 108 may be packaged together. Various components, such as protected device 111, rectifier 116, and capacitor 108, may be packaged together on a substrate, such as a ceramic substrate.

Systems of this disclosure may thus recover power for future useful purposes. "Recovering the power" may include a meaning that the power is usefully recovered to be used again. Recovered power is understood in contrast to power that is dissipated, lost to waste heat or otherwise lost to entropy, and no longer available to apply to a useful function, and has transformed into dissipated energy over time, rather than power. "Recovering the power" may also include a meaning of "recovering the energy," or that the energy of the power may recovered into a static form of storage, such as a battery, where the energy may not be applied in a useful physical process over time, and thus does not take the form of power for a time. In other words, "recovered power" may include power that a system of this disclosure may recover and then transform into static energy, such that that static energy may then not constitute "power" at certain intervals of subsequent time, because it is static and not being deployed at those later times. In other embodiments, recovered power may be usefully recovered directly to a power sink, which may generally take the form of a dynamic power reservoir and source, such as an AC power source, a DC power source, a DC rail, or a connected battery, any of which may continue to dynamically provide useful power to any one or more systems, in various embodiments. Thus, a "power sink" may generally include such a system that is capable of receiving recovered power and of usefully delivering power to systems or devices. As another matter, "recovering the power" may not necessarily mean recovering the entirety of power, since it would be physically impossible to implement a realistic electronic circuitry system to maintain perfect thermal equilibrium and absolute zero entropy gain; but rather, as used in this disclosure, various embodiments may recover substantial or significant amounts of power, or at least an iota of power, that otherwise might be lost to heat dissipation, entropy, or otherwise non-useful form as a result of voltage clamping or current clamping.

FIGS. 2A through 2J show various rectifiers or rectifier modules which may be example embodiments of rectifier 116 in FIGS. 1B and 1C, and rectifier module sub-circuit elements (e.g., filters) that may embody components of rectifier 116, which may be used as part of or in connection with a voltage clamp with power recovery in various embodiments of the present disclosure. The subject matter of FIGS. 2A through 2J may be referred to as rectifiers or rectifier modules, that may include individual, discrete rectifiers as circuit elements, and where the entire circuitry in each figure may functionally formulate a larger, more complex rectifier, which may also be referred to as a rectifier module. As described below with reference to various figures, a rectifier module may thus include either a discrete rectifier circuit element or a larger block of circuitry that includes a discrete rectifier and/or that includes a rectifier and/or collectively functionally performs as a rectifier, and a rectifier module may be referred to as a rectifier, in various embodiments. In the description that follows, various elements may be referred to both with a circuit diagram identifier and a patent reference number, e.g., voltage v1, 210, and node 1, 202. It will be understood that references to nodes 1-4 or voltages v1 and v2 refer to their own separate respective elements (e.g., nodes, voltages) across the different figures.

Figure 2A:
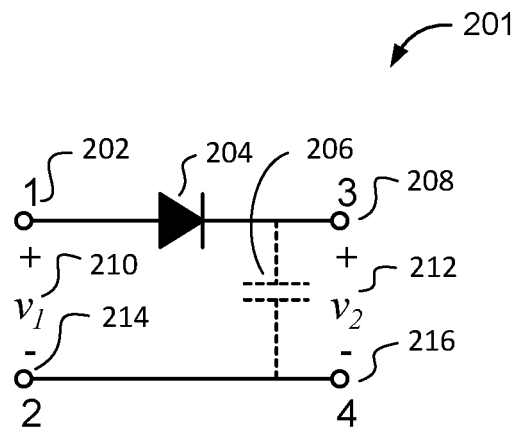

FIG. 2A shows a rectifier 201 capable of limiting a voltage v1, 210, to a maximum value of a voltage v2, 212, plus the voltage of one diode voltage drop across diode 204, e.g., between 0.4 and 1.2 volt in some examples. In other embodiments, any diode with any associated diode voltage drop may be implemented. In some cases, the diode 204 may be replaced by multiple diodes in series, which may help enable withstanding higher voltages when the diode is in the off state. In those cases, the effective diode voltage drop increases. In FIG. 2A, node 1, 202, may embody the protected node 106 of FIGS. 1B and 10; node 2, 214, may embody the reference node 114 of FIGS. 1B and 10; node 3, 208, may embody the controlled-voltage node 110 of FIGS. 1B and 1C; and node 4, 216, may embody the controlled-voltage reference node 112 of FIGS. 1B and 1C. The same holds for nodes 1 through 4 of example rectifiers 221, 231, 241, 251, 261, respectively, of FIGS. 2B through FIG. 2F. That is, rectifiers 221, 231, 241, 251, 261 are each example embodiments of rectifier 116 of FIGS. 1B and 1C; and in each, nodes 1-4 may embody protected node 106, reference node 114, controlled-voltage node 110, and controlled-voltage reference node 112, respectively, of FIGS. 1B and 1C. Note that for the rectifier 201 of FIG. 2A, the reference node 2, 214, and controlled-voltage reference node 4, 216, are the same node—that is, they are directly connected by a conductive line. This is also true for the rectifier 221 of FIG. 2B, in which reference node 2 and controlled-voltage reference node 4 are the same node, i.e., directly connected by a conductive line. In other embodiments, such as for the rectifiers 231, 241, 251, 261 of FIGS. 2C-2F, reference node 2 and controlled-voltage reference node 4 may be separate nodes.

The rectifier 201 of FIG. 2A contains a single diode 204, or multiple series connected diodes acting like a single diode with a higher effective diode voltage drop, and depicted in FIG. 2A as a single diode 204. While rectifier 201 is depicted in FIG. 2A as including capacitor 206, which corresponds to the optional capacitor 108 of FIGS. 1B and 1C, in other embodiments otherwise conforming to FIG. 2A, a rectifier may omit a capacitor such as capacitor 206, and may not include a capacitor.

Figure 2B:
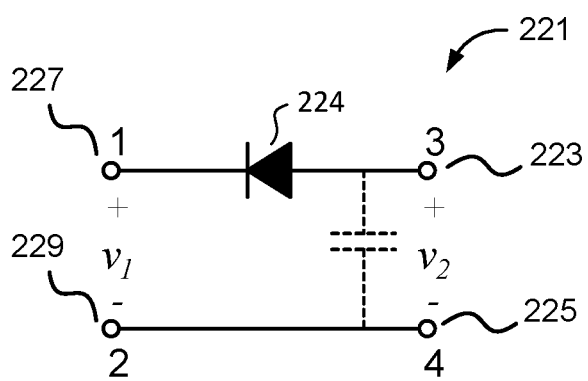
Figure 2C:
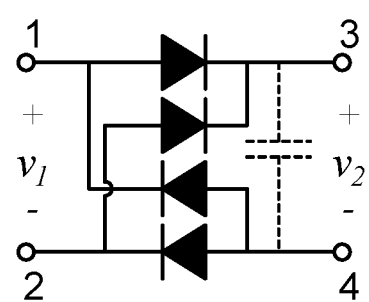
Figure 2G:
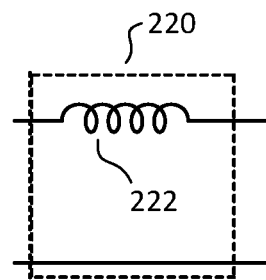
FIGS. 2G-2J illustrate various filters that can be used in connection with rectifiers that can be used in connection with a voltage clamp with power recovery in various embodiments of the present disclosure.
Figure 2H:
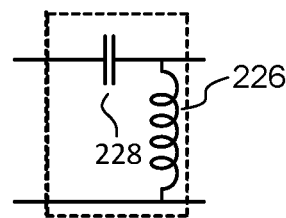
Figure 2I:
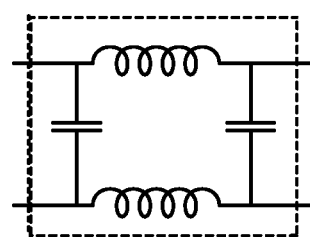
Figure 2J:
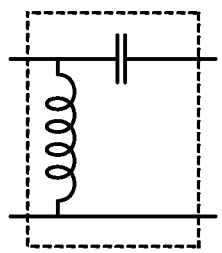

Rectifier 221 of FIG. 2B has a first voltage v1 across protected node 1, 227, and reference node 2, 229, and a second voltage v2 across controlled-voltage node 3, 223, and controlled-voltage reference node 4, 225. The rectifier 221 of FIG. 2B limits the value of voltage v1 to a minimum of voltage v2 minus the voltage difference of one diode voltage drop, corresponding to the voltage drop across diode 224. The rectifier 231 of FIG. 2C limits the amplitude of the voltage v1 (across protected node 1 and reference node 2) to the voltage v2 (across controlled-voltage node 3 and controlled-voltage reference node 4) plus two diode voltage drops. Each of the rectifiers 201, 221, 231, shown in FIG. 2A through 2C, respectively, may be combined with filters (e.g., filter 218 of FIG. 2D), as shown in rectifiers 241, 251, 261 of FIG. 2D through 2F, to further select, determine, or embody components of the voltage v1 as shown in FIG. 2D through 2F.

A few illustrative embodiment topologies for the filters of FIGS. 2D-2F (e.g., filter 218) are shown in FIG. 2G through 2J. The filter 220 of FIG. 2G contains a single inductor 222 and selects the DC component of the voltage v1. Using the filter of FIG. 2G in the rectifier of FIG. 2D would, for example, limit the low frequency or DC component of voltage v1 to voltage v2 plus one diode voltage drop, but would allow the AC or RF component of voltage v1 to go above the limit set by the voltage clamp. The filter of FIG. 2H contains a single capacitor 228 and a single inductor 226 and selects the high frequency, AC, or RF component of voltage v1. Using the filter of FIG. 2H in the rectifier of FIG. 2F would, for example, limit the high frequency, AC, or RF component of voltage v1 to voltage v2 plus two diode voltage drops, but would not limit the DC or low frequency component of v1. The filters 2G and 2H, with proper choice of the components, would not likely load the circuit in which the voltage clamp is used, i.e., if the voltage v1 is not in the range in which it is being clamped, the voltage clamp does not alter the behavior of the circuit substantially. The filters of FIGS. 2I and 2J do load the circuit in which the clamp is used. For example, in embodiments of a voltage clamp system of any of FIGS. 1B and 10 incorporating a rectifier of FIG. 2D, 2E, or 2F with the filter of FIG. 2I or 2J, with a protected node and a reference node as described and depicted with reference to those embodiments, the circuit of FIG. 2I creates a low impedance between the protected node and the reference node at high frequency, and the circuit of FIG. 2J creates a low impedance between the protected node and reference node at low frequency.

Figure 3A:
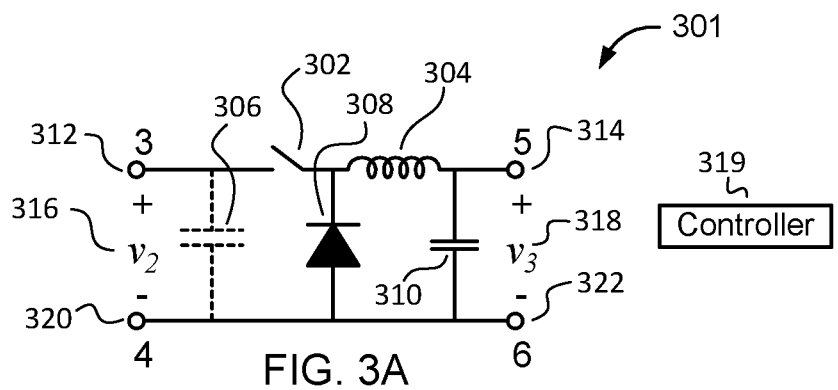
FIGS. 3A-3F illustrate various example power converters that can be used in connection with a voltage clamp with power recovery in various embodiments of the present disclosure.

FIGS. 3A through 3F show various power converters, which may be example embodiments of power converter 118 in FIGS. 1B and 1C, and which may be used as part of a voltage clamp with power recovery in various embodiments of the present disclosure, such as clamp 100, voltage clamp 101, and circuit 150 as depicted in FIGS. 1B and 1C. In each of FIGS. 3A-3F, nodes 3 and 4 may correspond to the internal nodes, e.g. a controlled-voltage node and a controlled-voltage reference node, respectively as in FIGS. 1B and 1C, and nodes 5 and 6 may correspond to power recovery output nodes of a power converter as depicted in FIGS. 1B and 1C. FIG. 3A shows a buck-converter circuit that can be used when no isolation between voltage v2, 316, and voltage v3, 318, is required (i.e., v2 and v3 may share a common ground reference), and the desired clamp voltage v2 is higher than the sink voltage v3. In FIG. 3A, node 3, 312, may be an embodiment of the controlled-voltage node 110 of FIGS. 1B and 1C, and node 4, 320, may be an embodiment of the controlled-voltage reference node 112 of FIGS. 1B and 1C, and nodes 5, 314, and 6, 322, may be embodiments of the output nodes of the power converter, configured to be coupled to a power sink, such as power sink 104 of FIG. 1C. The same holds for nodes 3 and 4 in FIGS. 3B through 3F and for nodes 5 and 6 in FIGS. 3B through 3D. In some embodiments, a buck converter may optionally include an input capacitor 306 as shown in FIG. 3A (and analogous capacitors shown in FIGS. 3B through 3F), to assist with holding the input voltage constant, while in other embodiments, an otherwise analogous buck converter may omit such a capacitor between internal nodes 3, 4.

As shown in FIG. 3A, buck converter 301 further contains a switch 302, diode 308, inductor 304 and output capacitor 310. The output capacitor 310 may be part of the power sink, and/or may also function as part of buck converter 301.

Buck converter 301 may be operated in a way to maintain the input voltage constant rather than to maintain an output voltage. For example, if the input voltage, v2, 316, is below the desired clamping voltage, a controller 319 may leave the switch 302 in the off or open state until such time as the clamping voltage rises to (or just above) the desired clamping voltage, at which time controller 319 may begin or resume operating the switch 302 in a periodic fashion (e.g., switching at a frequency of 100 kHz). In some examples, controller 319 may control switch 302 to implement a duty cycle, i.e., the fraction of time that switch 302 is closed, to be increased in order to reduce the input voltage v2 316 across controlled-voltage node 312 and controlled-voltage reference node 320. Other example methods of operating the switch 302 by controller 319 may include closing switch 302 when the input voltage 316 is above the desired clamping voltage and opening the switch when the input voltage 316 is below the desired clamping voltage with some hysteresis, and further opening switch 302 if the current through the inductor 304 exceeds a nominal or safe level.

Figure 3B:
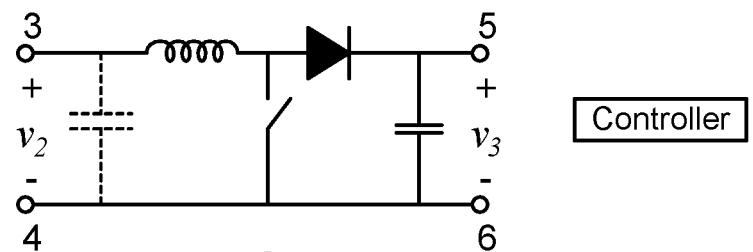
Figure 3C:
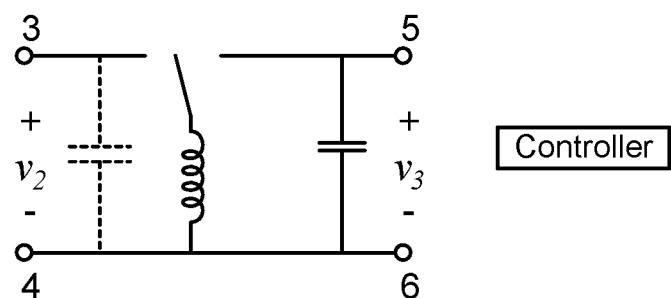
Figure 3D:
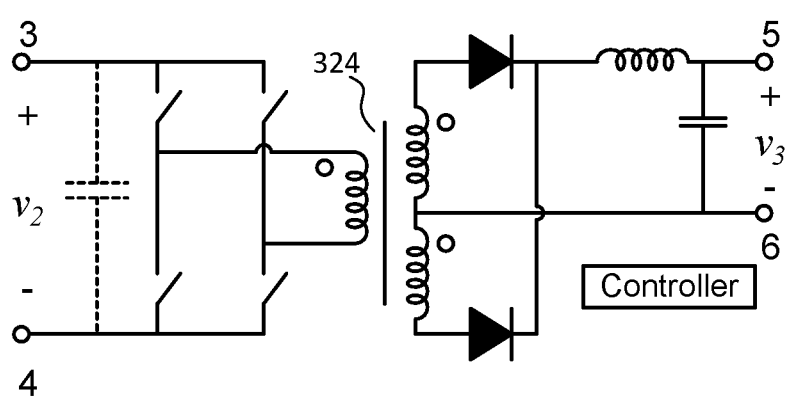
Figure 3E:
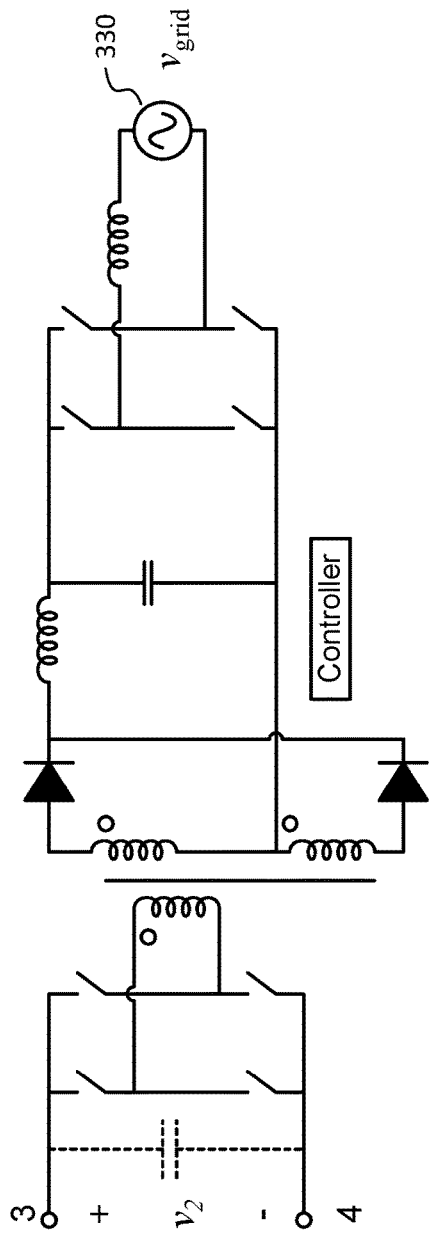
Figure 3F:
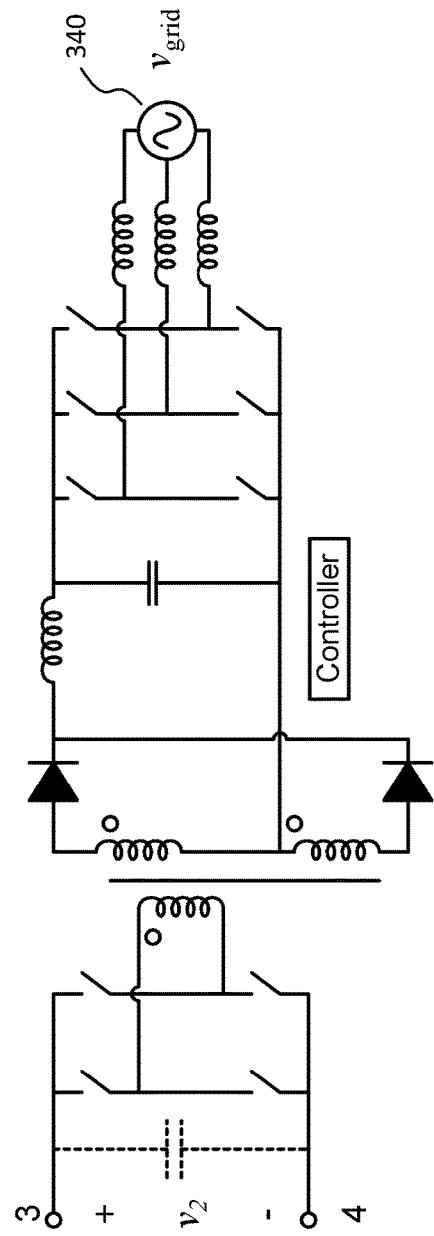

FIG. 3B shows a boost converter which may be used as a power converter in various examples, such as in cases in which no isolation between clamping voltage v2 and power sink voltage v3 is required, and the clamping voltage v2 is less than the power sink voltage v3. FIG. 3C shows a buck-boost converter which may be used as a power converter in various examples, such as if no isolation between clamping voltage v2 and power sink voltage v3 is required and the power sink voltage v3 with respect to the common node 4 and node 6 has the opposite polarity of the clamping voltage v2 with respect to the common node 4 and node 6. FIG. 3D shows an isolated DC to DC converter which can be used as a power converter in various examples, such as when isolation between the input and output of the power converter is required and the power sink is a DC sink such as a DC bus. In FIG. 3D, isolation between the input and output of the power converter is achieved with a transformer 324. FIG. 3E shows a power converter which can be used in various examples, such as when the power sink 330 is a single-phase AC utility supply. FIG. 3F shows a power converter which can be used in various examples, such as when the power sink 340 is a three-phase AC utility supply.

Figure 4A:
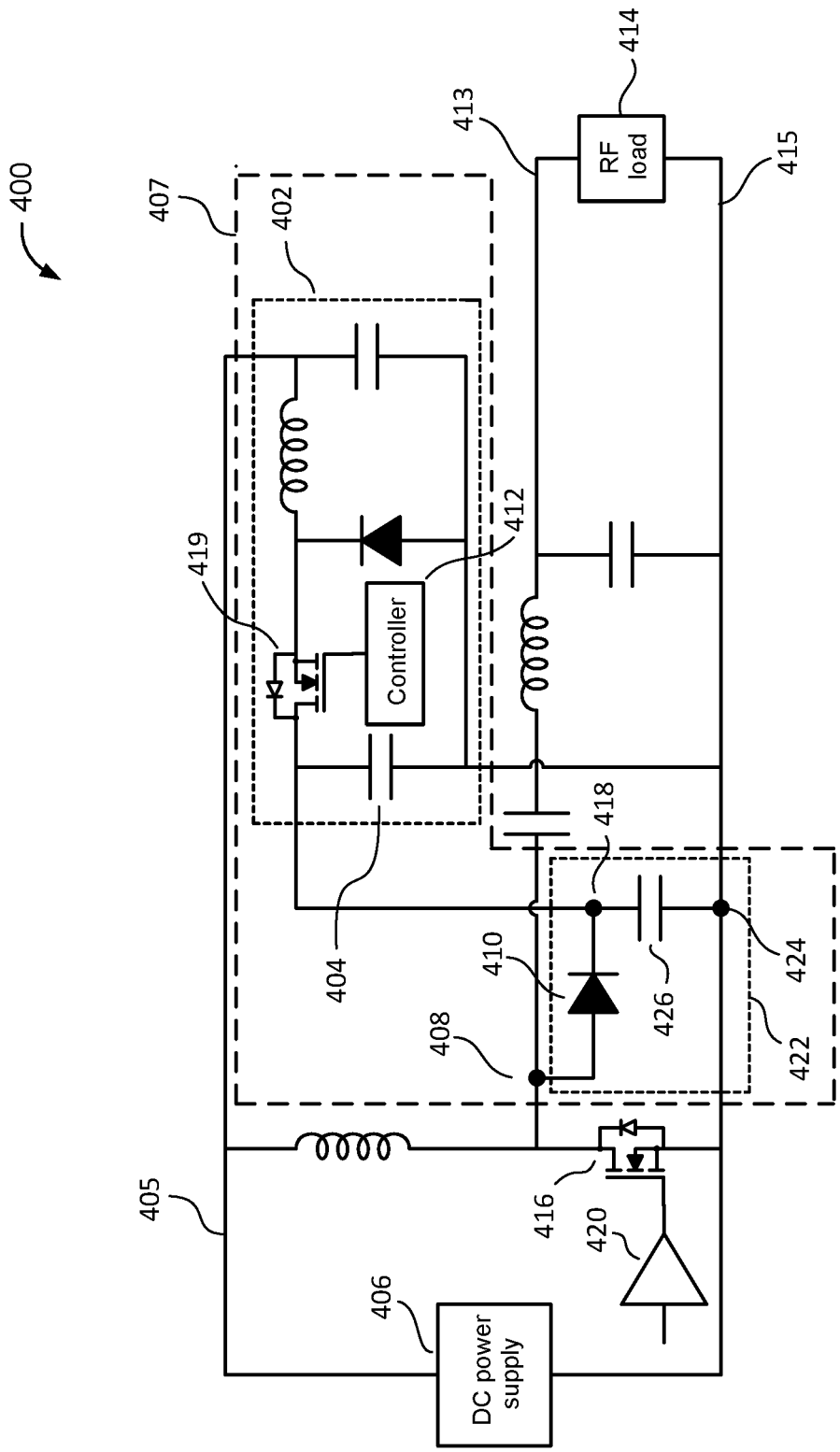
FIG. 4A illustrates the use of a voltage clamp with power recovery in an RF generator circuit according to one embodiment of the present disclosure.

FIG. 4A depicts an RF generator 400 comprising a voltage clamp 407 with power recovery, and connected to a load 414, in accordance with another illustrative embodiment. Voltage clamp 407 includes rectifier module 422 and buck converter 402, in this embodiment. RF generator 400 also includes DC power supply 406, power device 416, and output terminals 413, 415 for coupling to a load such as RF load 414 (e.g., a plasma chamber). Power device 416 is coupled to a driver 420 and is connected to DC power supply 406 via circuitry as shown, such that power device 416 may use power from DC power supply 406 to amplify a reference signal received via driver 420, and deliver that amplified power via circuitry as shown and via output terminals 413, 415 to RF load 414. RF generator 400 thus constitutes a power amplifier; any power amplifier embodiment may also be considered a generator as understood in this disclosure. The amplified power generator circuitry connecting power device 416 to output terminals 413, 415 includes conducting branches through a protected node 408 and a reference node 424 that are connected to and subject to voltage clamp 407, which may thereby clamp the voltage or a component of the voltage in the RF generator, in various embodiments. As shown in FIG. 4A, the protected node 408 and reference node 424 are connected across the power device 416 and thus the voltage over the power device 416 is clamped and power device 416 is a protected device. In other embodiments, the protected and reference nodes may be different nodes, and other voltages in the RF generator would be clamped, including examples in which the protected and reference nodes may be the output terminals 413, 415, in which case the output voltage or a component of the output voltage of the RF generator output would be clamped. In examples that include rectifier module 422 and implement clamping the output voltage of RF generator 400, rectifier module 422 which as shown is of the type of FIG. 2A which would clamp the positive excursions of the voltage; in other examples, a rectifier of the type of FIG. 2C or FIG. 2F may be used, which may clamp the amplitude of the output voltage of RF generator 400.

Buck converter 402 is an embodiment of a power converter; other embodiments of RF generator 400 may include other embodiments of a power converter. Rectifier module 422 is connected to a power source, DC power supply 406, via first circuitry, i.e., the connecting circuitry as shown in FIG. 4A. This connecting circuitry connecting a power source and rectifier module 422 may include any of a wide variety of other variations of circuit elements or circuit architecture in other embodiments, and also potentially including simple conductive lines, in some embodiments. In other words, the rectifier module may be connected to a power source via circuitry which may include any of various circuit elements or architecture or simple conductive lines, and thus may be indirectly connected or directly coupled to each other, in various embodiments. Voltage clamp 407 further includes protected node 408 and reference node 424, among other circuit elements. (As FIG. 4A shows, the conducting branches of protected node 408 and reference node 424 extend from outside to inside the dashed line boundaries shown for voltage clamp 407 and rectifier module 422; electrically and functionally, protected node 408 and reference node 424 may equivalently be considered to be coupled to voltage clamp 407 and rectifier module 422, and/or comprised in voltage clamp 407 and rectifier module 422.) Rectifier module 422 is connected to an external load, RF load 414, via second connecting circuitry as shown in FIG. 4A, including an inductor, capacitors, and output terminals 413, 415 in this embodiment. This connecting circuitry connecting a rectifier module 422 and voltage clamp 407 with an external load may include other variations of circuit elements or circuit architecture in other embodiments.

RF generator 400 amplifies power and delivers power to an external load, such as RF load 414 (e.g., an impedance matching network and a plasma chamber), via output terminals 413, 415. Output terminals 413, 415 for delivering power to a functional load may be distinguished from power recovery output nodes, as discussed above or as rail 405 in the embodiment of FIG. 4A, for outputting recovered power from buck converter 402 and voltage clamp 407 to a power sink such as DC power supply 406. Output terminals 413, 415 are connected to rectifier module 422 via second circuitry, i.e., the connecting circuitry as shown in FIG. 4A in this illustrative embodiment, and which may take the form of any architecture or arrangement of circuit elements and/or direct conductive coupling in various other embodiments.

RF generator 400 thus includes a power source, i.e., DC power supply 406; a rectifier module 422, connected to the power source via first circuitry; a buck converter 402, connected to rectifier module 422, and configured to connect to a power sink, i.e., rail 405 and DC power supply 406; and output terminals 413 and 415, connected to rectifier module 422 via second circuitry. RF generator 400 is configured to limit a voltage or a component of a voltage across rectifier module 422, to divert power from the limiting of the voltage to buck converter 402, and to output the power from buck converter 402 to the power sink, i.e., rail 405 and DC power supply 406.

RF generator 400 thus includes a voltage clamp 407 (which includes rectifier module 422 and buck converter 402) which can clamp voltage without relying on and being constrained by heat dissipation in resistors, semiconductor elements, or other circuit elements into which the RF generator diverts surplus energy from clamping voltage, but instead, recovers power from clamping to rail 405 and DC power supply 406. RF generator 400 is thus enabled to usefully recover power from voltage clamping, as well as engage voltage clamping for indefinite lengths of time, instead of being limited to only short durations of time as constrained by heat dissipation limits of a resistor, semiconductor elements, or other circuit elements to which power is typically directed in prior art systems, among other advantages. Other analogous generators may also use voltage clamping with power recovery besides RF generators, in various embodiments.

RF generator 400 may function as an RF power amplifier, and may also include a DC power supply 406, a controller 412, and a user interface system (not shown in FIG. 4A), such as a user multi-level pulsing (MLP) setpoint input interface, for example. Such an RF generator may, for example, provide an RF power source for a plasma reactor, for purposes such as plasma-enhanced chemical vapor deposition (CEPVD) processes, plasma-enhanced atomic layer deposition (PEALD) processes, etch processes, and other plasma applications. FIG. 4A shows the use of voltage clamp 407 with power recovery to protect a power device 416 in RF generator 400 from overvoltage. Rectifier module 422, buck converter 402, protected node 408, and reference node 424 in the embodiment of FIG. 4A may be example implementations of rectifier 116, power converter 118, protected node 106, and reference node 114 of FIG. 10. In the embodiment of FIG. 4A, reference node 424 serves an analogous function to both reference node 114 and controlled-voltage reference node 112 of the embodiment of FIG. 10, since there is a conducting branch along the low voltage side of rectifier module 422 between both its low voltage side power source connecting line and its low voltage side generator output connecting line, and so there is always no voltage difference between the low voltage side power source connecting line and the low voltage side generator output connecting line of rectifier module 422 (not counting any possible non-ideal-circuit effects).

In the example of FIG. 4A, rectifier module 422 is implemented analogously to rectifier 201 of FIG. 2A, and buck converter 402 is implemented analogously to buck converter 301 of FIG. 3A. In other examples, rectifier module 422 may be implemented analogously to any of the rectifiers of FIGS. 2A through 2J or other example rectifiers, and buck converter 402 may be implemented analogously to any of the power converters of FIGS. 3A through 3F or other example power converters. Power device 416 in FIG. 4A may be an implementation of protected device 111 in FIG. 1C. Especially with the low voltage side of power device 416 directly coupled to the low voltage side of RF load 414, along the branch that includes reference node 424, RF generator 400 and voltage clamp 407 protect power device 416 from otherwise potentially damaging instabilities and rapid voltage changes from RF load 414. In the example of FIG. 4A, voltage clamp 407 uses rail 405 with rail voltage as its power sink, and diverts surplus power from voltage clamping to rail 405. The rail voltage of rail 405 is supplied by a DC power supply 406 to power RF generator 400. Rail 405 is a suitable power sink in this example because the power recovered by voltage clamp 407 cannot exceed the power delivered by the DC power supply 406. In this application, the sink voltage is always less than the clamping voltage, and the sink and clamp can share a common ground reference, so buck converter 402 can be used as the power converter.

Rectifier module 422 includes a single diode 410, in this example. In other embodiments, a rectifier module may include any type of rectifier, and/or multiple rectifiers, and/or otherwise include circuit elements and/or circuit architecture resulting in the rectifier module implementing a capability to function as a rectifier. In applications such as this that involve clamping a voltage at a medium to high RF frequency (e.g., a high frequency in a generally megahertz or gigahertz range in which parasitic inductance and stray capacitance can pose significant engineering factors or constraints with regard to proper operation of the circuit), rectifier module 422 may also include a capacitor 426. In other embodiments, a rectifier module as part of a voltage clamping system with power recovery may include other additions or variations of circuit elements in combination with a diode or other rectifier. Controller 412 controls the buck converter 402 in such a way that the input voltage of buck converter 402 remains below the desired clamping voltage by a voltage difference equal to the voltage drop across one diode, e.g., across diode 410 of rectifier module 422. This ensures that the voltage between protected node 408 and reference node 424 stays at or below the desired clamping voltage level. Controller 412 may be implemented as a measurement and control (M&C) multi-processor system on chip (MPSoC), which may include both a CPU and an FPGA, and other elements, together in one integrated SoC, in some examples.

Controller 412 may also control power device 419 in order to control buck converter 402, to control sending power received from voltage clamping as usefully recovered power to rail 405 and DC power supply 406, in this example. In other embodiments, an analogous power converter may also include other types of switches (e.g., as shown in FIGS. 3A through 3F) under the control of a controller to control the power converter in converting recovered power and outputting recovered power to a power supply or other useful power sink. The buck converter input voltage across the input nodes of buck converter 402 is equal to the voltage difference between the controlled-voltage node 418 and the reference node 424. To assist with maintaining the buck converter input voltage, a capacitor 404 may be included connected to the input of buck converter 402. This puts capacitor 426 and capacitor 404 in parallel with each other, though capacitor 426 may likely be a small capacitor (e.g., a 3 nanofarad (nF) ceramic capacitor) with good high frequency properties and may be mounted close to the protected node 408 and reference node 424, while capacitor 404 may likely be a larger capacitor with larger energy storage capability (e.g., a 100 microfarad (µF) electrolytic capacitor). RF generator 400 may contain a driver 420 for driving power device 416, and RF power amplifier may be connected to an RF load 414 such as a plasma load. Power device may include a bipolar junction transistor (BJT), a metal-oxide-semiconductor field-effect transistor (MOSFET), a high-electron-mobility transistor (HEMT), an insulated-gate bipolar transistor (IGBT), or other types, in various embodiments. RF load 414 may include a complex implementation, such as a plasma reactor connected with a sophisticated plasma impedance matching network, for example.

While rectifier module 422 and buck converter 402 are embodied in the illustrative embodiment of FIG. 4A as shown in FIG. 4A and as described above, they may be embodied in any of a number of other variations and architectures of rectifier modules and power converters in other embodiments. For example, in the embodiment of FIG. 4A, rectifier module 422 is embodied analogously to the embodiment of FIG. 2A, while in other embodiments of a generator of this disclosure, a rectifier module may be embodied as in any of the embodiments of FIG. 2B, 2C, 2D, 2E, 2F, 2G, 2H, 2I, or 2J, or other embodiments. While buck converter 402 in RF generator 400 as shown in FIG. 4A is embodied analogously to buck converter 301 as shown in the embodiment of FIG. 3A, other embodiments of a generator of this disclosure may incorporate a power converter in accordance with those shown in any of FIG. 3B, 3C, 3D, 3E, or 3F, or other embodiments.

RF generator 400 is thus configured to provide power from a power source (e.g., DC power supply 406) via intermediate circuitry to an output terminal (e.g., output terminals 413, 415). RF generator 400 is further configured to divert power to prevent a component of a voltage in the RF generator from exceeding a voltage component limit (e.g., from sudden impedance changes of the RF load 414) from the intermediate circuitry (e.g., from output terminals 413, 415, rectifier module 422, and the connecting circuitry between output terminals 413, 415 and rectifier module 422) to buck converter 402. RF generator 400 is further configured to output at least a portion of the diverted power (e.g., the diverted power minus nominal power lost to realistic circuit resistance effects, other non-ideal-circuit behavior, and/or other causes of inefficiency and entropy) from buck converter 402 to a power sink (e.g., rail 405 and DC power supply 406), in usable form (e.g., as DC power with stable voltage and current that may match the properties of power on rail 405 and DC power supply 406) such that the power sink is configured to reuse the power (e.g., rail 405 is able to channel the power to DC power supply 406; DC power supply 406 is enabled to supply that power again to RF generator 400, in lieu of a measure of power it would otherwise have generated drawing from an external energy source, thereby saving power in its operation, and reducing the power consumption involved in its operation). It will be understood that power recovery is subject to nominal engineering limitations due to realistic circuit resistance effects, other non-ideal-circuit behavior, and/or other causes of inefficiency and entropy, and thus that "recovering the power" or "outputting the power" may refer equivalently to recovering, outputting, diverting, etc. a nominal portion of "the power" or "at least a portion of the power" originally diverted from the generator to the power converter.

RF generator 400 is thus configured to respond to a voltage component reaching a voltage component limit by diverting power to buck converter 402, thereby limiting the voltage component, or preventing the voltage component between the protected node 408 and the reference node 424, from rising above the voltage component limit, in RF generator 400 and/or over or across a particular part of RF generator 400, e.g. between protected node 408 and reference node 424, across rectifier module 422, across power device 416, in various embodiments. RF generator 400 may thus be configured to respond to the voltage component across the rectifier module reaching the voltage component limit by diverting power from the rectifier module to the power converter, thereby limiting the voltage component across the rectifier module, in various embodiments. Power converter may be configured to output at least a portion of the power to the power sink, e.g., rail 405, DC power supply 406, in various embodiments. The voltage component limit may include a sum of an input voltage of the power converter and a voltage drop of the rectifier module, in various embodiments. In other words, RF generator 400 may provide power from a power source via intermediate circuitry to a power output terminal, divert power to prevent a component of a voltage from exceeding a voltage component limit from the intermediate circuitry to a power converter, and output at least a portion of the power from the power converter to a power sink, such that the power may be reused, in various embodiments. The intermediate circuitry may include a rectifier module, and the voltage component limit may include a voltage limit, and RF generator 400 may prevent a voltage across the rectifier module from rising above the voltage limit, in various embodiments. The power sink may include the power source, and outputting the at least a portion of the power from the power converter to the power sink may include outputting at least a portion of the power from the power converter to the power source, in various embodiments.

Figure 4B:
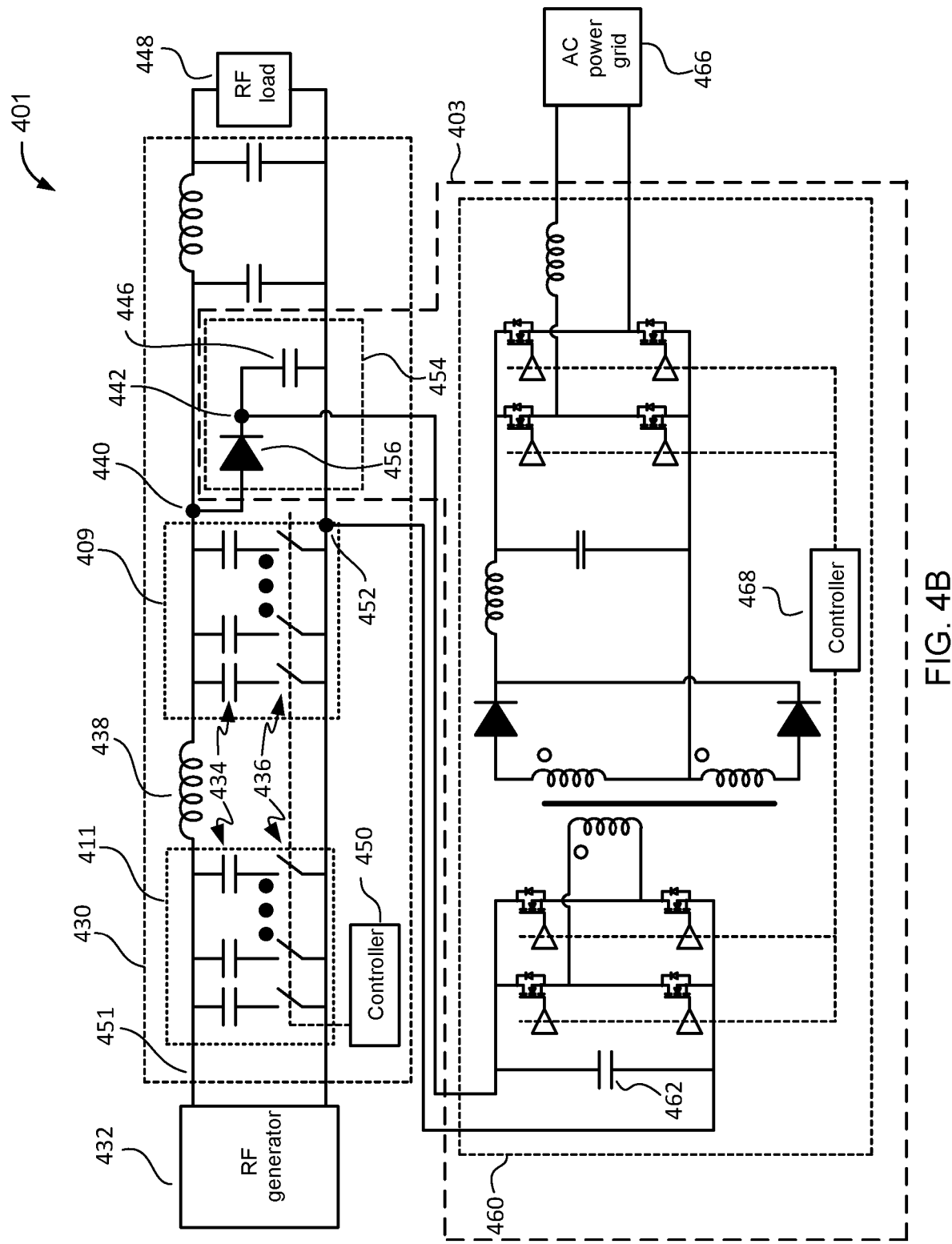
FIG. 4B illustrates the use of a voltage clamp with power recovery in an RF impedance matching circuit according to another embodiment of the present disclosure.

FIG. 4B depicts an RF match network system 401 with a match network 430 and a voltage clamp 403 with power recovery, in accordance with another illustrative embodiment. In this example, match network 430 is a solid-state impedance matching network system, and connects an RF generator 432 to an RF load 448. Match network 430 may be used to match impedance, with high-speed impedance modifications, with a nonlinear load incorporated in RF load 448, such as a plasma load in a plasma reactor, which may typically exhibit nonlinear, time varying, and chaotic behavior and thus rapid, nonlinear changes in impedance. Match network 430 may include or be connected with sophisticated detection equipment to rapidly detect such rapid, changes in impedance from the load, and respond to that detection data by rapidly switching in and out circuit elements such as capacitors 434 to match that impedance, and shield RF generator 432 from such rapid, nonlinear changes in impedance. Match network 430 contains two variable reactance elements, namely, switched capacitor array 411 functioning as a first variable capacitor and switched capacitor array 409 functioning as a second variable capacitor. In addition, match network 430 contains fixed reactance elements such as inductor 438. While this disclosure focuses on voltage and current clamping with power recovery in match networks and other embodiments, further disclosure on the structure, architecture, function, and algorithms of match networks may be found, for example, in U.S. Pat. No. 9,660,613, with applicant in common, the entirety of which is incorporated by reference herein. In FIG. 4B, RF match network system 401 includes voltage clamp 403, which includes rectifier module 454 and power converter 460. Rectifier module 454 is implemented inside of match network 430, in this example. FIG. 4B shows the use of a voltage clamp 403 with power recovery to limit the voltage at a protected node 440 relative to a reference node 452, thereby protecting match network 430 from overvoltage. That is, voltage clamp 403 is embodied to limit voltage or another selected voltage component in match network 430 and to protect match network 430 as its protected device, analogous to the architectural and functional relationships of voltage clamps with corresponding protected devices in other embodiments disclosed herein.

In particular, voltage clamp 403 is connected to a switched capacitor array 409 of parallel switched capacitors 434 and switches 436 of match network 430 via protected node 440 and reference node 452. Voltage clamp 403 thereby protects switched capacitor array 409 as the protected device of voltage clamp 403, analogously as described above with respect to protected device 111 in the embodiment of FIG. 1C. That is, voltage clamp 403 comprising rectifier module 454 and power converter 460 may protect switched capacitor array 409 as its protected device in RF match network system 401. RF match network system 401 of FIG. 4B excluding RF generator 432 may be an example implementation of RF load 414 of FIG. 4A. Power converter 460 incorporates analogous structure to the example power converter of FIG. 3E as described above. Power converter 460 is configured to deliver its recovered power to a power sink in the form of a single-phase AC utility supply, such as AC utility supply 466 in this embodiment. Power converter 460 is connected to AC utility supply 466 to use AC utility supply 466 as a power sink, in isolation from the inputs to power converter 460, for power converter 460 to deliver power recovered from clamped voltage by voltage clamp 403. In this way, voltage clamp 403 successfully recovers and reuses power recovered as a result of clamping voltage, and is able to sustain voltage clamping for as long as is needed, as opposed to be limited to short-term voltage clamping constrained by the capacity of resistors, semiconductor devices, or other circuit elements to absorb excess power from voltage clamping, in this embodiment. Power converter 460 may be connected to a power source of RF generator 432 or to any other kind of power sink, such as a DC rail or a DC power supply, in other embodiments.

Match network 430 includes a controller 450 which controls switches 436 to connect and disconnect capacitors 434 from the network rapidly, in response to changing load impedance conditions in RF load 448, to maintain an impedance match of match network 430 with the changing impedance of the load. Match network 430 may also contain fixed components such as inductor 438. Switched capacitor arrays 409 and 411 may also include fixed components such as implementing a portion or whole of inductor 438 or have components connected between nodes 440 and 452, and nodes 451 and 452, respectively, that are not switched in and out of the circuit by switches 436. Without voltage clamp 403, during operation of the circuit, sudden changes in the characteristics of RF load 448, which may be a plasma load, could cause overvoltage conditions of the protected node 440 relative to the reference node 452. Reference node 452 in this embodiment is also equivalent to a controlled-voltage reference node as described above, since it is electrically coupled by a simple conductive line with the entire low-voltage side of rectifier module 454 and with power converter 460, as shown in FIG. 4B. Rectifier module 454 of voltage clamp 403 includes a diode 456 and a capacitor 446. Rectifier module 454 is connected to power converter 460. Analogously to the power converter of FIG. 3E, power converter 460 may include an input capacitor 462, and a controller 468 of power converter 460 operates the switches of power converter 460 to maintain a constant voltage between controlled-voltage node 442 and reference node 452 that is below the desired clamping voltage by the amount of voltage drop across the single diode 456 of rectifier module 454, and to divert and recover excess power to an AC power source such as AC utility supply 466. In other embodiments, rectifier module 454 may include multiple diodes, and power converter 460 may maintain a constant voltage between controlled-voltage node 442 and reference node 452 that is below the desired clamping voltage by the amount of voltage drop across those multiple diodes of rectifier module 454. Controller 468 may also control circuitry for transferring power only to a single phase of AC utility supply 466. In particular, controller 468 may control the eight switches shown in power converter 460, four each on each side of its transformer, to deliver recovered power to single phase AC utility supply 466. By operation of controller 468, power converter 460, and voltage clamp 403 as a whole, may thereby recover power from the operation of RF match network system 401, and return it usefully to AC utility supply 466. Controllers 450 and 468 may be implemented in the same hardware such as a single controller module, or inside the same FPGA, or in executable code executed with the same microprocessor, to name a few of many possible implementations. In other embodiments, the power converter may be configured to deliver recovered power to another type of power sink, such as a three-phase AC power source, a DC rail, or a DC power supply.

Match network 430 may thus include an input terminal; an output terminal; an impedance matching network, coupled to the input terminal and the output terminal, and configured to perform impedance matching with a load coupled to the output terminal; a rectifier module, coupled to the match network; and a power converter, coupled to the rectifier module, in various embodiments. Match network 430 may be configured to respond to a voltage component reaching a voltage component limit by diverting power to the power converter, thereby limiting the voltage component, in various embodiments. The power converter may be configured to output at least a portion of the power to a power sink, in various embodiments. Match network 430 may thus respond to a voltage component of a voltage in the match network reaching a voltage component limit by diverting power from the match network via a rectifier module to a power converter, thereby limiting the voltage component in the match network, and output the power from the power converter to a power sink, in various embodiments. The voltage component limit may be or include a voltage limit, and responding to the voltage component of the voltage in the match network reaching the voltage component limit may include responding to the voltage in the match network reaching the voltage limit by diverting power from the match network via the rectifier module to the power converter, thereby limiting the voltage in the match network, in various embodiments. Match network 430 may output the power from the power converter to an AC power source, in various embodiments.

In another example embodiment, the implementations of FIGS. 4A and 4B may be combined together such that RF match network system 401 of FIG. 4B may function as RF load 414 of FIG. 4A, and RF generator 400 of FIG. 4A may function as RF generator 432 of FIG. 4B. In such an embodiment, two separate voltage clamps with power recovery may thus clamp voltage and recover power in the two different subsystems of the overall system, with voltage clamp 407 of RF generator 400 functioning as a first voltage clamp to recover voltage-clamped RF generator power to DC power supply 406, and voltage clamp 403 of RF match network system 401 functioning as a second voltage clamp to recover voltage-clamped match network power to DC power supply 406 rather than AC utility supply 466. An example of this is disclosed in FIG. 4C.

Figure 4C:
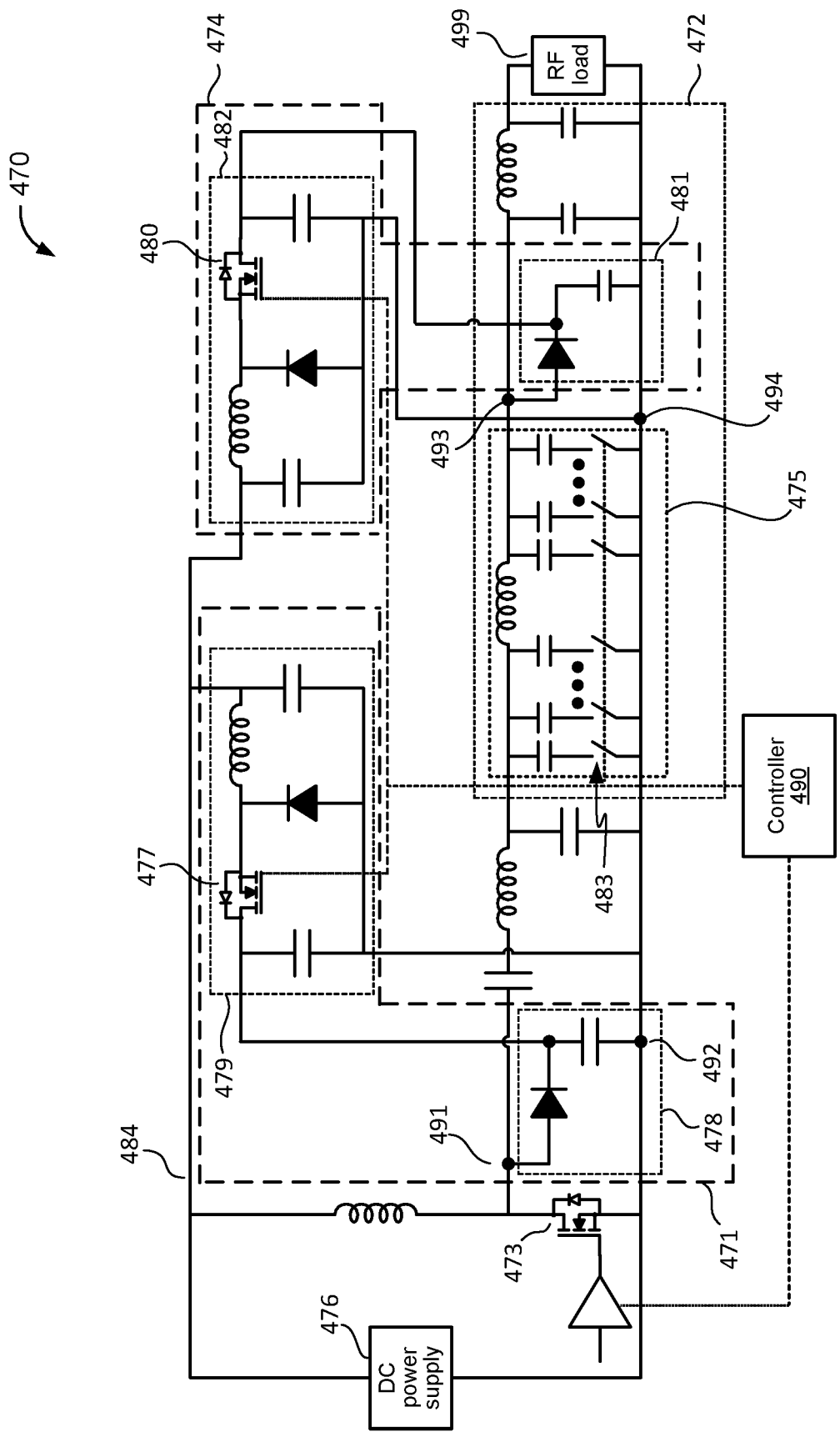
FIG. 4C illustrates the use of a voltage clamp with power recovery in an integrated RF generator circuit and impedance matching circuit according to one embodiment of the present disclosure.

FIG. 4C depicts an RF generator system 470 in another example embodiment, which includes an integrated match network 472 integrated with the generator, a first voltage clamp 471 for clamping voltage around a power device 473 as a protected device, and a second voltage clamp 474 for clamping voltage around a switched capacitor array 475 of integrated match network 472, all integrated in a single RF generator system 470 which may be contained in a single RF generator enclosure, and which recovers power from voltage clamping and delivers the recovered power to DC power supply 476. The enclosure may exclude the RF load 499, as may happen in the case of an integrated generator and match network connected to a plasma chamber, or may include the RF load, as may happen in the case of a remote plasma source. First voltage clamp 471 includes a first rectifier module 478 and a first power converter 479, and clamps voltage at protected node 491 relative to reference node 492, thereby clamping voltage across power device 473, analogous to various examples discussed above. Second voltage clamp 474 includes a second rectifier module 481 and a second power converter 482, and clamps voltage at protected node 493 relative to reference node 494, thereby clamping voltage on switched capacitor array 475, analogous to various examples discussed above. In this example, a single controller 490 may control power device 473, switches 483 of switched capacitor array 475, switch 477 of first power converter 479, and switch 480 of second power converter 482, and may thereby control the voltage clamping and power recovery functions of RF generator system 470. In other examples, multiple controllers may be implemented, and may have different control functions of RF generator system 470 divided among them, including control of DC supply 476. RF generator system 470 provides RF power to an RF load 499, such as a plasma chamber. First voltage clamp 471 and second voltage clamp 474 are each configured to recover power from clamping any excess voltage in their respective applications, and to divert that power to rail 484 and DC power supply 476. Rail 484 and DC power supply 476 thus function as a single common power recovery sink for both voltage clamps 471, 474, in this example.

RF generator system 470 may also be considered and referred to simply as a generator, with the understanding that the generator includes a match network, in this embodiment. In other embodiments, a generator may be implemented with a voltage clamp to clamp voltage for any node of a variety of selected nodes within the circuit of the generator, rather than clamp voltage for a power device or other protected device. In such embodiments, the voltage clamp or clamps on one or more internal nodes within the circuit of the generator may also be configured to recover power from the voltage clamping to a useful power sink, such as a DC rail, a DC power supply, or an AC power supply.

Figure 5A:
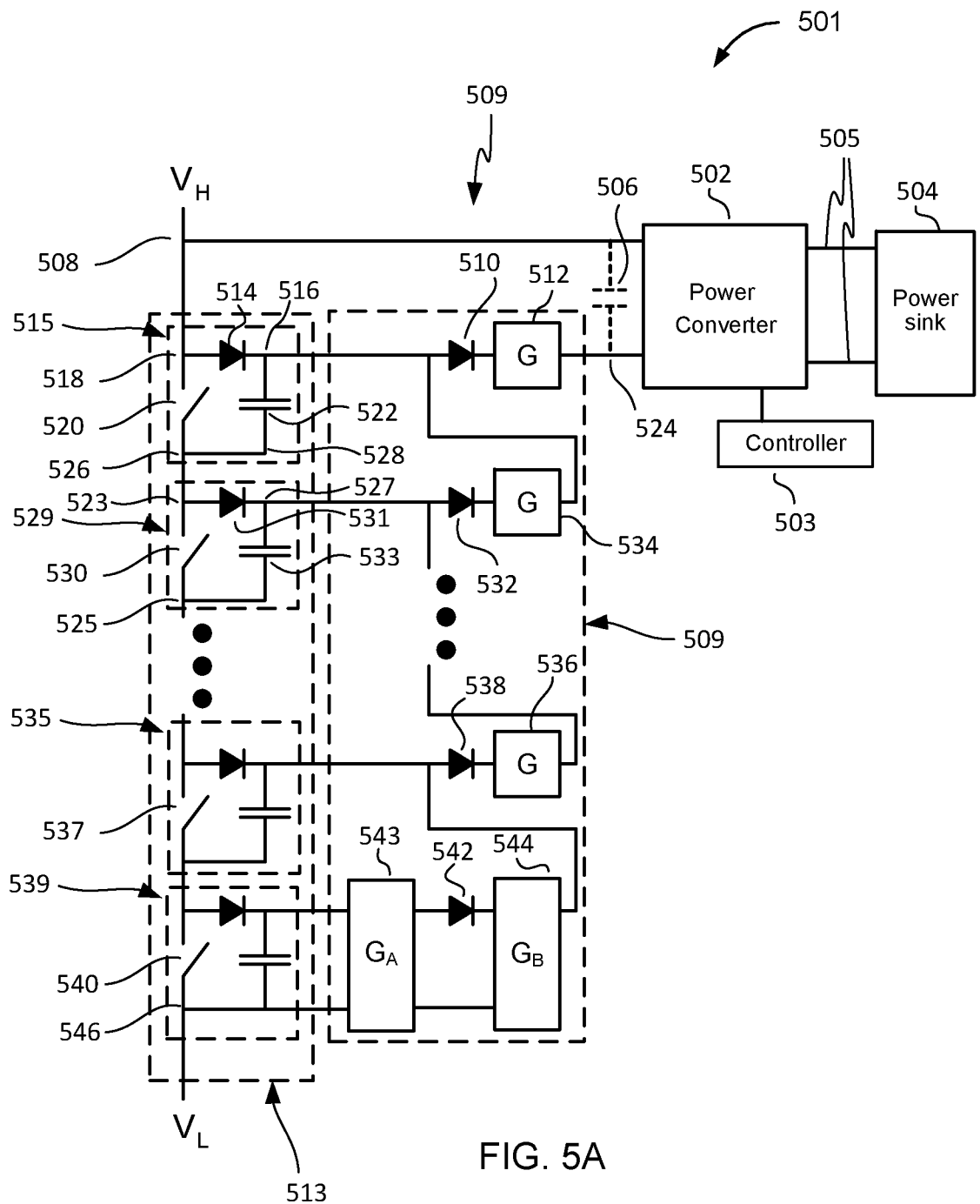
FIG. 5A illustrates an example implementation of a voltage clamp with power recovery in a stacked switch circuit, according to an embodiment of the present disclosure.
Figure 5B:
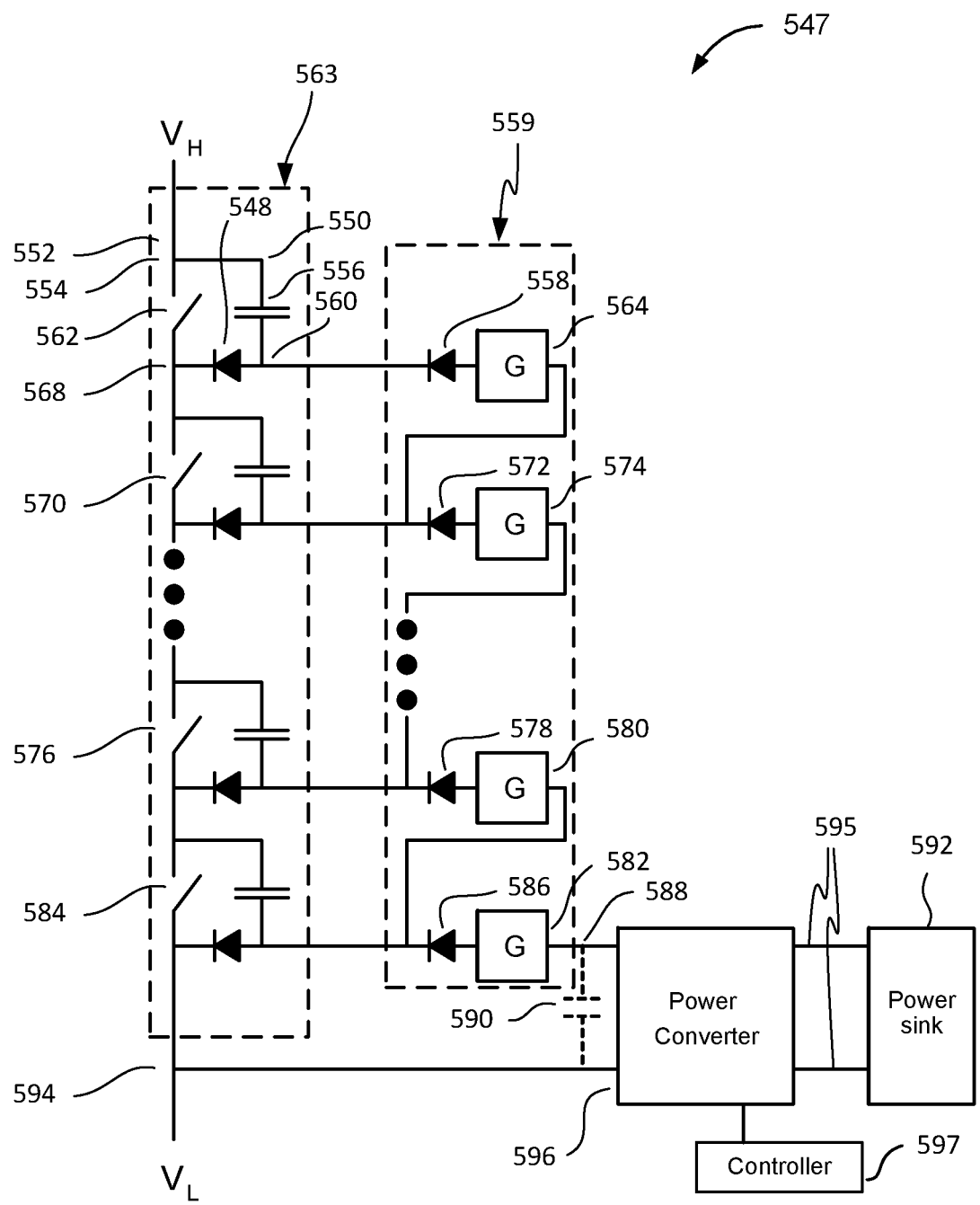
FIG. 5B illustrates another example implementation of a voltage clamp with power recovery in a stacked switch circuit, according to an embodiment of the present disclosure.
Figure 5C:
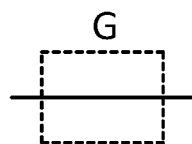
FIGS. 5C, 5D, 5E, 5F, and 5G illustrate example implementations of circuit elements that may help manage or limit a peak current through selected circuit portions in a stacked switch circuit, according to embodiments of the present disclosure.
Figure 5D:
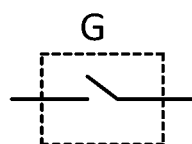
Figure 5E:
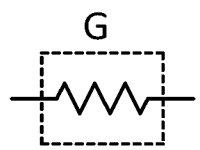
Figure 5F:
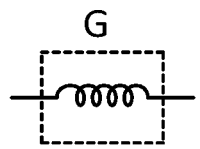
Figure 5G:
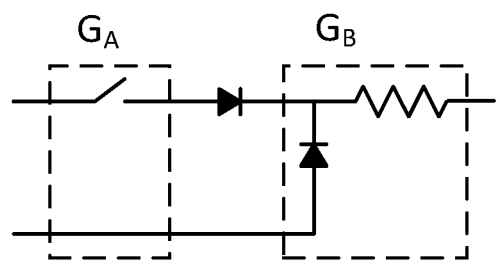

FIGS. 5A and 5B show series stacked switch circuits 501, 547 which include implementations of voltage clamps with power recovery, according to different embodiments of the present disclosure. Series stacked switch circuits can be used to create a high voltage switch using a plurality of lower voltage switches stacked in series. For example, stacking ten switches in series in which each switch can safely handle 1 kV over each individual switch creates a switch that can handle 10 kV over the entire stack, provided that the voltage over each individual switch is limited to no more than 1 kV. Other examples may include any other number of switches, with any feasible value for a safe voltage limit over each switch. Stacked switch circuits 501, 547 may provide finetuned control of power delivered to a specialized load, such as to control for desired values of mean ion energy and ion energy distribution width in a plasma sheath in a plasma reactor, to achieve desired properties in materials processing, for example. This may be in the context of a midfrequency (e.g., hundreds of kilohertz), pulsed DC, and/or electron volt (eV) source, high-output electron volt (HOeV) source, or HOeV-like generator (which may be collectively referred to as eV-type or eV-like generators), in some examples. Further details concerning HOeV-like generators in various embodiments are disclosed in co-pending patent application Ser. No. 16/926,867, the entirety of which is incorporated by reference herein. In different embodiments, an HOeV-like generator may incorporate one or multiple stacked switch circuits in embodiments of stacked switch circuits 501 and/or 547.

One problem that may arise in series stacked switch circuits is that the voltage over an individual switch in the stack may exceed the voltage that the individual switch can handle, possibly causing the individual switch to fail. Consider the example of a 5 kV voltage source connected across a series combination of five switches and a load (e.g., a resistor in series with an inductor). When all the switches are closed, current flows through the switches and the load; and assuming that the on-state resistance of each switch is small compared to the load impedance, the voltage over each switch is close to 0 V. Now consider the problem of opening the switches to stop the flow of current. It is very difficult to control the switches so perfectly that they all open at the same time. Consider the case where the current through the switches is 200 A and one of the switches opens 10 ns earlier than the rest of the switches. If the load is inductive the current will very likely remain close to 200 A for the 10 ns. The increased switch resistance in the off state will likely cause the voltage over the switch to rise to the breakdown voltage of the switch. Assuming the breakdown voltage of the switch is 1200 V, for the 10 ns time, the switch will have both 1200 V across the switch (typically the switch will be in avalanche mode) and conduct 200 A through the switch. The 200 A current on its own is large enough to cause a typical MOSFET switch to fail through secondary breakdown, but even if this does not happen, the energy the switch absorbs during this time is 2.4 mJ. If this happens at a 400 kHz rate, the dissipation in the switch is 960 W, which is higher than what a typical MOSFET can safely dissipate.

The stacked switch circuit 501 of FIG. 5A protects the individual switches in the series stacked switch from overvoltage without the need to dissipate the power that results from clamping the voltage over the individual switches. By way of example, in which optional capacitor 506 is used, assume that the power converter 502 maintains the voltage over capacitor 506 at 990 V by diverting power to the power sink 504 whenever the voltage over capacitor 506 begins rising above 990 V. The operation of the circuit may be understood by considering the example above as it relates to switch 530 between nodes 523 and 525 of stacked switch circuit 501. That is, assume that stacked switch circuit 501 in series with a load (not shown in FIG. 5A) is connected across a 5 kV supply, and with the stacked switch circuit 501 on, is conducting 200 A through switch 501 and the load. With all the individual switches comprised in stacked switch circuit 501 on, current flows from upper node 508, through switch 520, switch 530, any switches represented by the ellipses, switch 537, and switch 540, to lower node 546. Now consider switch 530 opening 10 ns earlier than the rest of the switches in switch 501. With switch 530 open (off) and the rest of the individual switches still closed (on), current flows from upper node 508, through switch 520, through diode 531, capacitor 533, any switches represented by the ellipses, switch 537, and switch 540, to the lower node 546. That is, current that had flowed and would have continued flowing through switch 530, had it still remained closed in perfect timing with the other switches, now flows through diode 531 and capacitor 533 instead. As is shown below, the voltage over capacitor 533, i.e., the voltage of node 527 with respect to node 525, at the time that the switch opens, is approximately 991.4 V, assuming all the diode voltage drops are 0.7 V. Assume that the capacitance value of capacitor 533 is 1 uF. At the end of the 10 ns period, the voltage over capacitor 533 rises to 993.4 V assuming the current remains 200 A for the entire 10 ns that switch 530 is the only individual switch that is open. This means that the voltage over switch 530 is limited to 994.1 V, assuming the voltage drop over diode 531 is 0.7 V. When the rest of the individual switches close, capacitor 533 discharges through diode 532, optional element 534, diode 510, optional element 512, capacitor 506, switch 520, and switch 530. Assuming optional elements 534 and 512 are simple resistors limiting the peak discharge current, and that switches 520 and 530 also act like low value resistors when closed/on, capacitor 533 will discharge to the voltage over capacitor 506 plus two diode voltage drops, i.e., capacitor 533 will discharge to a voltage of 991.4 V. The same mechanism protects all of the individual switches comprised in stacked switch circuit 501 against overvoltage. The clamping voltage increases a little bit for each switch as you move towards the lower node 546. For example, with the same assumptions (200 A, 1 uF capacitors, 10 ns delay, 0.7 V diode voltage drops, capacitor 506 voltage maintained at 990 V, elements G are simple resistors), the voltage over switch 520 will be limited to 993.4 V, and if there are 10 individual switches total comprised in stacked switch circuit 501 (i.e., the ellipses represent an additional 6 switches), switch 537 will be clamped to 999 V, and switch 540 to 999.7 V. The total voltage over stacked switch circuit 501 will in this case be clamped to 9,945.5 V at the start of an overvoltage event. If the current through the stacked switch circuit 501 during the overvoltage event is 200 A and lasts 10 ns, the total voltage over switch 501 will rise to 9,965.5 V. Although clamping of the voltage over the entire stacked switch circuit 501 (i.e., the voltage of the upper node 508 with respect to the lower node 546) is part of what stacked switch circuit 501 does, in typically more cases, stacked switch circuit 501 functions to protect individual switches comprised in series in stacked switch circuit 501 from overvoltage, rather than limiting the voltage of node 508 with respect to node 546. Stacked switch circuit 501 relies on the periodic closing (turning on) of stacked switch circuit 501. It is during the switch on (closed) time that the capacitors 522, 533, etc. discharge through capacitor 506. Without the periodic closing of stacked switch circuit 501, stacked switch circuit 501 would not function as intended. Fortunately, most applications requiring series stacked switches are used in a way that ensures periodic closing of stacked switch circuit 501.

In stacked switch circuit 501 of FIG. 5A, various aspects of a plurality of switch modules in a switch module series stack 513, a power converter 502, and a connecting circuit 509 comprising a series diode stack connecting the switch modules to power converter 502, together function to clamp the voltage over each switch module in the switch module series stack 513. In FIG. 5A, stacked switch circuit 501 includes several individual, discrete switches, of which switches 520, 530, 537, and 540 are labeled, which are connected in series in switch module series stack 513, i.e., a stack of switch modules connected in series, between an upper node 508 at voltage $V_H$ and a lower node 546 at voltage $V_L$.

During normal operation of the switch, upper node 508 is at a higher voltage than lower node 546 during at least part of the time that the switches are all open, and the upper node voltage $V_H$ is at essentially the same voltage as the lower node voltage $V_L$ when the switches are all closed. Each switch in stacked switch circuit 501 is positioned between its own respective local high-side node or protected node and local low-side node or reference node, and parallel to its own local rectifier and local capacitor, together forming its own local switch module. For example, switch 520 is directly coupled between local high-side node 518 (i.e. node on the local high voltage side relative to switch 520, and structured and functioning as a protected node, which may be analogous to a protected node as described above) and local low-side node 526 (i.e. node on the local low voltage side relative to switch 520, and structured and functioning as a reference node, which may be analogous to a reference node as described above), and in parallel with its own local diode 514 (acting as a rectifier) and its own local capacitor 522, forming a local switch module 515. Local switch module 515 thus comprises switch 520, diode 514, and capacitor 522. Each subsequent discrete switch in switch module series stack 513 between upper node 508 and lower node 546 likewise forms part of its own switch module with its own local rectifier and capacitor, analogous to the arrangement of local switch module 515, and depicted examples of which include local switch modules 529, 535, and 539. In other embodiments, a switch module may include a switch and a rectifier, and omit a capacitor; may include more than one diode, or any other type of rectifier circuitry, other than or including a diode, as shown; and may also include other circuit elements (e.g., one or more resistors, one or more inductors).

An ellipsis is depicted between local switch modules 529 and 535 to indicate that any number of additional local switch modules may also be included in switch module series stack 513 in the intervening space. Various embodiments may include any number of local switch modules in switch module series stack 513, also including embodiments with only or fewer than the four switch modules depicted.

Each local switch module in switch module series stack 513 includes a diode and a capacitor coupled in series with each other between the local switch module's high-side and low-side nodes, in parallel to the local switch of the switch module, and in which the diode acts as a local rectifier. As a specific example, in local switch module 515, diode 514 (acting as a rectifier) and capacitor 522 are coupled in series together between local high-side node 518 and local low-side node 526, in parallel to local switch 520. In this case, local low-side node 526 is structured as and functions as a reference node, as described herein, relative to switch module 515 and switch 520 is directly coupled to the controlled-voltage reference node 528 relative to adjacent local switch module 529 and switch 530. Stacked switch circuit 501 may maintain the voltage across capacitor 522, between the controlled-voltage node 516 and controlled-voltage reference node 528 of switch module 515 local to switch 520, at or within a desired local clamping voltage for local switch module 515. Overall voltage clamping of stacked switch circuit 501 may involve the accumulation of local voltage clamping over each of the local switch modules in the stacked series of local switch modules.

Stacked switch circuit 501 is thus configured to clamp, or to limit, the voltage on itself, i.e., on stacked switch circuit 501. Stacked switch circuit 501 being configured to limit the voltage on itself comprises stacked switch circuit 501 being configured to limit a voltage or a component of a voltage between upper node 508 and lower node 546. Stacked switch circuit 501 being configured to limit the voltage on itself, or between upper node 508 and lower node 546, may include stacked switch circuit 501 being configured to clamp or limit the voltage on each of the switch modules comprised in stacked switch circuit 501, which may include clamping or limiting the voltage between the respective high or protected node and the respective low or reference node on the respective switch module. Stacked switch circuit 501 may be configured to clamp or limit the voltage across a respective switch module at a maximum or limiting voltage that may be equal to a sum of a nominal maximum voltage of the respective capacitor and a nominal voltage drop across the respective diode or other rectifier of the respective switch module. The clamping voltage may be set below a limiting voltage of the switch, e.g., the drain-source breakdown voltage of a MOSFET implementing the switch.

A power converter 502 is coupled between the upper node 508 and connecting circuit 509 comprising a series stack of diodes, of which diodes 510, 532, 538, and 542 are labeled. Connecting circuit 509 may include any number of diodes connected in series, to correspond to the number of local switch modules in the switch module series stack. Each diode in the series stack in connecting circuit 509 is coupled to a node in the corresponding switch module between the diode and capacitor of that switch module (which may be referred to as the controlled-voltage node of the switch module), either directly as illustrated for diodes 510, 532, and 538, or indirectly as illustrated for diode 542 connecting through optional element 543. The capacitors of the switch modules are connected to power converter 502 via connecting circuit 509, either directly or indirectly, depending on whether or what type of optional circuit elements G may be included in connecting circuit 509. Optional circuit elements G may connect either side of the diodes in the connecting circuit. Although optional elements 512, 534, 536 are shown between the diode and power converter, optional elements may also be between the rectifier and diode as illustrated for switch module 539 with optional elements $G_A$ 543 and $G_B$ 544. Connecting circuit 509 may thus function as a power converter connecting circuit, connecting switch module series stack 513 with power converter 502. In some embodiments, connecting circuit 509 may also function as part of a distributed power converter (as further discussed below). Depending on the implementation of connecting circuit 509, current may flow from the capacitors of the switch modules, through the controlled-voltage nodes of each switch module (e.g., capacitor 522 and controlled-voltage node 516 of switch module 515 local to and associated with switch 520), through connecting circuit 509 (and, if they are included, through optional elements G in connecting circuit 509), to power converter 502.

Power converter 502, under control of controller 503, and in context for current flows from the local switch modules of connecting circuit 509, may usefully recover the power from the voltage clamping, and divert the recovered power to power sink 504 for subsequent use. Power sink 504 may be an AC power source, a DC power source, a DC rail, a chargeable battery, a power reservoir, or another component or system to which recovered power may usefully be restored, in different examples. Any of these or other types of power sinks that are also enabled to provide power may be considered a power source to which the switch circuit recovers power, in various embodiments. Various components of stacked switch circuit 501 may thus cooperate to function as a voltage clamp, and to recover power from voltage clamping to power sink 504, via power recovery output nodes 505, rather than having to rely on dissipating voltage clamping power by diverting excess power from voltage clamping to a dissipative element (e.g., a Zener diode, MOSFET, or resistor), and losing the power to waste heat.

Connecting circuit 509 thus is coupled to the switch modules of stacked switch circuit 501. In this embodiment, connecting circuit 509 is coupled to each respective switch module of the switch modules, at a node of the respective switch module between the rectifier and a capacitor of the respective switch module. Each respective diode among the series stack diodes in connecting circuit 509 is coupled to a corresponding respective switch module among the switch modules, at a node of the respective switch module between the rectifier and the capacitor of the respective switch module.

FIGS. 5C, 5D, 5E, 5F and 5G depict various example circuit elements that may be used to implement each optional circuit element G in FIGS. 5A and 5B, in different embodiments. As shown in FIGS. 5A and 5B, diodes that are part of connecting circuit 509, including diodes 510, 532, 538, and 542, can be put in series with optional circuit elements G, of which optional circuit elements 512, 534, 536, 544, and 543 are labeled. These optional elements can be e.g., a short circuit (i.e., there is no optional element G installed other than a conductive line), as illustratively depicted in the embodiment of FIG. 5C; a switch, as illustratively depicted in the embodiment of FIG. 5D as well as in FIG. 5G; a resistor, as illustratively depicted in the embodiment of FIG. 5E; an inductor, as illustratively shown in the embodiment of FIG. 5F; or a multi-element circuit (which may comprise, e.g., a switch, an inductor, one or more diodes), as illustratively shown in the embodiment of FIG. 5G, to name a few. Various optional elements G, when implemented, can limit the peak current through the diodes 510, 532, 538, and 542 when the switches 520, 530, and 540 close in the case where the converter maintains a constant input voltage or when the optional capacitor 506 is installed. When the optional elements G are switches, the switches can be closed (under the control of controller 503) when the voltage between the controlled-voltage node and controlled-voltage reference node of the corresponding switch 520, 530, or 540 is above a threshold voltage. In this case, the power converter 502 can, for example, be embodied fairly analogously as the buck converter 301 of FIG. 3A, except in which input capacitor 306 and switch 302 may be eliminated, because those functions may be performed instead by the local capacitor connected between the local controlled-voltage node and local controlled-voltage reference node of each switch module (of which capacitor 522 is an example), and/or by a local switch implementation of optional circuit element G (of which optional circuit element 512 is an example).

Power converter 502 may thus direct recovered power to power sink 504. In the embodiment of FIG. 5A, the voltage at which the voltage over each local switch module in stacked switch circuit 501 is clamped increases by one diode voltage drop across each local switch module, from switch module 515 closest to upper node 508 and power converter 502, towards switch module 539 furthest from power converter 502. This increase in clamping voltage across the series of local switch modules is acceptable in many contexts given that the desired clamping voltage may typically be significantly higher or much higher (e.g., 20 V, 120 V, 900 V) than a typical diode voltage drop (e.g., 1 V). In other examples, the desired clamping voltage and the diode voltage drop values may take any other of a wide range of values. Because the local capacitors associated with each respective switch within the local switch modules (e.g., capacitor 522 associated with switch 520) absorb charge when the switches are off, and the voltage over stacked switch circuit 501 is higher than the capacitor voltage and diode drop voltage, and only discharges through the power converter 502 (and optional capacitor 506, if included) once the switches close in the series of switch modules, the respective local capacitors may be large enough to absorb the charge without the capacitor voltage exceeding the desired clamping voltage. Power converter 502 and/or connecting circuit 509, under control of controller 503, may also operate in response to any voltage rise in switch module series stack 513 that might otherwise threaten to rise above the desired clamping voltage, by diverting any power recovered from voltage clamping from the switch module series of stacked switch circuit 501 via power converter 502 to power sink 504 for useful power recovery, in various embodiments. Stacked switch circuit 501 is thus configured to limit a voltage or a component of a voltage in stacked switch circuit 501, and to recover power from the limiting of the voltage.

As shown in FIG. 5B, stacked switch circuit 547 with voltage clamp with power recovery shown in FIG. 5B is somewhat similar to stacked switch circuit 501 shown in FIG. 5A, except that in this case, the power converter 596 is installed between a lower node 594 at voltage $V_L$ and a common power converter input node 588, as opposed to between the upper node 508 and common node 524 in FIG. 5A. In FIG. 5B, several switches, of which switches 562, 570, 576, and 584 are labeled, are connected in a switch module series stack 563 between an upper node 552 at voltage $V_H$ and a lower node 594 at a voltage $V_L$. Stacked switch circuit 547 may also comprise optional capacitor 590. During normal operation of the switch, upper node 552 is at a higher voltage than lower node 594 during at least part of the time that the switches are all open, and upper node 552 is at essentially the same voltage as lower node 594 when the switches are all closed. Each switch is associated in its own local switch module with a local protected node (e.g., local protected node 554 local to switch 562) and a local reference node (e.g., local reference node 568 local to switch 562). In the local switch module for switch 562, a local diode acting as a rectifier—in the case of the local switch module of switch 562, a single local diode 548—connects the local protected node 554 and local reference node 568 to a local capacitor 556 which is connected between a local controlled-voltage node 550 and a local controlled-voltage reference node 560. In this case, the local protected node 554 is the same as, i.e., is in direct conductive contact with, the local controlled-voltage node 550.

Stacked switch circuit 547 may maintain a desired local clamping voltage within each local switch module, e.g., between the local controlled-voltage node 550 and controlled-voltage reference node 560. Power converter 596 is connected between the local switch modules of switch module series stack 563 and the lower node 594 of stacked switch circuit 547, via series diode stack 559, of which example diodes 558, 572, 578, and 586 are labeled, and a common power converter input node 588. The capacitors of the switch modules are connected to power converter 596 via series diode stack 559, either directly or indirectly, depending on whether or what type of optional circuit elements G may be included in series diode stack 559. Series diode stack 559 may thus function as a power converter connecting circuit, connecting switch module series stack 563 with power converter 596. In some embodiments, series diode stack 559 may also function as part of a distributed power converter (as further discussed below). Depending on the implementation of series diode stack 559, current may flow from the capacitors of the switch modules, through the controlled-voltage reference nodes of each switch module, as opposed to the controlled-voltage nodes as in FIG. 5A (e.g., local capacitor 556 and local controlled-voltage reference node 560 of the switch module local to switch 562), through series diode stack 559 (and, if they are included, through optional elements G in series diode stack 559), to power converter 596. Power converter 596, under control of controller 597, and in context for current flows from the local switch modules of series diode stack 559, may usefully recover the power from the voltage clamping, and divert the recovered power to power sink 592 for subsequent use. Power sink 592 may be an AC power source, a DC power source, a DC rail, a chargeable battery, a power reservoir, or another component or system to which recovered power may usefully be restored, in different examples. Various components of stacked switch circuit 547 may thus cooperate to function as a voltage clamp, and to recover power from voltage clamping to power sink 592, via power recovery output nodes 595, rather than having to rely on dissipating voltage clamping power from capacitors or diverting excess power from voltage clamping to a capacitor or other dissipative element, and losing the power to waste heat.

Series diode stack 559 forms a connecting circuit between switch module series stack 563 and power converter 596. The diodes that are part of the series diode stack 559, comprising illustratively depicted diodes 558, 572, 578, and 586, can be put in series with optional circuit elements G (of which optional circuit elements 564, 574, 580, and 582 are labeled). These optional circuit elements can be, e.g., a short circuit (i.e., there is no optional element G installed), a switch, a resistor, or an inductor, as shown in FIGS. 5C, 5D, 5E, and 5F, respectively, to name a few, or other circuit elements in other examples. The optional circuit elements G, when installed, can limit or modify the peak voltage and/or current through the diodes 558, 572, 578, and 586. In an embodiment in which the optional circuit elements G are switches, these switches can be closed when the voltage between the local controlled-voltage node and local controlled-voltage reference node of the corresponding switch 562, 570 or 576, or 584 is above a selected voltage clamping threshold, for example. In this case, the power converter 596 can, for example, be implemented in an embodiment analogous to the buck converter of FIG. 3A, but in which input capacitor 306 and switch 302 may be omitted, because their functions may be implemented by the local capacitor connected between the local controlled-voltage node and the local controlled-voltage reference node of each switch (of which local capacitor 556 is an example relative to switch 562) and the optional circuit element G implemented as a switch (of which optional circuit element 564 is an example).

The power converter 596 may direct any excess power from voltage clamping to a power sink 592, via power recovery output nodes 595, thereby implementing useful recovery of the power from the voltage clamping. In this embodiment, the voltage at which the voltage over a switch in a switch module is clamped may increase by one diode drop per each local switch module, between switch 584 closest to the power converter 596 and switch 562 furthest from the power converter. This may provide effective voltage clamping across a series switch circuit in many contexts given that a desired clamping voltage may typically be much higher (e.g., 900 V) than a typical diode voltage drop (e.g., 1 V), as an illustrative example. The desired clamping voltage and a diode voltage drop may also take any other values, higher or lower than these values, in other embodiments, depending on the design goals and the details of the embodied implementation. A stacked switch circuit 501 as in FIG. 5A or a stacked switch circuit 547 as in FIG. 5B may be implemented with any of a wide variety of numbers of local switch modules, with diodes having any of a wide variety of drop voltages, and with any of a wide variety of optional switch elements, as well as other areas of options, enabling a flexible variety of implementations that may provide voltage clamping with power recovery optimized for any of a variety of contexts and applications. Stacked switch circuit 547 is thus configured to limit a voltage or a component of a voltage in stacked switch circuit 501, and to recover power from the limiting of the voltage.

Stacked switch circuits 501, 547 of FIGS. 5A, 5B, in any of various implementations, may thus function as embodiments of a voltage clamp with power recovery for multiple series connected switches. Stacked switch circuits 501, 547 with voltage clamping each includes a plurality of switches, each having first and second local nodes, and connected in series between two terminal nodes comprising an upper node and a lower node. The first local node of the first switch is connected to the upper node of the respective stacked switch circuit, the first local node of each successive switch of the plurality of switches is connected to a second local node of a preceding switch of the plurality of switches, and a second local node of the last switch is connected to the lower node of the respective stacked switch circuit. Each of these stacked switch circuits further includes a plurality of capacitors, of which each local capacitor of a local switch module is associated with a corresponding local one of the switches. Each of these stacked switch circuits further includes a plurality of rectifiers, wherein each respective rectifier among the plurality of rectifiers is associated with a respective local switch of the plurality of switches, wherein each rectifier connects two local nodes of the respective switch to a respective local capacitor of the plurality of capacitors, associated with or local to the switch of the corresponding local switch module, in such a way that a voltage difference between the two local nodes of the respective switch is limited to a sum of a capacitor voltage of the respective local capacitor and a rectifier voltage drop of the respective local rectifier. Each of these stacked switch circuits 501, 547 further includes a power converter (e.g., power converter 502 of FIG. 5A, power converter 596 of FIG. 5B). Each of these stacked switch circuits 501, 547 further includes a circuit comprising at least one diode, wherein the power converter is coupled to the capacitors with the circuit, and directly or indirectly to at least one of the upper node and lower node. Each of these stacked switch circuits further includes one or more output nodes (power recovery output nodes 505 in FIG. 5A, power recovery output nodes 595 in FIG. 5B), coupled to the power converter (power converter 502, 596, respectively) and configured to couple to a power sink (power sink 504, 592, respectively), wherein the circuit and the power converter are configured to reduce or maintain the voltages of the capacitors associated with the switches to at or below a desired clamping voltage when the switches are closed, and to recover the voltage clamping power, by outputting power via the one or more output nodes.

Thus, stacked switch circuits 501, 547 are examples of a switch circuit that includes two terminal nodes (e.g., an upper node and a lower node in these embodiments), a plurality of switch modules, a connecting circuit, and a power converter. In these examples, the switch modules are connected in series between the upper node and the lower node. In these examples, each of the switch modules in the switch circuit includes a switch, a rectifier, and a capacitor. The connecting circuit is coupled to the switch modules. The power converter is coupled to the connecting circuit and directly or indirectly to one of the terminal nodes. In this context, an indirect connection may involve connecting the power converter to one of the terminal nodes through a circuit that may comprise other components such as resistors, capacitors, or diodes, to name a few. That is, the power converter is coupled to the connecting circuit and to either the upper node (e.g., as in FIG. 5A) or the lower node (e.g., as in FIG. 5B). The switch circuit is configured to output recovered power from the switch modules via the connecting circuit to the power converter, and from the power converter to a power sink coupled to the power converter. The switch circuit thereby limits a voltage in the switch circuit, e.g., across each switch module, between the upper node and the lower node (or elsewhere on the switch circuit), and recovers power from the limiting of the voltage to the power sink.

Figure 6A:
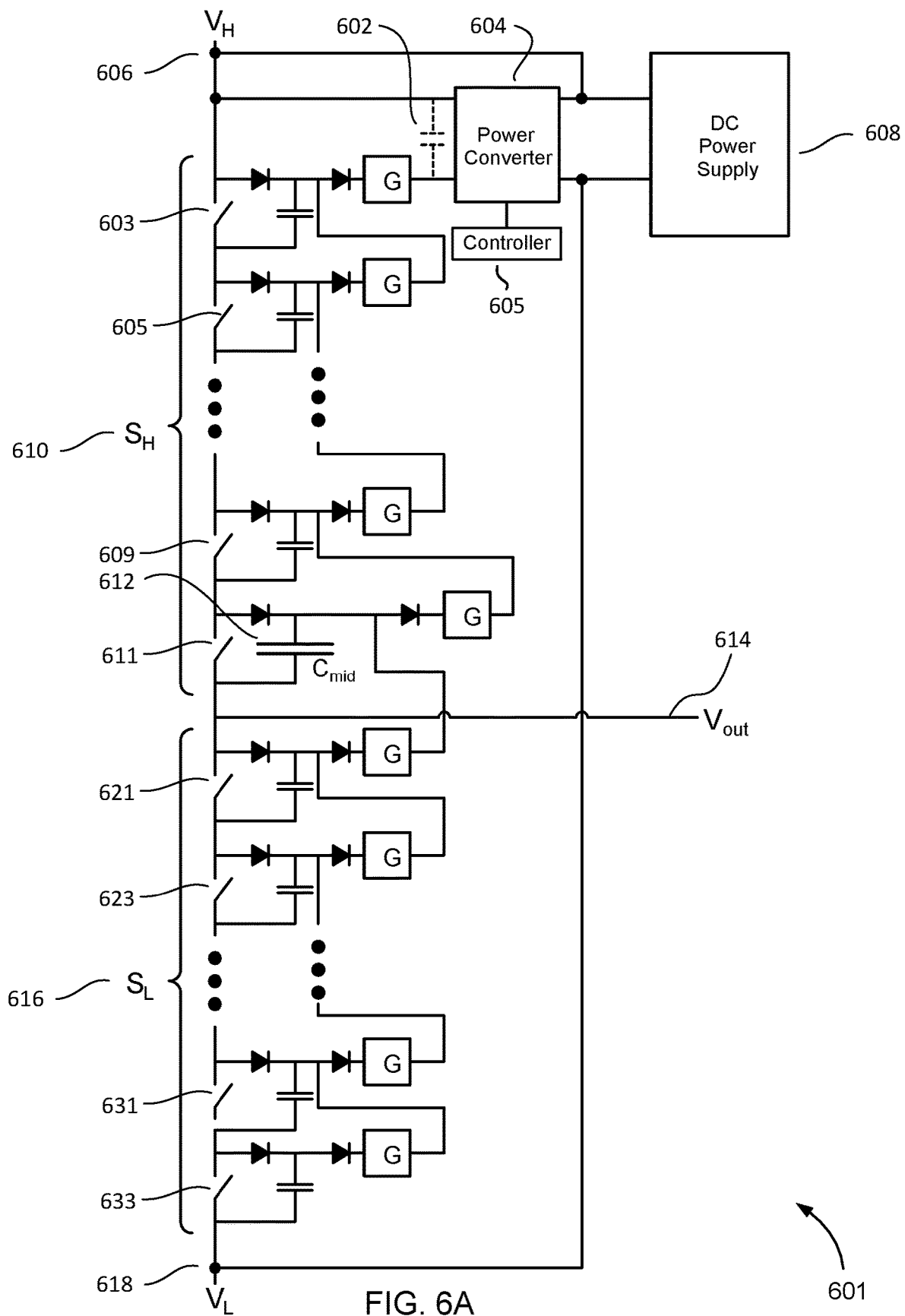
FIG. 6A illustrates an example implementation of a voltage clamp with power recovery in a stacked switch half-bridge circuit, according to one embodiment of the present disclosure.

FIG. 6A shows a stacked switch circuit 601 with two stacked switches, high-side stacked switch 610 ($S_H$) and low-side stack switch 616 ($S_L$), arranged in high and low voltage sides in a half-bridge configuration, according to an embodiment of the present disclosure. Each of stacked switches 610 and 616 comprises a stack of individual, local discrete switches; e.g., high-side stacked switch 610 comprises example local discrete switches 603, 605, 609, 611, and low-side stacked switch 616 comprises example local discrete switches 621, 623, 631, 633. In different embodiments, each of high-side and low-side stacked switches 610 and 616 may include a wide variety of numbers of individual discrete switches, each with their own local modules of accompanying circuit elements (e.g., local capacitor and diode). Each of stacked switches 610 and 616 may comprise any number of individual local discrete switches, in different embodiments. The local discrete switches are associated with their own local diodes, which act as rectifiers, and which, together with power converter 604, form distributed implementations of voltage clamps with power recovery. That is, the local diode rectifiers comprised in high-side stacked switch 610 and/or low-side stacked switch 616, together with power converter 604, may act as a voltage clamp, which may recover power to DC power supply 608. The high-side stacked switch 610 ($S_H$) connects between an upper node 606 at high voltage (with respect to the lower node 618) $V_H$ and an output node 614 ($V_{out}$), and the low-side stacked switch 616 ($S_L$) connects between the output node 614 and a lower node 618 at a low voltage (with respect to the upper node 606) $V_L$. In some embodiments, upper node 606 may have a particularly stabilized high side voltage (e.g., connected to ground). In some embodiments, lower node 618 may be connected to other circuitry or connected to a phase of an AC power supply. In some embodiments, the voltage at upper node 606 may be more stable than the voltage at lower node 618, such that it may be advantageous to have power converter 604 directly connected to upper node 606, and for the distributed voltage clamp of stacked switch circuit 601 to perform voltage clamping and power recovery to DC power supply 608 via power converter 604 directly connected to upper node 606.

A DC power supply 608 that powers stacked switch circuit 601 connects to the upper node 606 and lower node 618, and acts as the power sink for power converter 604. The output node 614 with output voltage $V_{out}$ can connect to another circuit or a load, which may be an HOeV-like power source (as described above), as one example. Stacked switch circuit 601 may also include optional circuit elements G with their own local diodes, analogous to similar structures as discussed above with reference to FIGS. 5A and 5B. The operation of stacked switch circuit 601 may be similar in some ways to the operation of the stacked switch circuit 501 of FIG. 5A, except that instead of all the switches opening and closing at essentially the same time, or within a reasonably short time span, as in FIG. 5A in various embodiments, in various embodiments of stacked switch circuit 601, the switches comprising the low-side switch 616 may open and close at the same time as each other, and the switches comprising the upper switch may open and close at the same time as each other, while the switches of the high-side stacked switch 610 and low-side stacked switch 616 may never, under normal operation, close at the same time, since that would short circuit upper node 606 to lower node 618, in various embodiments.

Midpoint capacitor 612, local to discrete switch 611 on the lower edge of high-side stacked switch 610, also labeled $C_{mid}$ in FIG. 6A, is directly connected to low-side stacked switch 616. When the discrete switches comprised in low-side stacked switch 616 close, current is directed through midpoint capacitor 612, if any of the voltages over the capacitors local to the discrete switches of low-side stacked switch 616 are higher than the desired clamping voltage. Because midpoint capacitor 612 temporarily absorbs all the charge from the capacitors local to the local discrete switches of the low-side stacked switch 616 when any of those capacitor voltages are above the desired clamping voltage, midpoint capacitor 612 may be implemented to have a larger capacitance and handle a higher ripple current than the other capacitors associated with the other local discrete switches. When the local discrete switches associated with the high-side switch 610 close, current can flow though power converter 604 and optional capacitor 602 if any of the voltages over the capacitors associated with the local discrete switches comprised in high-side stacked switch 610, including midpoint capacitor 612, are higher than the desired clamping voltage.

In stacked switch circuit 601, each individual switch and each individual switch module is protected against overvoltage. As in FIGS. 5A and 5B, switches closest to the power converter are limited to a slightly lower voltage than switches further from the power converter. For example, if the voltage at the input of converter 604 is held at 990 V and the capacitors associated with each switch are large enough to limit the voltage rise while the switch is open to 2 V and all diode on-state voltage drops are assumed to be 0.7 V, and assuming the elements G act like simple resistors (i.e., they don't cause additional voltage drops at low current), then switch 603 may be limited to 993.4 V and if there are 20 switches total in the stack, then switch 663 may be limited to 1006.7 V assuming capacitor $C_{mid}$ 612 is large enough so that the voltage over $C_{mid}$ does not rise significantly. The circuit can also clamp the voltage between upper node 606 at voltage $V_H$ and output node 614 at voltage $V_{out}$ to the sum of the voltages at which the individual switches are clamped, but in a half-bridge circuit such as this, this is unlikely to occur since most practical switches (e.g, MOSFETS) have body diodes which will clamp node 614 at voltage $V_{out}$ to be less than the sum of the body diode voltage drops of the switches in switch 610 $S_H$ and $V_H$ and above $V_L$ minus the sum of the body diode voltage drops of $S_L$ 616. Thus, the body diodes are very likely to limit the voltage excursions of $V_{out}$ before exceeding the sum of the clamping voltages of each switch.

Figure 6B:
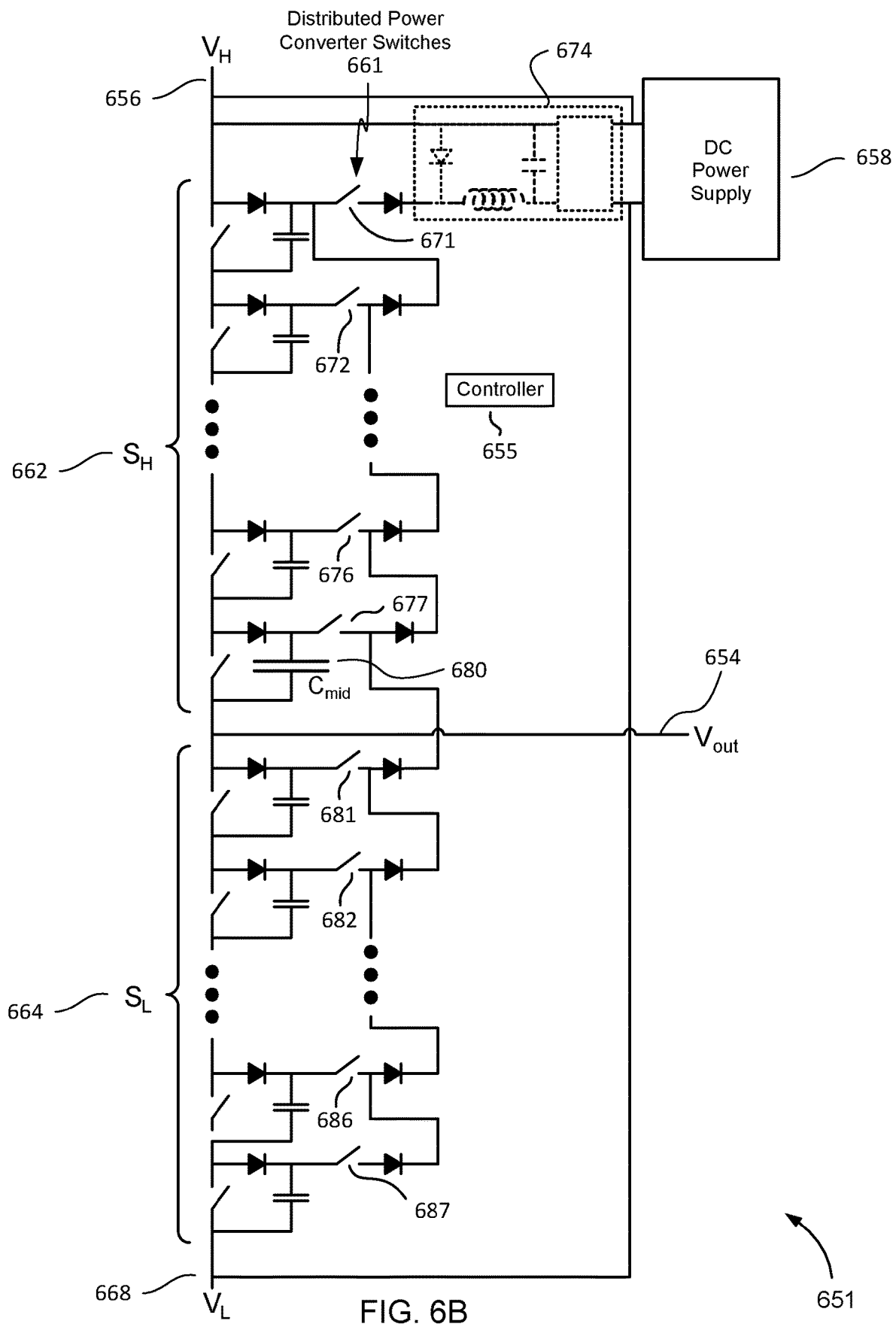
FIG. 6B illustrates another example implementation of a voltage clamp with power recovery in a stacked switch half-bridge circuit, according to one embodiment of the present disclosure.

FIG. 6B shows a stacked switch circuit 651 in accordance with another illustrative embodiment, with a high-side stacked switch 662 ($S_H$) and a low-side stacked switch 664 ($S_L$) arranged in a half-bridge configuration, and which comprises a distributed power converter that includes distributed power converter switches 661, and optionally, additional distributed power converter circuitry 674, rather than a discrete power converter. In particular, distributed power converter switches 661 are formed by a series of switches, including example switches 671, 672, 676, 677, 681, 682, 686, 687, connected between the capacitor associated with each switch module and a string of diodes that connect to additional power converter circuitry 674 in some embodiments or DC power supply 658 or another power sink, and under control of controller 655. In this embodiment, controller 655 may control distributed power converter switches 661 to open and close so as to function collectively as a power converter, optionally together with optional additional distributed power converter circuitry 674 in some embodiments, without a discrete, monolithic power converter 604 as in the embodiment of FIG. 6A. Distributed power converter switch 677 associated with midpoint capacitor 680 may close when low-side stack switch 664 closes to allow the capacitors associated with low-side stacked switch 664 that are at voltages above the voltage of capacitor $C_{mid}$ 680 to discharge into capacitor $C_{mid}$ 680. Distributed power converter switches 661 may close when the capacitor associated with the switch is above a desired clamping voltage. Distributed power converter switches 661 may be considered as an embodiment of the optional circuit elements $G_A$ as shown in FIG. 5A.

High-side stacked switch 662 connects between upper node 656 and output node 654, and low-side stacked switch 664 connects between output node 654 and lower node 668. DC power supply 658 powers stacked switch circuit 651 and connects to the upper node 656 and lower node 668. The distributed voltage clamp of stacked switch circuit 651 uses DC power supply 658 as its power sink. The diode rectifiers of the local switch modules comprised in high-side and low-side stacked switches 662 and 664, and distributed power converter switches 661 (optionally together with optional additional distributed power converter circuitry 674), may thus together form another embodiment of a distributed voltage clamp with power recovery, which may clamp voltage and channel recovered power from voltage clamping to DC power supply 658.

While FIG. 6B explicitly shows a stacked switch circuit analogous to that of FIG. 6A in which the diode series stack comprises switches that function as part of a distributed power converter, various embodiments of or analogous to any of FIGS. 5A, 5B, 7, 8A, 8G, and 8H may also include switches as implementations of the optional circuit elements G as shown therein, which may be included in distributed power converters.

Figure 7:
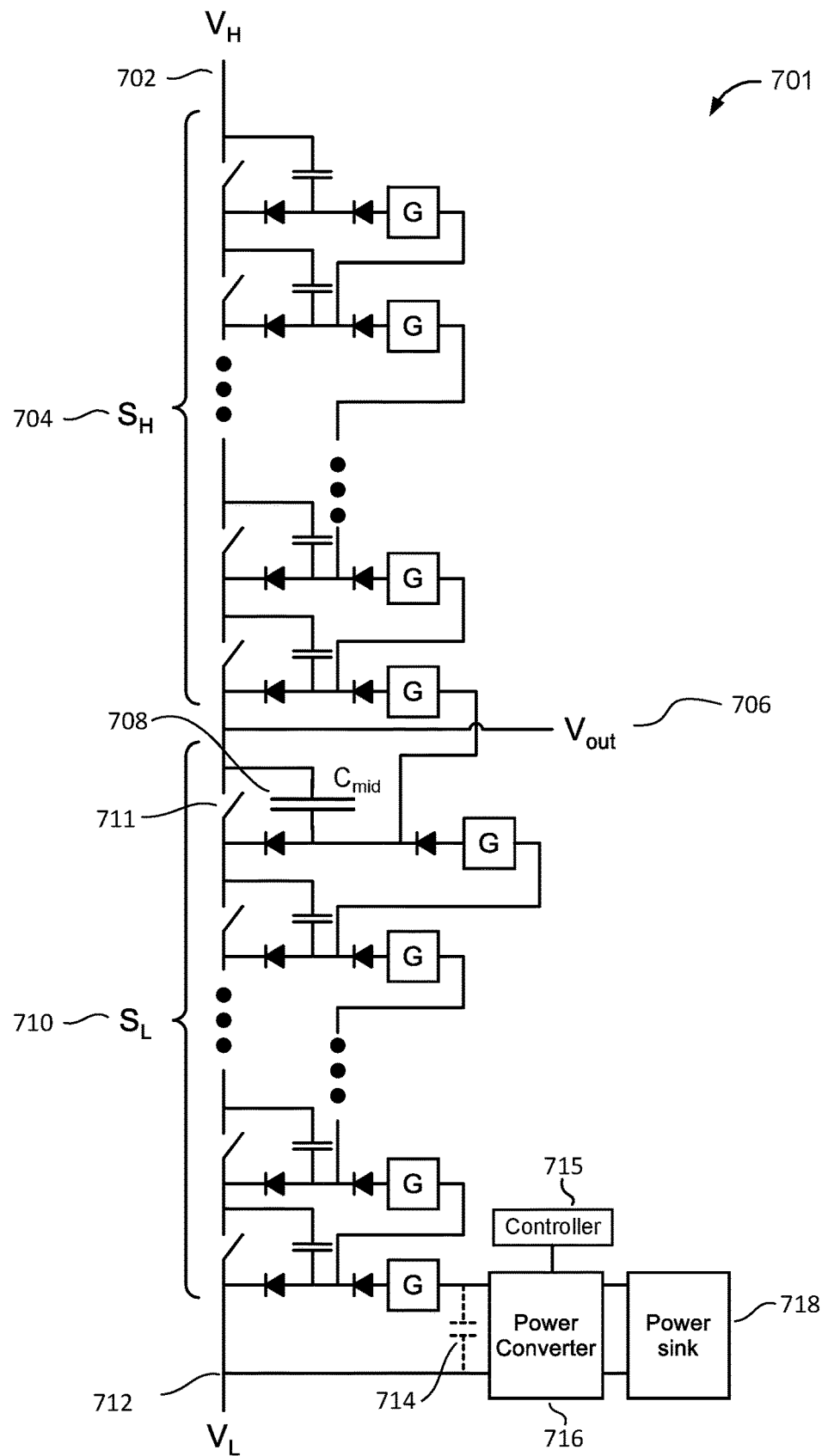
FIG. 7 illustrates another example implementation of a voltage clamp with power recovery in a stacked switch half-bridge circuit, according to one embodiment of the present disclosure.

FIG. 7 shows a stacked switch circuit 701 with another arrangement of two stacked switches arranged in a half-bridge configuration with voltage clamps with power recovery, according to another embodiment of the present disclosure. As opposed to the embodiment of FIG. 6A, in stacked switch circuit 701, the power converter 716 and optional capacitor 714 are connected to the lower node 712 rather than the upper node 702. The midpoint capacitor 708 ($C_{mid}$), connected between low-side stacked switch 710 ($S_L$) and high-side stacked switch 704 ($S_H$), is local to the discrete switch 711 comprised in and at the upper edge of the low-side stacked switch 710 that connects to the high-side stacked switch 704, in this embodiment. When the high-side stacked switch 704 closes, if any of the voltages over the capacitors local to the discrete component switches comprised in the high-side stacked switch 704 exceed the desired clamping voltage, current may flow temporarily through midpoint capacitor 708, which may act as a temporary reservoir of charge before recovering the associated charge and associated energy to power converter 716. When the low-side stacked switch 710 closes, if any of the capacitor voltages associated with the discrete switches comprised in the low-side stacked switch 710 exceed the desired clamping voltage, current can flow through the power converter 716 and optional capacitor 714. Controller 715 connects to and controls power converter 716. Power converter 716 connects to a power sink 718 which may, as in FIG. 6A, be a DC supply, which may also be connected to the upper node 702 (at voltage $V_H$) and lower node 712 (at voltage $V_L$). The output node 706 (at output voltage $V_{out}$) of the half-bridge circuit of stacked switch circuit 701 may connect to other circuitry or a load.

Figure 8A:
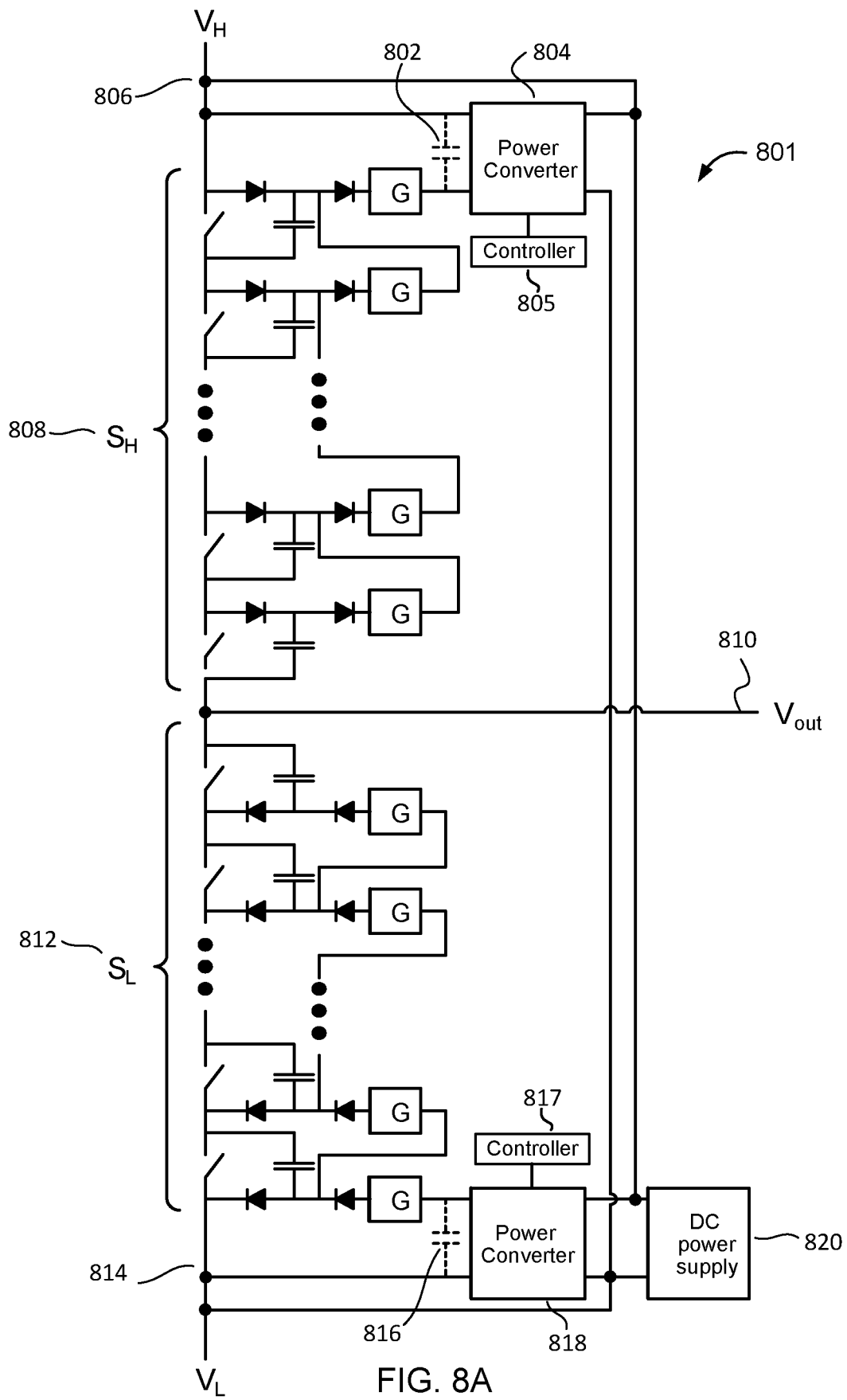
FIG. 8A illustrates another example implementation of a voltage clamp with power recovery in a stacked switch half-bridge circuit, according to one embodiment of the present disclosure.

FIG. 8A shows a stacked switch circuit 801 with yet another arrangement of a high-side stacked switch 808 and a low-side stacked switch 812 arranged in a half-bridge configuration with voltage clamps with power recovery, according to another embodiment of the present disclosure. In this embodiment, stacked switch circuit 801 includes two power converters 804 and 818, one power converter 804 directly connected to the upper node 806 (at voltage $V_H$), and another power converter 818 directly connected to the lower node 814 (at voltage $V_L$). DC power supply 820 is directly connected to both power converters 804, 818 and to upper node 806 and lower node 814, and supplies power to stacked switch circuit 801. Power converters 804, 818 may cooperate with the diode rectifiers in the local switch modules of stacked switches 808, 812 to function as distributed voltage clamps with power recovery. Both power converters 804, 818 may use DC power supply 820 as a power recovery power sink, and divert power from voltage clamping to DC power supply 820 to be usefully recovered. One or both power converters 804, 818 may have optional capacitors 802, 816 connected across the respective power converter inputs. The operation of the voltage clamp with power recovery associated with the high-side stacked switch 808 is similar to the operation of the voltage clamp with power recovery associated with stacked switch circuit 501 of FIG. 5A, while the operation of the low-side stacked switch 812 is similar to the operation of the voltage clamp with power recovery associated with stacked switch circuit 547 of FIG. 5B. The output node 810 (at output voltage $V_{out}$) of the half-bridge stacked switch circuit 801 may connect to other circuitry or a load. In various embodiments, stacked switch circuit 801 may advantageously omit a relatively larger and higher-capacitance capacitor at or proximate to its half-bridge midpoint, connected between high-side and low-side stacked switches 808, 812, as in the embodiments of FIGS. 6A, 6B, and 7, because any power recovered from voltage clamping on either side of stacked switch circuit 801 may flow to that side's own dedicated power converter. That is, any power recovered from voltage clamping in high-side stacked switch 808 may be directed to power converter 804 on the high voltage side of stacked switch circuit 801, while any recovered power from voltage clamping in low-side stacked switch 812 may be directed to power converter 818 on the low voltage side of stacked switch circuit 801.

Thus, stacked switch circuits 601, 651, 701, and 801 of FIGS. 6A, 6B, 7, and 8A, are further examples of a switch circuit that includes two terminal nodes (i.e., an upper node and a lower node, in various embodiments), a plurality of switch modules, a power converter (that is, at least one power converter), and a connecting circuit that connects the switch modules to the at least one power converter. In these examples, as in the examples of FIGS. 5A and 5B, the switch modules are connected in series between the upper node and the lower node. In these examples, each of the switch modules in the switch circuit includes a switch, a rectifier, and a capacitor. The connecting circuit is coupled to the switch modules. The at least one power converter is coupled to the connecting circuit and to one of the terminal nodes. That is, in embodiments with one power converter (e.g., the embodiments of FIGS. 6A, 6B, 7, in which one power converter may be either discrete as in FIGS. 6A and 7 or distributed as in FIG. 6B), the power converter is coupled to the connecting circuit and to at least one of the terminal nodes, e.g., either the upper node (e.g., as in FIGS. 6A, 6B) or the lower node (e.g., as in FIG. 7). Other embodiments include multiple power converters, which may include power converters coupled to both terminal nodes, as in the embodiment of FIG. 8A. The at least one power converter is thus connected to at least one of the terminal nodes, and may be connected to both of the terminal nodes. The switch circuit may be configured to output recovered power from the switch modules via the connecting circuit to the power converter, and from the power converter to a power sink coupled to the power converter. The switch circuit may thereby limit a voltage, or other voltage component, in the switch circuit, and may recover power from the limiting of the voltage to the power sink. The "power converter" may include one or more discrete power converters, and/or distributed power converter circuitry, as particularly discussed with reference to the embodiment of FIG. 6B and as may be applicable to various embodiments of any of FIGS. 5A, 5B, 6A, 7, and 8, and other embodiments.

Stacked switch circuits 601, 651, 701, 801 are thus each configured to limit a voltage or a component of a voltage in the stacked switch circuit, and to recover power from the limiting of the voltage. Each of these switch circuits may further be configured to limit the voltage across a respective switch module, of the one or more respective switch modules, to a sum of a nominal capacitor voltage of a capacitor of the respective switch module, and a rectifier voltage drop of the rectifier of the respective switch module. Each of these switch circuits thus also diverts power from the switch modules via a connecting circuit, coupled to the switch modules, to a power converter, coupled to the connecting circuit and to one of the terminal nodes, thereby limiting a voltage or other voltage component in the switch circuit, recovering power from the limiting of the voltage to the power sink, where recovering the power may include transmitting, diverting, or outputting the power from the power converter to a power sink.

In the embodiments of FIGS. 6A, 6B, 7, and 8, the switch circuit further includes a first stacked switch circuit, a second stacked switch circuit, and an output node. In the embodiments of FIGS. 6A, 6B, 7, and 8, the first stacked switch circuit comprises a first portion of the switch modules in a series stack (e.g., high-side stacked switch 610 of FIG. 6A, high-side stacked switch 662 of FIG. 6B, high-side stacked switch 704 of FIG. 7, high-side stacked switch 808 of FIG. 8A). The second stacked switch circuit comprises a second portion of the switch modules (e.g., low-side stacked switch 616 of FIG. 6A, low-side stacked switch 664 of FIG.

6B, low-side stacked switch 710 of FIG. 7, low-side stacked switch 812 of FIG. 8A). The output node is coupled between the first stacked switch circuit and the second stacked switch circuit (e.g., output node 614 of FIG. 6A, output node 654 of FIG. 6B, output node 706 of FIG. 7, output node 810 of FIG. 8A).

FIGS. 8B through 8F depict various eV-like generators that may incorporate stacked switch circuits with voltage clamping and power recovery, in accordance with various illustrative embodiments. eV-like generators may include HOeV generators, other eV generators, and other eV-like generators, and may be generally characterized as generators capable of providing pulsed DC power, generally at frequencies in the hundreds of kilohertz or low megahertz (and at energies that may be approximately around an order of magnitude of one thousand electron-volt (eV)), to unstable loads, such as plasma chamber loads. eV-like generators may thus generally be applied to various materials processing applications (as opposed to semiconductor processing in particular) and may be generally distinguished from RF generators, which are specialized to provide RF power (e.g., at frequencies between 100 kHz and 3 GHz), such as RF generator 400 and RF generator system 470 of FIGS. 4A and 4C, respectively. However, these general example characteristics and distinctions are relative to various illustrative embodiments only, and are not limiting in any way; various embodiments of any of the embodiments disclosed herein may be broadly applicable to various other categories or types of generators or other applications, some of which may transcend or blur the lines of the general categories or descriptions offered as illustrative examples herein.

Figure 8B:
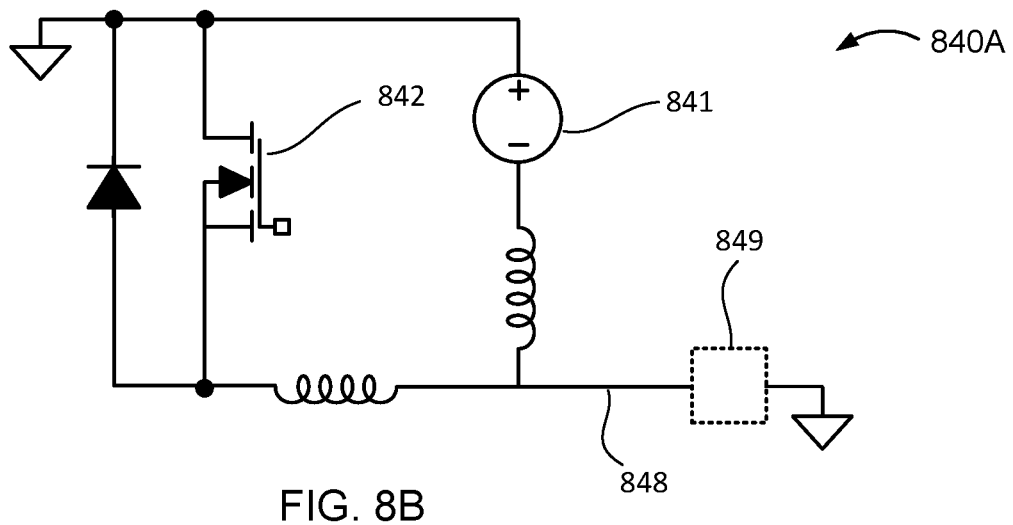
FIGS. 8B through 8F depict various eV-type generators that may incorporate stacked switch circuits with voltage clamping and power recovery, in accordance with various illustrative embodiments.
Figure 8C:
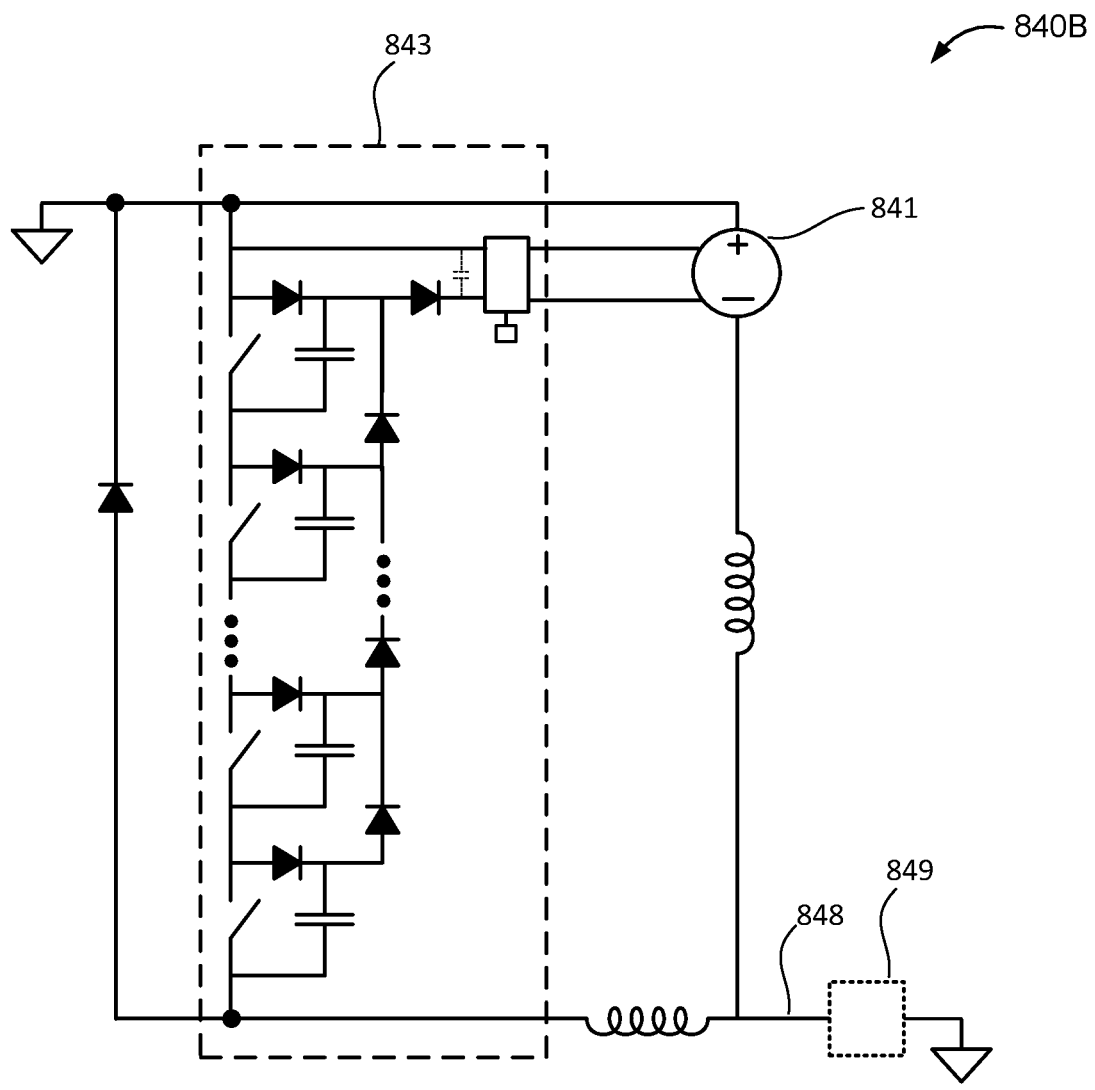
Figure 8D:
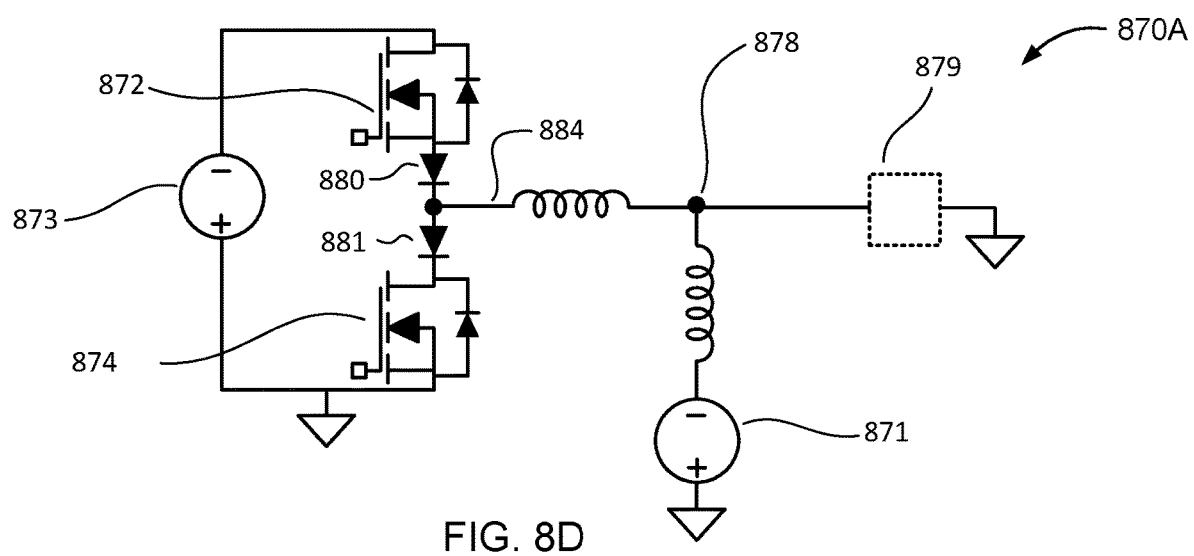
Figure 8E:
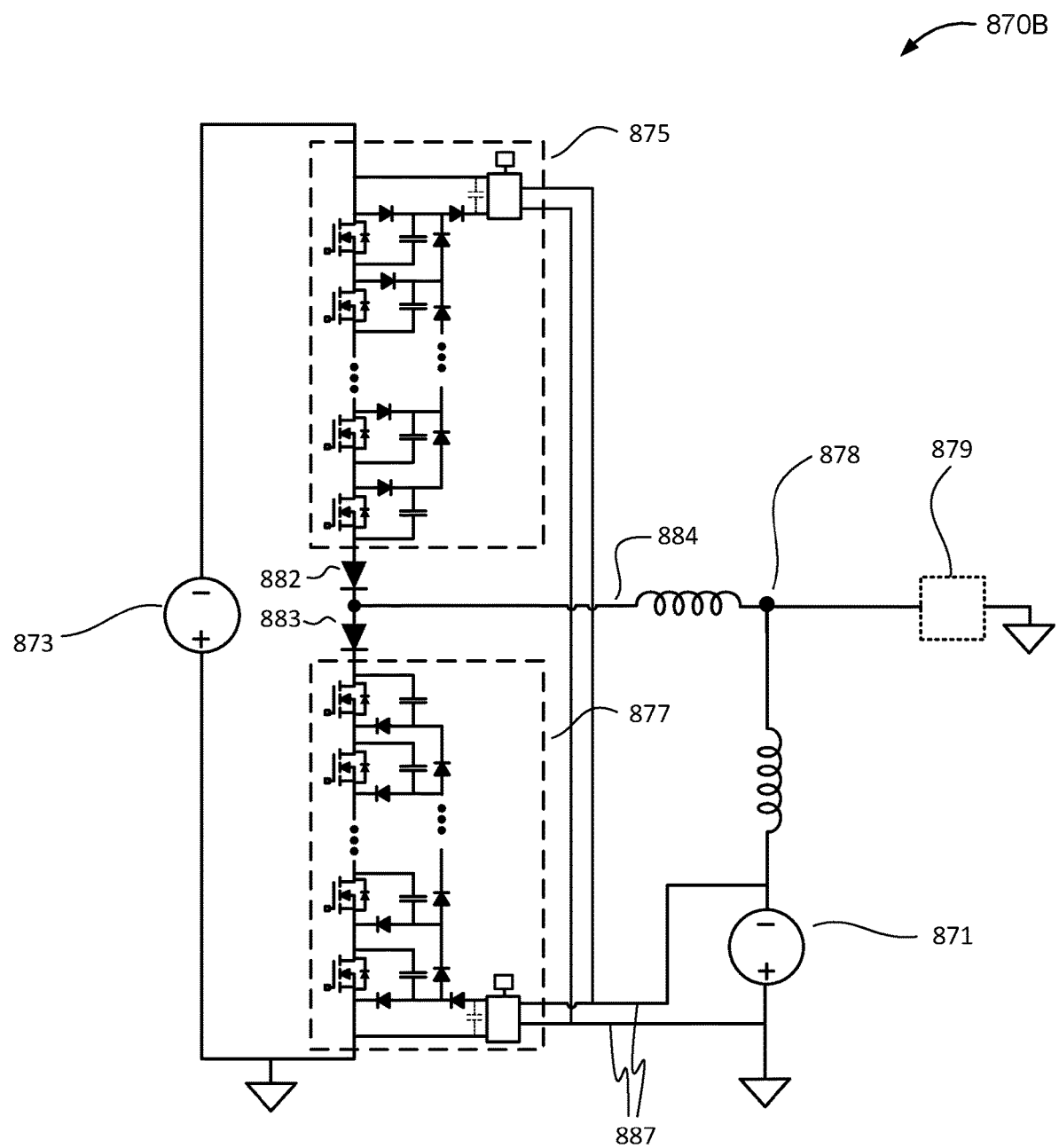
Figure 8F:
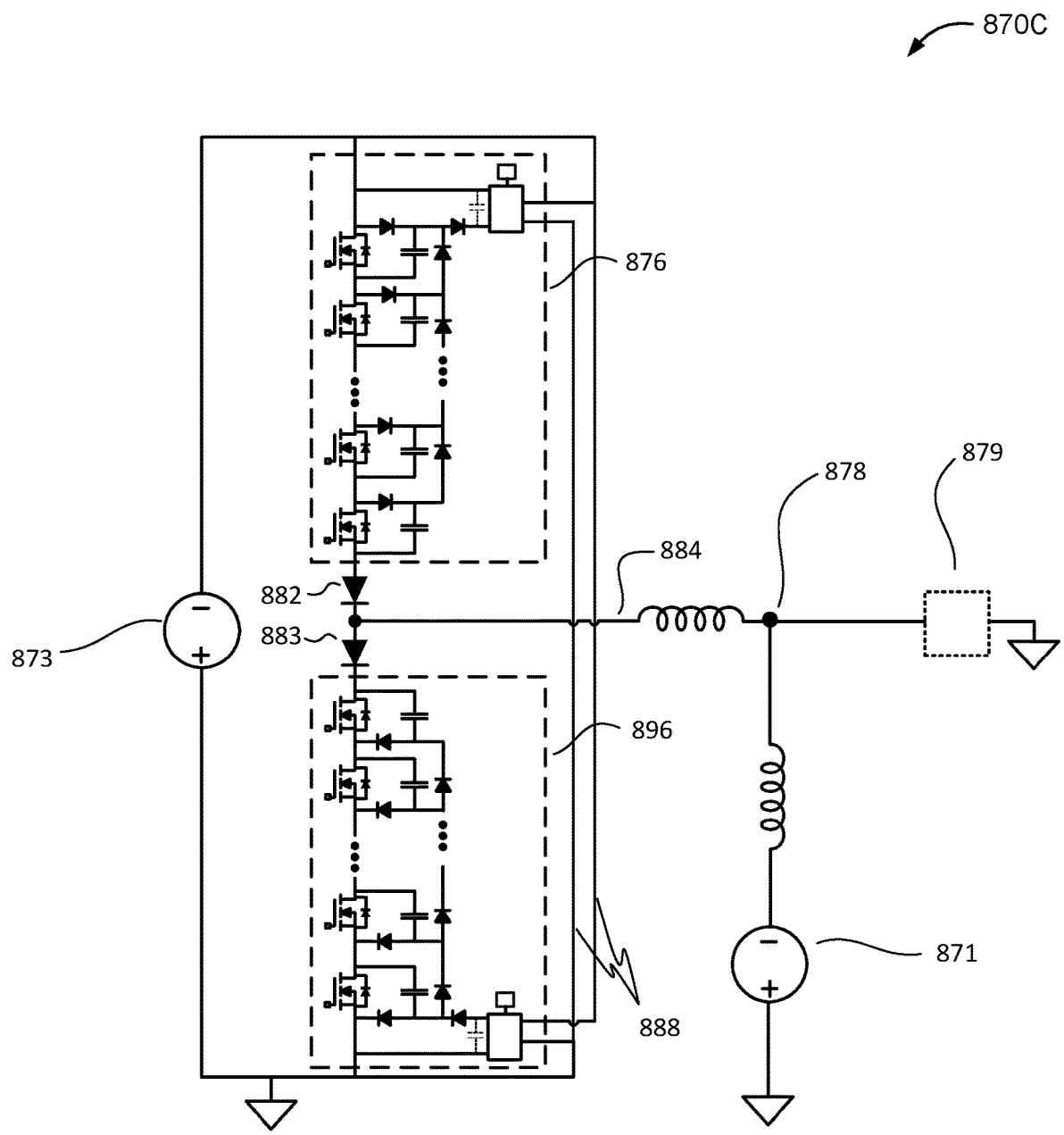

FIG. 8B shows an illustrative example generator 840A that includes a single switch 842, and a single voltage source, DC voltage supply 841, functioning as power supply. Switch 842 in FIG. 8B may, in various embodiments, be implemented as an embodiment of stacked switch circuits 501 or 547 as shown in FIGS. 5A, 5B, and as described above. FIG. 8C shows example generator 840B which is a more detailed view of an illustrative implementation of generator 840A of FIG. 8B, with switch 842 of FIG. 8B implemented as switch 843 in a stacked switch circuit configuration. FIG. 8D shows an illustrative example generator 870A that includes two switches 872, 874, each in stacked switch circuit configuration, and two voltage sources: DC voltage supply 871, and DC rail voltage supply 873. The switches 872, 874 as shown in FIG. 8D may be implemented in the form of stacked switch circuits 501 and 547, respectively as shown in FIGS. 5A and 5B, respectively. The addition of diodes 880 and 881 in FIG. 8D, necessary for proper operation of the eV-like generator, generally makes using circuits 601, 651, 701, 801 as shown in FIGS. 6A, 6B, 7, and 8A, respectively, and as described above less common to use in this particular implementation of an eV generator, but may be suitable for all applications, depending on the particular design requirements of the eV-like generator. FIGS. 8E and 8F show example generators 870B and 870C, respectively, which are more detailed views of two illustrative implementations of generator 870A of FIG. 8D. Generator 870B of FIG. 8E shows an implementation of generator 870A of FIG. 8D, with switches 872, 874 of FIG. 8D implemented as switches 875 and 877, respectively, with power recovery from switches 875 and 877 to DC voltage supply 871. Generator 870C of FIG. 8F shows an implementation of generator 870A of FIG. 8D, with switches 872, 874 of FIG. 8D implemented as switches 876 and 896, respectively, with power recovery from switches 876 and 896 to DC rail voltage supply 873.

In example embodiments of FIGS. 8B through 8F, generators 840A, 840B, 870A, 870B, and 870C may be eV-like source generators that may enable fine control of properties of an ion energy distribution (IED) of a plasma source powered by generators 840A, 840B, 870A, 870B, or 870C. For example, generators 840A, 840B, 870A, 870B, and 870C may enable fine control of IED properties such as negative voltage level, and flatness of a negative voltage pattern, of the output voltage delivered via output nodes 848, 878, respectively of generators 840A, 840B, 870A, 870B, and 870C, and thus to a load connected to the generator, such as a plasma chamber 849, 879 (not typically part of the generator, so indicated in dotted lines) that may be connected to output node 848, 878. In a plasma chamber 849 or 879 powered by generator 840A, 840B, 870A, 870B, or 870C, negative voltage level may determine mean ion energy of the plasma, and the flatness of the negative voltage pattern may determine the ion energy distribution width of the plasma. In many implementations it is a voltage internal to the plasma chamber that needs to be flat over a section of the output waveform in order to achieve a narrow ion energy distribution, requiring the voltage at the output node 848, 878 to have a controlled slope over that section of the output waveform. Enabling fine control of these ion energy distribution properties in a plasma may enable fine control of desired outcomes in various materials processing applications.

In example embodiments of FIGS. 8B and 8C, generators 840A and 840B may enable control of such ion energy distribution properties by enabling variable control of the supply voltage of DC voltage supply 841, and of the switching frequency of switch 842 or 843, respectively. In one illustrative embodiment, switches 842 and 843 of FIGS. 8B and 8C may enable options in switching frequency of any frequency between 200 kilohertz (kHz) and 1.1 megahertz (MHz) of switched DC voltage, for example. (Switched DC voltage may be flat or near-flat DC voltage in much or part of its waveform, with the wave-form also including a voltage switching cycle, to which the switching frequency refers, in various examples.)

In FIGS. 8B and 8C, the nodes of switch 842, 843 shown coupling switch 842, 843 to the surrounding circuitry of generator 840A, 840B may correspond to the terminal nodes of the embodiments of FIGS. 5A and 5B, i.e., upper node 508 and lower node 546 of stack switch circuit 501, or upper node 552 and lower node 594 of stacked switch circuit 547. DC voltage supply 841 of FIGS. 8B, 8C may also function as a power sink to switch 842, 843, in example implementations of power sinks 504, 592 of the embodiments of FIGS. 5A and 5B, such that switch 842 or 843 may recover power from voltage clamping internal to switch 842 or 843, and channel that recovered power in useful form to DC voltage supply 841, such that DC voltage supply 841 may reuse that recovered power as part of the power it subsequently supplies to generator 840A, 840B, respectively. For this purpose, switch 842 may include power recovery lines directly coupling switch 842 to DC voltage supply 841 in generator 840A (not shown in FIG. 8B, and otherwise isolated from the rest of the circuitry of generator 840A), analogous to power recovery output nodes 505, 595, respectively, of FIGS. 5A and 5B. Switch 843 has power recovery lines directly coupling switch 843 (in particular, the power converter of switch 843) to DC voltage supply 841 in generator 840B, as shown in FIG. 8C. Generators 840A, 840B are thus configured to clamp voltage in switches 842, 843, respectively, and to usefully recover power from voltage clamping from switches 842, 843, respectively, to DC voltage supply 841.

In example embodiments of FIGS. 8D, 8E, 8F, in contrast to those of FIGS. 8B & 8C, generators 870A, 870B, 870C may each enable control of ion energy distribution properties in a plasma load in plasma chamber 879 by enabling variable control of both the supply voltage of DC voltage supply 871, and the rail voltage of DC voltage rail 873. On the other hand, generators 870A, 870B, 870C may maintain fixed switching frequencies of switches 872, 874, 875, 877, 876, and 896. Generators 870A, 870B, 870C may also advantageously be able to enable control of average output power per switching cycle by controlling the timing between switching the upper switches 872, 875, 876, and the lower switches 874, 877, 896, thus controlling the fraction of time the output 878 is at a high negative voltage.

In various embodiments of FIG. 8D, switches 872 and 874 may be embodied as two of the stacked switch circuits of FIG. 5A or 5B. In embodiments of switches 872 and 874 that correspond to the embodiments of stacked switch circuits 501 or 547 of FIGS. 5A, 5B, respectively, the nodes connecting each of switches 872 and 874 to the surrounding circuitry of generator 870A may correspond to the upper and lower nodes 508 and 546 or 552 and 594 of FIG. 5A or 5B, respectively. In other examples, diodes 880, 881 and switches 872, 874 may be swapped so that diodes 880, 881 connect to DC voltage supply 873 and then switches 872, 874 can be implemented as a single one of the half-bridge stack switch circuits of FIG. 6A, 6B, 7, or 8A. (In these examples, the converters 604, 674, 716, 804, 818 may have input terminals that may be subject to high voltage swings, which may pose a challenge to take into account for implementation of the converters.) In half-bridge stack switch circuit embodiments of switches 872 and 874, switches 872 and 874, respectively, may correspond to the first and second stacked switch circuits of the respective switch circuit of FIG. 6A, 6B, 7, or 8A; i.e., high-side and low-side stacked switch circuits 610 and 616, 662 and 664, 704 and 710, or 808 and 812, respectively. Analogously, in half-bridge stack switch circuit embodiments of generator 870A, node 884 of generator 870A may correspond to the respective output nodes of the respective switch circuit of FIG. 6A, 6B, 7, or 8A coupled between the first and second stacked switch circuits, i.e., output nodes 614, 654, 706, 810, respectively. In FIG. 8D, in embodiments of switches 872 and 874 that correspond to the embodiments of stacked switch circuits 601, 651, 701, or 801 of FIG. 6A, 6B, 7, or 8A, respectively, the outer nodes connecting each of switches 872 and 874 to the surrounding circuitry of generator 870A, opposite each of switches 872, 874 from node 884, may correspond to the upper and lower nodes 606 and 618, 656 and 668, 702 and 712, or 806 and 814 of FIG. 6A, 6B, 7, or 8A, respectively. An embodiment of generator 870A of FIG. 8D in which switches 872 and 874 are embodied as the high-side and low-side stacked switch circuits 808, 812 of stack switch circuit 801 of FIG. 8A may be directly analogous to an embodiment in which switch 872 is embodied as stacked switch circuit 501 of FIG. 5A and switch 874 is embodied as stacked switch circuit 547 of FIG. 5B. In FIG. 8D, in embodiments of switches 872 and 874 that correspond to the embodiments of stacked switch circuits 601, 651, 701, or 801 of FIG. 6A, 6B, 7, or 8A, respectively, each of switches 872, 874 may have power recovery lines (not shown in FIG. 8D) coupled to DC voltage supply 873 and/or voltage supply 871, to employ DC voltage supply 873 and/or voltage supply 871 as its power sink for useful power recovery (with such power recovery lines otherwise isolated from the rest of the circuitry of generator 870A), analogous to power recovery output nodes between the power converter and the DC power supply or other power sink in each of FIG. 6A, 6B, 7, or 8A. The embodiment of generator 870B of FIG. 8E shows switches 875 and 877 with power recovery lines 887 coupled to voltage supply 871 to usefully divert recovered power to voltage supply 871. The embodiment of generator 870C of FIG. 8F shows switches 876 and 896 with power recovery lines 888 coupled to DC voltage supply 873 to usefully divert recovered power to DC voltage supply 873.

In FIG. 8D, the combination of switch 872 and diode 880 creates a switch module that can hold off voltage of either polarity and conduct current in only one direction, namely, from anode to cathode through diode 880. Similarly the combination of switch 874 and diode 881 creates a switch module that can hold off voltage of either polarity and conduct current in only one direction namely from anode to cathode through diode 881. Similar to using a stacked series combination of individual switch modules to implement switch 872 as series stacked switch 875, diode 880 may be implemented as multiple diodes in series to handle the voltage. Similar to the individual switch modules in switch 875, each diode in an implementation of diode 880 as a number of diodes in series may potentially be subject to overvoltage. Substituting the voltage bi-directional two-quadrant switch created by the series combination of a single quadrant switch and a diode for a four-quadrant voltage and current bi-directional switch does not impede the operation of the circuits under consideration, and provides a mechanism for protecting all switch modules from overvoltage through voltage clamping of the individual switch modules.

Figure 8G:
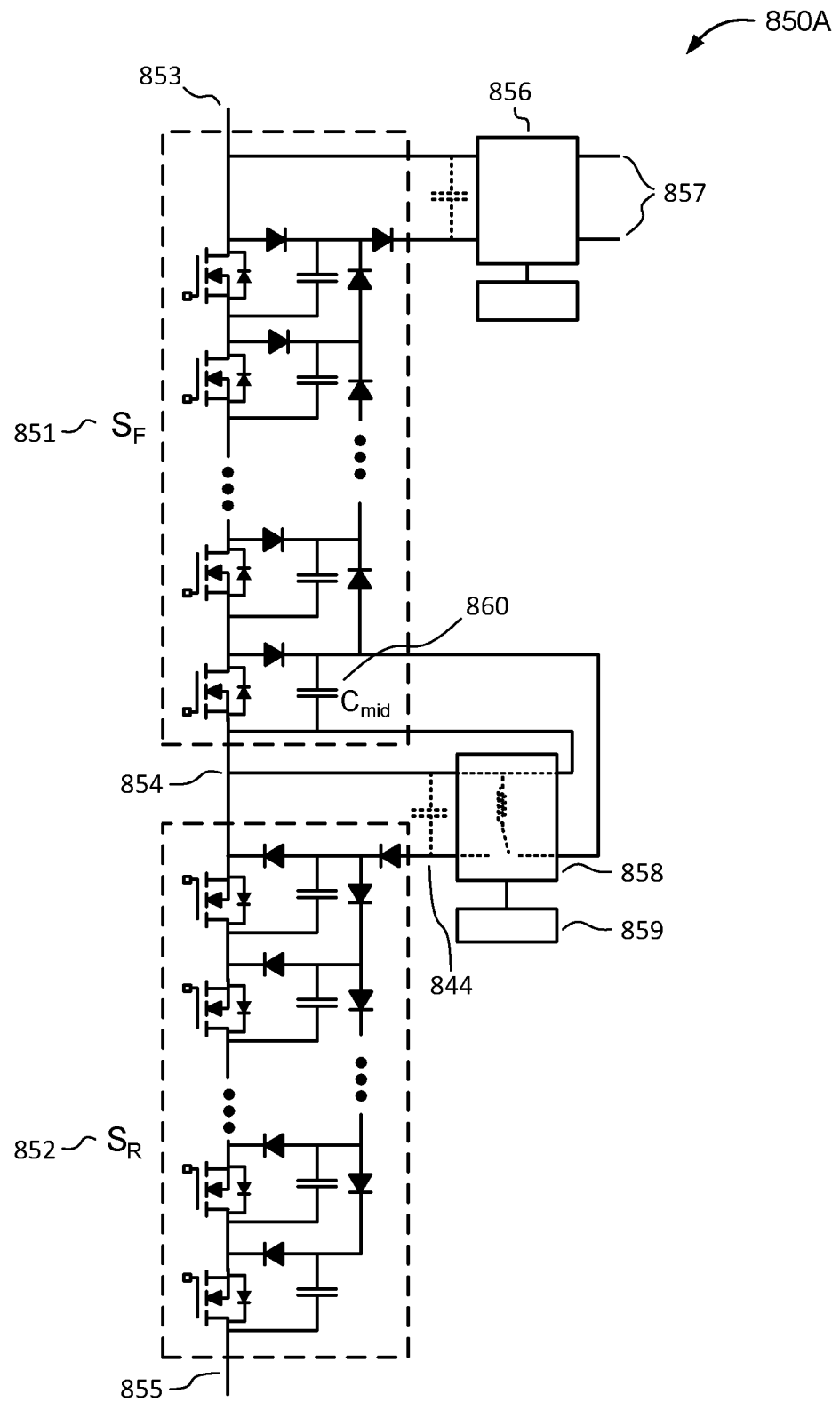
FIGS. 8G and 8H illustrate example implementations of voltage clamps with power recovery in stacked bi-directional switch circuits, according to embodiments of the present disclosure.

FIG. 8G illustrates an example implementation of a voltage clamp with power recovery in a stacked bi-directional switch circuit, according to an embodiment of the present disclosure. The bi-directional stacked switch 850A of FIG. 8G could potentially be used in the same kinds of applications as the combination of switch 872 and diode 880 in FIG. 8D or switch 875 and diode 882 in FIG. 8E or switch 876 and diode 882 in FIG. 8F or in any other circuit or system that requires a bi-directional switch. Bi-directional stacked switch circuit 850A with voltage clamping and power recovery comprises a forward switch SF 851 and a reverse switch $S_R$ 852 connected in series. Forward switch 851 is configured to be capable of sustaining a positive voltage between the upper node 853 and the mid-point node 854 in the off state, i.e., when all the switches in upper switch 851 are off. Reverse switch 852 is configured to be capable of sustaining a positive voltage between the lower node 855 and mid-point node 854 in the off state. Forward switch 851 together with power converter 856 functions in the same way as stacked switch circuit 501 of FIG. 5A and may incorporate additional elements G, $G_A$, $G_B$ of circuit 501 (not shown in FIG. 8G). Upper node 508 of circuit 501 corresponds to upper node 853 of circuit 850A and lower node 546 of circuit 501 corresponds to midpoint node 854 of circuit 850A. Power recovery output nodes 857 of bi-directional stacked switch 850A may connect to a power sink (not shown in FIG. 8G) such as power supply 871 or 873 of generator 870A, 870B, or 870C, or another suitable power sink. Reverse switch 852 together with power converter 858, optional capacitor 844 (optional depending on the topology of converter 858) and controller 859 may function in an analogous way as stacked switch circuit 547 of FIG. 5B, with lower node 594 of switch circuit 547 corresponding to midpoint node 854 of circuit 850A of FIG. 8G, upper node 552 of circuit 547 corresponding to lower node 855 of circuit 850A, and using midpoint capacitor $C_{mid}$ 860 analogously to power sink 592 of circuit 547. Midpoint capacitor $C_{mid}$ 860 is the capacitor associated with the switch module in forward switch 851 furthest from power converter 856. Midpoint capacitor $C_{mid}$ 860 may function as temporary storage of energy resulting from voltage clamping of voltages in reverse switch 852. Energy stored in midpoint capacitor $C_{mid}$ 860 may be transferred to the power sink (not shown in FIG. 8G) connected to the power recovery output nodes 857 when forward switch 851 is turned on and the voltage over midpoint capacitor $C_{mid}$ 860 is above the clamping voltage set by power converter 856 input voltage and the diode voltage drops of the connecting circuit connecting the individual switch modules to the power converter. The input voltage of power converter 856 sets (up to a few diode voltage drops) the clamping voltage of the switch modules of forward switch 851 while the input voltage of power converter 858, controlled by controller 859, sets the clamping voltage of the switch modules of reverse switch 852 (up to a few diode voltage drops). The clamping voltage of the switch modules of the forward switch and the switch modules of the reverse switch may be set to different values.

Figure 8H:
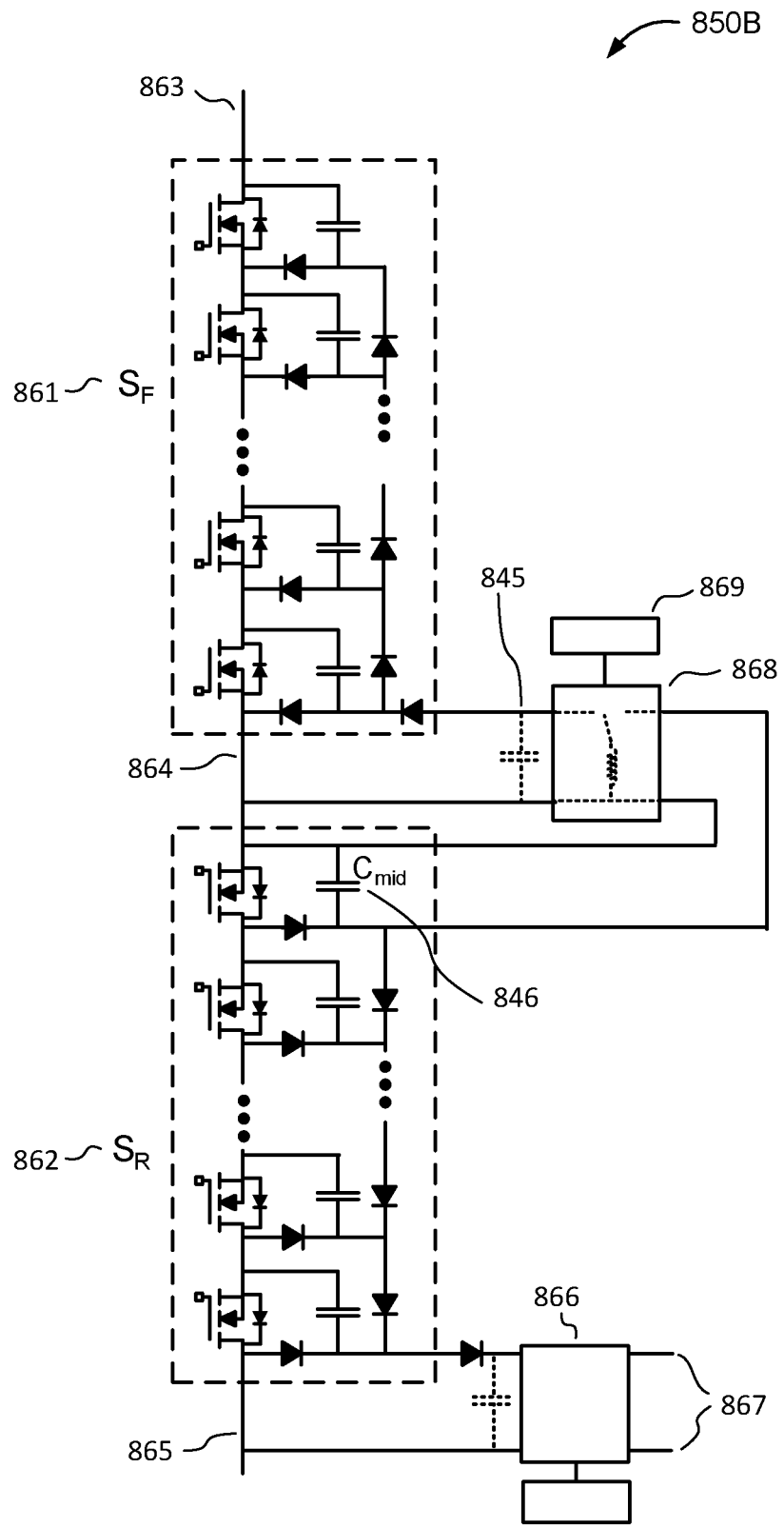

FIG. 8H illustrates another example implementation of a voltage clamp with power recovery in a stacked bi-directional switch circuit, according to an embodiment of the present disclosure. The bi-directional stacked switch 850B of FIG. 8H could potentially be used in the same kinds of applications as the combination of switch 874 and diode 881 in FIG. 8D or switch 877 and diode 883 in FIG. 8E or switch 896 and diode 883 in FIG. 8F or in any other circuit or system that requires a bi-directional switch. Bi-directional stacked switch circuit 850B with voltage clamping and power recovery comprises a forward switch $S_F$ 861 and a reverse switch $S_R$ 862 connected in series. Reverse switch 862 together with power converter 866 functions in an analogous way as stacked switch circuit 501 of FIG. 5A and may incorporate additional elements G, $G_A$, $G_B$ of circuit 501 (not shown in FIG. 8H). Upper node 508 of circuit 501 corresponds to lower node 865 of circuit 850B and lower node 546 of circuit 501 corresponds to midpoint node 864 of circuit 850B. Power recovery output nodes 867 of bi-directional stacked switch 850B connects to a power sink (not shown in FIG. 8G) such as power supply 871 or 873 of generator 870A, 870B or 870C or another suitable power sink. Forward switch 861 together with power converter 868, optional capacitor 845, and controller 869 may function in an analogous way as stacked switch circuit 547 of FIG. 5B with lower node 594 of switch circuit 547 corresponding to midpoint node 864 of circuit 850B of FIG. 8H, upper node 552 of circuit 547 corresponding to upper node 863 of circuit 850B, and using midpoint capacitor $C_{mid}$ 846 analogously as power sink 592 of circuit 547. Midpoint capacitor $C_{mid}$ 846 is the capacitor associated with the switch module in reverse switch 862 furthest from power converter 866. Midpoint capacitor $C_{mid}$ 846 may function as temporary storage of energy resulting from voltage clamping of voltages in forward switch 861. Energy stored in midpoint capacitor $C_{mid}$ 846 may be transferred to the power sink (not shown in FIG. 8G) connected to the power recovery output nodes 867 when reverse switch 862 is turned on and the voltage over midpoint capacitor $C_{mid}$ 846 is above the clamping voltage set by power converter 866 input voltage and the diode voltage drops of the connecting circuit connecting the individual switch modules to the power converter. The input voltage of power converter 866 sets (up to a few diode voltage drops) the clamping voltage of the switch modules of reverse switch 862 while the input voltage of power converter 868, controlled by controller 869, sets the clamping voltage of the switch modules of forward switch 861 (up to a few diode voltage drops). The clamping voltage of the switch modules of the forward switch and the switch modules of the reverse switch may be set to different values.

In other embodiments, HOeV, HOeV-like, or other eV-like generators may incorporate any other number and embodiments of stacked switch circuits, any other number and embodiments of power sources, other combinations of controllable options enabled among voltages of power supplies or voltage rails and among switching frequencies of various switches, and other variations. In various embodiments, including variations of any of the embodiments described or indicated above, the switch or switches of an eV-like generator may be embodied as any of the series stacked switch circuits of this disclosure (e.g., stacked switch circuits 501, 547, 601, 651, 701, 801 as shown in FIGS. 5A, 5B, 6A, 6B, 7, and 8A, respectively or bi-directional stacked switch circuits 850A, 850B as shown in FIGS. 8G and 8H) or any other variations or extensions thereof. Various embodiments of such an eV-like generator may enable the switches to perform voltage clamping with power recovery, which may provide further advantages such as fast reaction time and high degree of assurance of protection against any potential overheating or damage from overvoltage events or load voltage shocks before the eV-like generator control system is engaged to protect the eV-like generator, as well as useful power recovery from the voltage clamping to an associated power supply, rail, or other useful power sink, reduced power dissipation, and higher efficiency, among other novel advantages, in various embodiments.

Thus, a generator may include a power source; a switch circuit, connected to the power source via first generator circuitry; and an output node, connected to the power source and the switch circuit via second generator circuitry, in various embodiments. The generator may be configured to output power via the output node, in various embodiments. The switch circuit may include two terminal nodes, comprising an upper node connected to a high voltage side of the first generator circuitry, and a lower node connected to a low voltage side of the first generator circuitry; a plurality of switch modules, connected in series between the upper node and the lower node, wherein each of the switch modules comprises a switch, a rectifier, and a capacitor; a connecting circuit, coupled to the switch modules; and a power converter, coupled to the connecting circuit and to one of the terminal nodes, in various embodiments. The switch circuit may be configured to limit a voltage or a component of a voltage in the switch circuit, and to recover power from the limiting of the voltage, in various embodiments. Recovering the power may include diverting power from the switch modules via the connecting circuit to the power converter, and the power converter outputting the power to the power source, in various embodiments. A generator may apply power from a power source across a stacked series of switch modules to an output node; divert power from the switch modules to a power converter, thereby limiting a voltage in the stacked series of switch modules; and output at least some of the diverted power from the power converter back to the power source, in various embodiments. The stacked series of switch modules may comprise a forward switch comprising a first portion of the switch modules, a reverse switch comprising a second portion of the switch modules, a midpoint node coupled between the forward switch and the reverse switch and a power converter connected to the midpoint node configured to limit a voltage or a component of a voltage in either the forward or reverse switch and using a capacitor in the other of the forward or reverse switch as a power sink, wherein the forward switch can sustain a positive voltage from upper node to midpoint node and the reverse switch can sustain a positive voltage from the lower node to the midpoint node. The power source may be a first power source, and the generator may further apply power from a second power source directly to circuitry coupled to the output node, in various embodiments. Applying the power across the stacked series of switch modules may include applying power across a first stacked switch circuit comprising a first portion of the switch modules, a second stacked switch circuit comprising a second portion of the switch modules, and an output node coupled between the first stacked switch circuit and the second stacked switch circuit, in various embodiments. The first stacked switch circuit or second stacked switch circuit or both first stacked switch circuit and second stacked switch circuit may further be comprised of a forward switch comprising a first portion of the switch modules, a reverse switch comprising a second portion of the switch modules, a midpoint node coupled between the forward switch and the reverse switch, and a power converter connected to the midpoint node configured to limit a voltage or a component of a voltage in either the forward or reverse switch and using a capacitor in the other of the forward or reverse switch as a power sink, wherein the forward switch and reverse switch can sustain voltages of opposite polarity applied over the stacked switch circuit comprising both the forward switch and the reverse switch.

Figure 9:
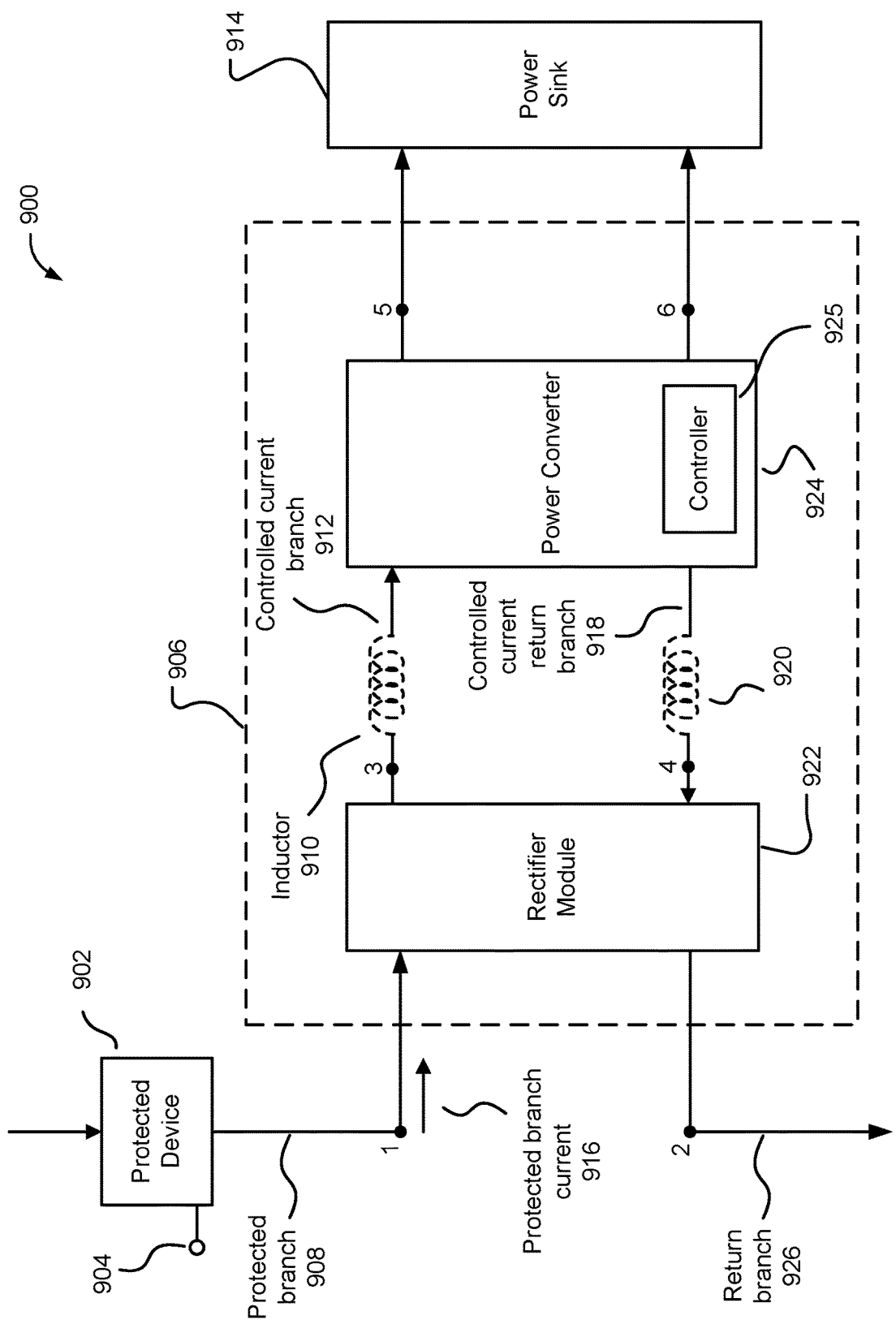
FIG. 9 illustrates a block diagram of an example current clamp with power recovery according to one embodiment of the present disclosure.

FIG. 9 illustrates a block diagram of an example current clamp 906 with power recovery in a current clamp system 900, according to one embodiment of the present disclosure. Current clamp 906 connects an electrically conducting protected branch 908 to a power sink 914 and a return branch 926. Current clamp 906 limits a current 916 or a component of current 916 in the protected branch 908 by diverting power to the power sink 914, in response to any current component arising in protected branch 908 that would otherwise drive a current or other particular current component in protected branch 908 above or outside a designated current limit or other current component limit.

Current clamp 906 includes a rectifier module 922 and a power converter 924. Rectifier module 922 connects protected branch 908 to the input of power converter 924. Current flows from rectifier module 922 into power converter 924 through a controlled current branch 912, and from power converter 924 back to rectifier module 922 through a controlled current return branch 918. Power converter 924 comprises or is coupled to a controller 925 and maintains a nominally constant current in controlled current branch 912 and in controlled current return branch 918 by directing any excess power to power sink 914. The power sink 914 may be, e.g., a DC rail in a power amplifier or generator, a voltage supply, a current source, or an AC utility supply. Optional inductors 910 and 920 in controlled current branch 912 and in controlled current return branch 918, respectively, may help maintain nominally constant current in controlled current branch 912 and controlled current return branch 918. Depending on the design of power converter 924 and the distance between rectifier module 922 and power converter 924, inductors 910 and 920 may or may not be particularly advantageous or included, in different embodiments.

A protected device 902 may be included or inserted in series with protected branch 908. Protected device 902 may, for example, include a power device or a MOSFET device, and drain and source terminals of the power device or MOSFET device may for example be inserted in series with protected branch 908. Protected device 902 may have other terminals 904. For example, protected device 902 may include a power device or switch that receives a reference signal via terminal 904 for amplification in a generator or power amplifier system that includes current clamp system 900.

The design of rectifier module 922 may determine, or contribute to determining, which component of the current 916 is subject to the current component limit by current clamp 906. The component of the current limited by current clamp system 900 may for example be the current (i.e., the maximum value of the current), the minimum value of the current, the absolute value of the current, the maximum of a low frequency component of the current, the absolute value of a high frequency component of the current, an AC component of current, an RF component of current, or another current component, in various embodiments. The current clamp system may thus be configured to respond to a current component in the protected branch reaching a current component limit by diverting power to the power converter, thereby limiting the current component in the protected branch, and the power converter may be configured to output at least a portion of the power to a power sink, in various embodiments. A current clamp may thus apply power to a protected branch coupled in series to a rectifier module, coupled to a power converter; limit a current or other current component in the protected branch to no higher than a current component limit; and divert excess power from the limiting of the current or other current component from the power converter to a power sink, in various embodiments.

Figure 10A:
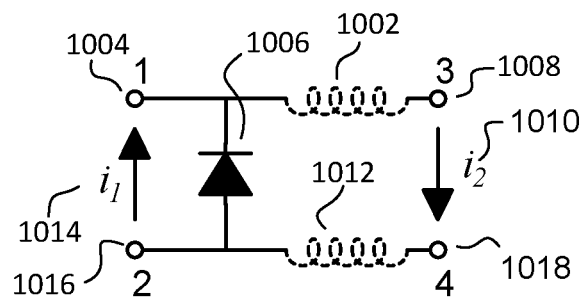
FIGS. 10A-10G illustrate various rectifier circuits that can be used in connection with a current clamp with power recovery in various embodiments of the present disclosure.
Figure 10B:
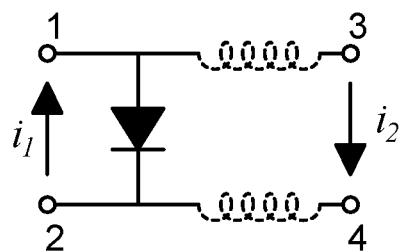
Figure 10C:
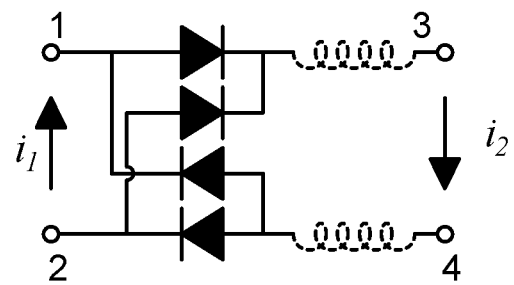
Figure 10D:
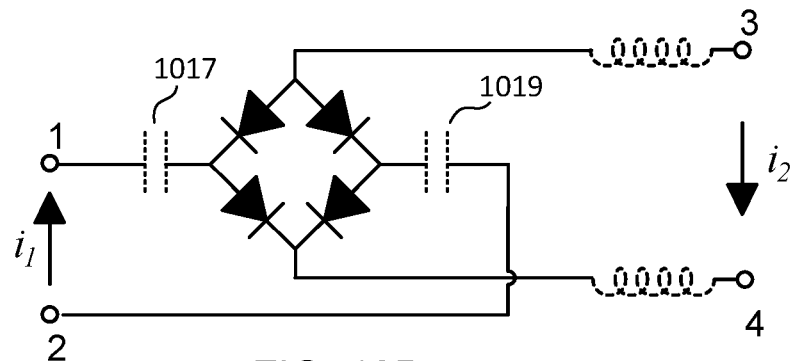

FIGS. 10A through 10K show various example rectifier modules and rectifier module sub-circuits (e.g., filters) that can be used in connection with a current clamp with power recovery in various embodiments of the present disclosure, e.g., that may be used as or included as part of rectifier module 922 in FIG. 9, in accordance with various embodiments of current clamp 906 of FIG. 9. FIG. 10A shows a rectifier capable of limiting a first current $i_1$, 1014, between nodes 1016 and 1004, to a maximum value equal to the second current $i_2$, 1010, between nodes 1008 and 1018. In some cases, the diode 1006 may be replaced by multiple diodes in series to withstand higher voltages when the diode is in the off state. In FIGS. 10A through 10G, nodes labeled 1 through 4 correspond to the nodes numbered 1 through 4 in FIG. 9. First current $i_1$ corresponds to the protected branch current 916 on protected branch 908 of FIG. 9, and second current $i_2$ may correspond to the current in the controlled current branch 912 of FIG. 9. The same holds for first and second currents $i_1$ and $i_2$ of FIG. 10B through FIG. 10G. The rectifier of FIG. 10A contains a single diode 1006 as shown, which may also represent multiple series connected diodes acting like a single diode with a higher effective diode voltage drop, in some embodiments. The rectifier of FIG. 10A may optionally include inductors 1002 and 1012, which may correspond to the optional inductors 910 and 920 of FIG. 9. The rectifier of FIG. 10B limits the value of first current $i_1$ to a minimum equal to the value of the second current $i_2$. The rectifier of FIG. 10C includes four diodes in a full-bridge configuration, and limits the amplitude of the first current $i_1$ to a value equal to the value of the second current $i_2$. The rectifier module of FIG. 10D shows optional capacitors 1017, 1019 on the protected branch and the return branch, respectively, and is otherwise topologically equivalent to that of FIG. 10C, just displayed in a different arrangement. The rectifier module of FIG. 10D also includes four diodes in a full-bridge configuration, and limits the amplitude of the first current $i_1$ to a value equal to the value of the second current $i_2$. Optional capacitors 1017 and 1019 block the DC component of current $i_1$ and thus the circuit of FIG. 10D with optional capacitors 1017 and 1019 installed is suitable for use in circuits where $i_1$ is not required to have a DC component, such as in AC or RF applications.

Figure 10E:
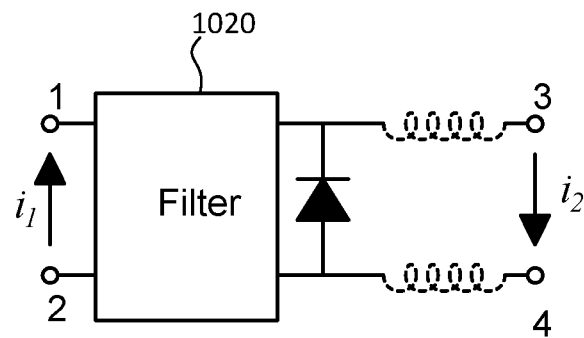
Figure 10F:
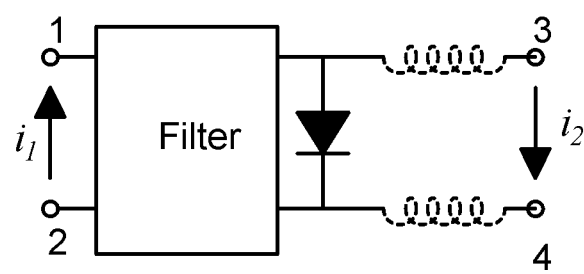
Figure 10G:
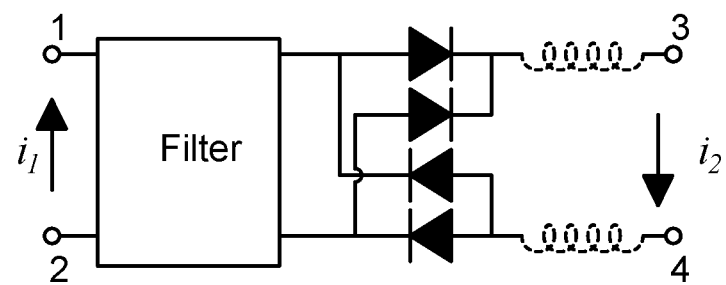

Each of the rectifiers shown in FIG. 10A through 10C can be combined with filters 1020 to further select components of the protected branch current $i_1$ as shown in FIGS. 10E, 10F, and 10G, respectively, in a rectifier module that may correspond to rectifier module 922 in current clamp 906 of FIG. 9, in accordance with various embodiments. A few possible topologies for the filter 1020 are shown in FIG. 10H through 10K. The filter 1022 of FIG. 10H may contain a single capacitor 1026 and select the low frequency or DC component of the protected branch current $i_1$ for clamping, allowing any high frequency, AC, or RF components of a protected branch current $i_1$ to bypass the current clamp. Using the filter of FIG. 10H in the rectifier of FIG. 10E would, for example, limit the low frequency or DC component of a protected branch current $i_1$ to $i_2$ but would allow the AC component or RF component of protected branch current $i_1$ to go above the value of $i_2$. The filter of FIG. 10I contains a single inductor 1024 and capacitor 1028 and selects the high frequency, AC, or RF component of protected branch current $i_1$ for clamping, allowing a DC or low frequency component of protected branch current to bypass the current clamp. Using the filter of FIG. 10I in the rectifier of FIG. 10G would for example limit the amplitude of the high frequency, AC, or RF component of protected branch current $i_1$ to the value of current $i_2$ but would not limit the DC or low frequency component of protected branch current $i_j$.

Figure 10H:
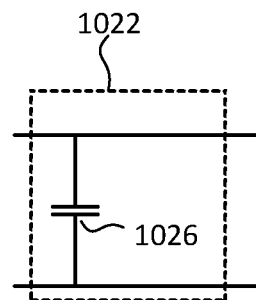
FIGS. 10H-10K illustrate various filters that can be used in connection with a rectifier that can be used in connection with a current clamp with power recovery in various embodiments of the present disclosure.
Figure 10I:
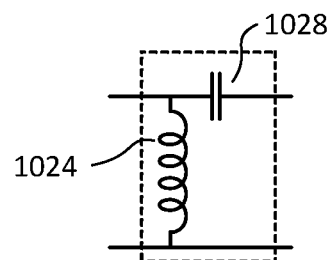
Figure 10J:
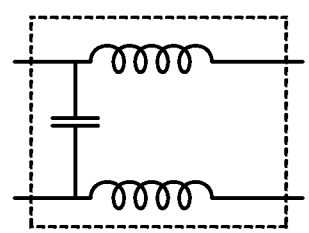
Figure 10K:
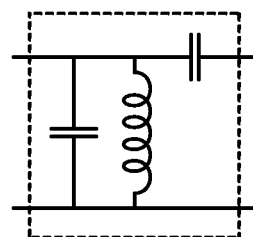

The filter of FIG. 10H does not load the circuit in which the current clamp is used, i.e., if the protected branch current $i_1$ is not in the range where it is being clamped, the current clamp does not alter the behavior of the circuit substantially. The filters of FIGS. 10I, 10J, and 10K can load a circuit in which a current clamp is used. For example, the circuit of FIG. 10I creates a high impedance in the protected current branch at the parallel resonance of the inductor 1024 and the capacitor 1028 when the protected branch current $i_1$ is outside a range in which it is being clamped, while not creating a high impedance in the protected current branch at the parallel resonance of the inductor 1024 and the capacitor 1028 when the protected branch current $i_1$ is within a range in which it is being clamped. This is normally not a problem if the circuit in which the current clamp is employed operates in a periodic steady state and the resonance does not affect any of the harmonics of the fundamental frequency substantially. In these and other embodiments, components of a rectifier module may enable a broad variety of current clamping that may limit any of a range of desired current components to clamp, in accordance with various embodiments.

Figure 11A:
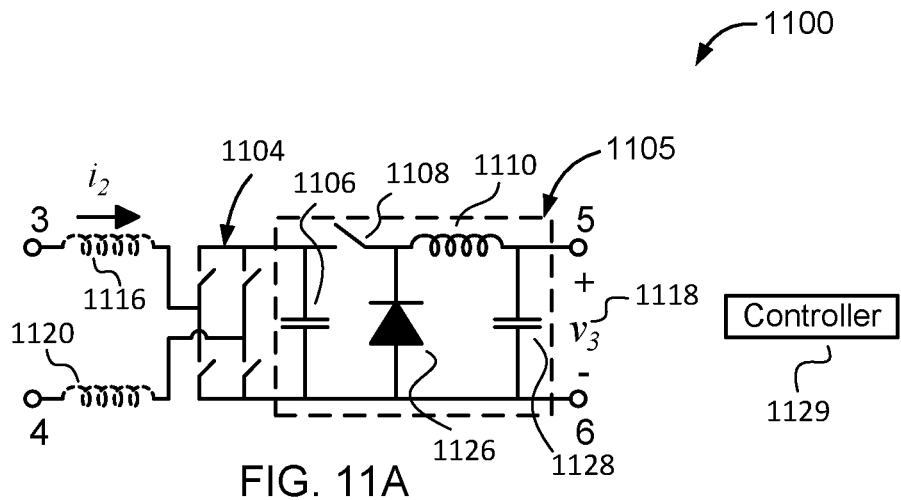
FIGS. 11A-11F illustrate various power converters that can be used in connection with a current clamp with power recovery in various embodiments of the present disclosure.

FIGS. 11A through 11F show various power converters (e.g., various embodiments of power converter 924 in FIG. 9) that can be used in connection with a current clamp with power recovery in various embodiments of the present disclosure. FIG. 11A shows a power converter 1100 in which a current source includes two inductors 1116 and 1120 connected to a full-bridge 1104 followed by a buck converter 1105. Power converter 1100 may include buck converter 1105 in some embodiments in which no isolation between the protected current branch and the power sink is required (i.e., nodes in the protected branch 908 of FIG. 9, such as the nodes labeled 1 and 2 in FIG. 9 may share a common ground reference with nodes at the output of the power converter 924 such as the nodes labeled 5 and 6 in FIG. 9), and the full-bridge 1104 can operate off a voltage higher than the power sink voltage $v_3$ 1118. In FIGS. 11A through 11F, the current labeled $i_2$ (1102 in FIG. 11A) is the controlled current branch current, i.e., the current in the controlled current branch 912 of FIG. 9. Power converter 1100 may be controlled by a controller 1129.

The buck converter 1105 portion of power converter 1100 of FIG. 11A includes an input capacitor 1106, a switch 1108, a diode 1126, an inductor 1110, and output capacitor 1128. The output capacitor 1128 may be part of the power sink rather than part of the buck converter, in some embodiments. Buck converter 1105 may be a conventional buck converter, but power converter 1100 may operate buck converter 1105 in a way to maintain the input voltage constant, rather than to maintain an output voltage, and thus contribute to overall power converter 1100 maintaining the input current, i.e., the controlled current branch current $i_2$, constant. The full-bridge 1104 may be operated to limit the controlled current branch current $i_2$, to keep controlled current branch current $i_2$ equal to or below the desired clamping current, or to keep another current component equal to or below a desired current component limit, in various embodiments. With buck converter 1105 between the current source and power sink, such as in power converter 1100 of FIG. 11A, the voltage over the input capacitor 1106 may be a body diode voltage drop of switch 1108 below the power sink voltage $v_3$ 1118 even when no current is flowing in the protected branch 908 as shown in FIG. 9, i.e., power may be taken from the power sink to sustain controlled current branch current $i_2$ at the desired level. This may contribute to power converter 1100 maintaining the controlled current branch current $i_2$ at the desired clamping current.

Figure 11B:
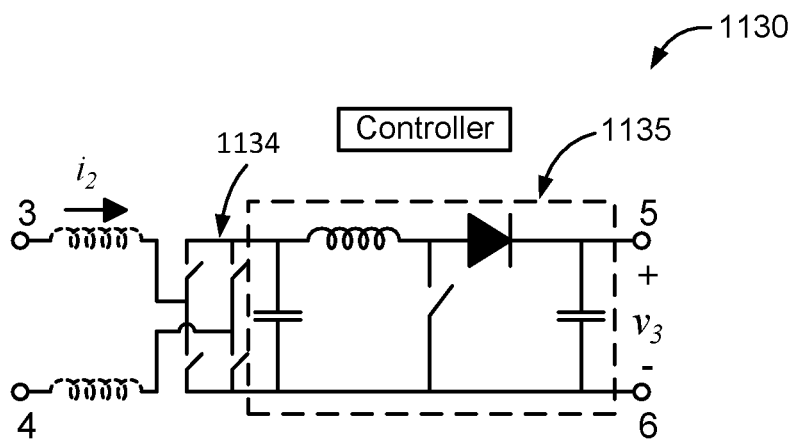
Figure 11C:
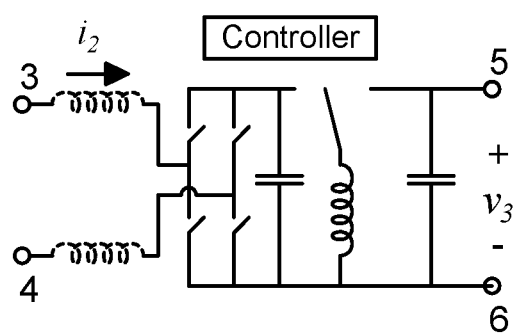
Figure 11D:
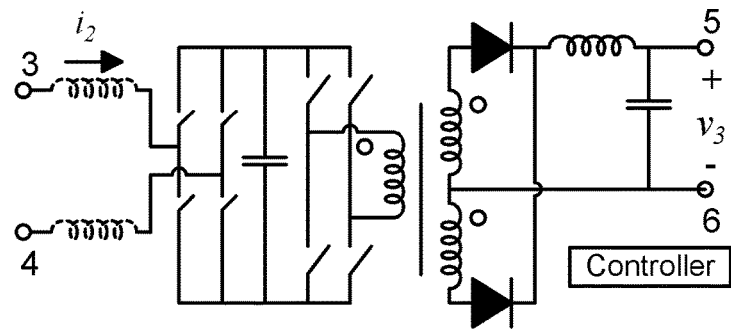
Figure 11E:
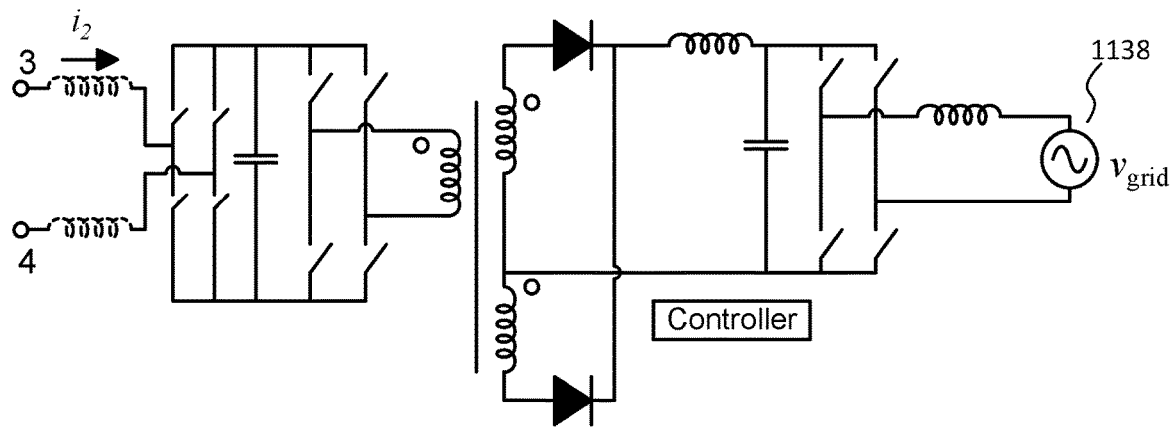
Figure 11F:
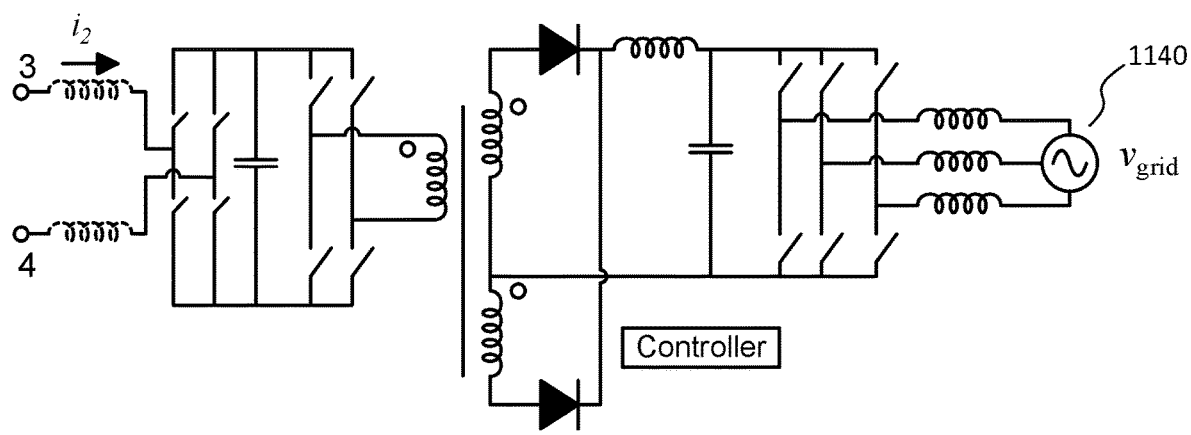

FIG. 11B shows another embodiment, in which a power converter 1130 may incorporate a full-bridge 1134 and a boost converter 1135 connecting the current source to the power sink. In this embodiment, it may not be possible for boost converter 1135 alone to maintain controlled current branch current $i_2$ at the clamping level. In this case either both bottom switches of the full-bridge 1134 or both top switches of full-bridge 1134 may remain closed while controlled current branch current $i_2$ is below the desired clamping level. FIG. 11C shows another embodiment of a power converter that includes a full-bridge and a buck-boost converter connecting the current source to the power sink, which may be used if no isolation between the protected current branch and power sink is required. The buck-boost converter may be advantageous because the voltage over the full-bridge of the current source can be above or below the voltage of the power sink. FIG. 11D shows a power converter in another embodiment that includes an isolated DC to DC converter that can be used when isolation between the input and output of the converter is required, and the power sink is a DC sink such as a DC bus. In FIG. 11D, isolation may be achieved with a transformer. FIG. 11E shows a power converter in another embodiment that may be advantageous when the power sink is a single-phase AC utility supply 1138, for example. FIG. 11F shows a power converter in another embodiment that includes that may be advantageous when the sink is a three-phase AC utility supply 1140, for example.

Figure 12A:
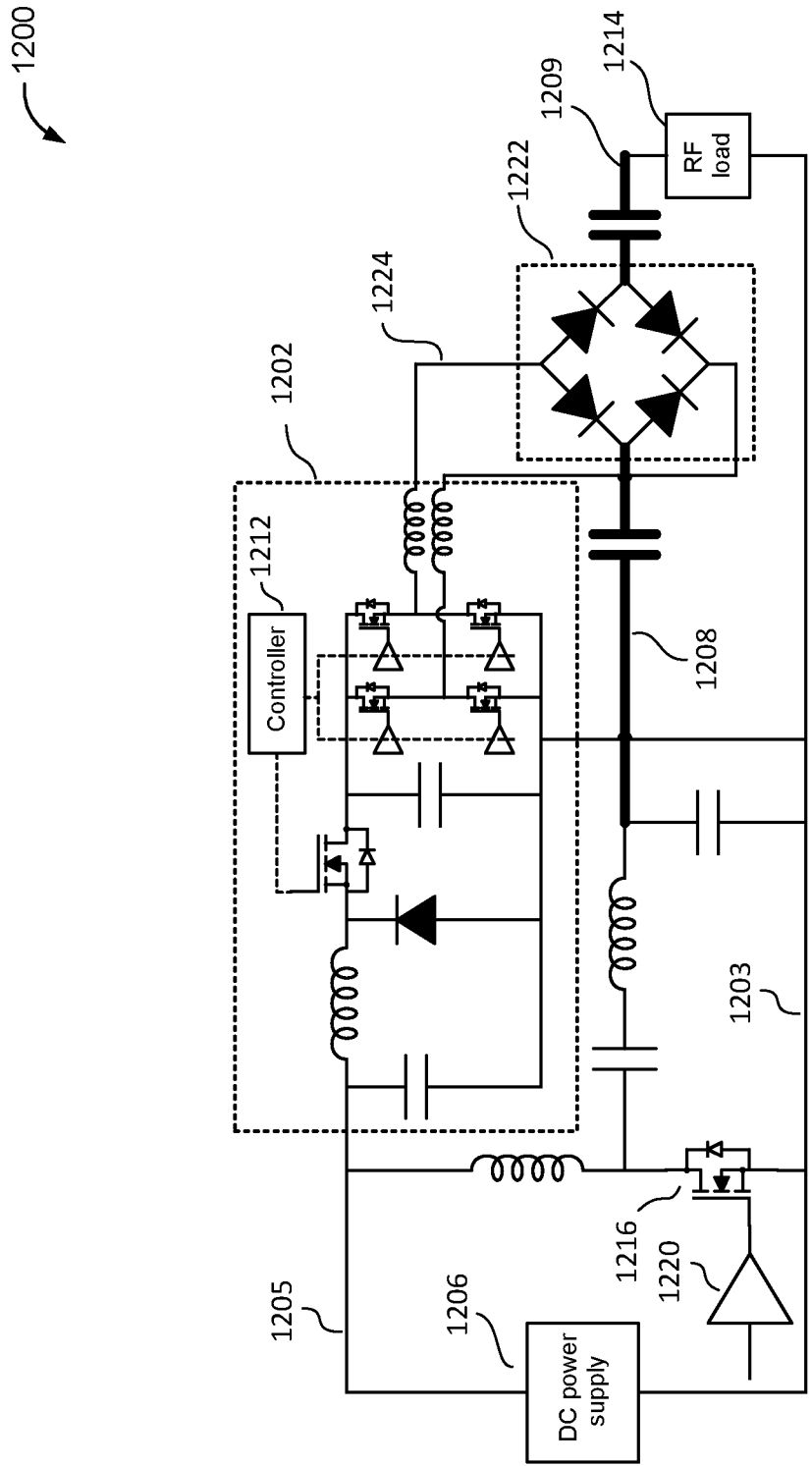
FIG. 12A illustrates the use of a current clamp in an RF generator circuit according to one embodiment of the present disclosure.

FIG. 12A depicts an RF generator 1200 that includes a current clamp with power recovery, to protect a protected branch 1208 and return branch 1209 (shown in thick lines) from overcurrent, and thereby, to protect RF generator 1200 and protected power device 1216 from damage due to excessive current in protected branch 1208. In this embodiment, DC power supply 1206 supplies power to generator 1200 by maintaining rail 1205 at a desired voltage with respect to ground reference 1203. DC power supply typically converts AC power from a utility power supply (not shown) to DC power. In this embodiment, the current clamp includes rectifier module 1222 and power converter 1202. The rectifier module 1222 includes four diodes in a full-bridge configuration, analogous to the rectifier modules of FIGS. 10C and 10D, in this embodiment. Power converter 1202 includes a switching full-bridge current source and a buck converter, analogous to the power converter embodiment of FIG. 11A, in this embodiment. Other embodiments of rectifier module and power converter may be used in other embodiments of a generator with current clamping and power recovery. In this embodiment, the power sink is DC power supply 1206 that supplies rail 1205 to power RF generator 1200. In this embodiment, the power sink and the current clamp can share a common ground reference, making the use of a non-isolated buck converter in converter 1202 possible. A controller 1212 controls the current source and power converter 1202 in such a way as to limit the current in the controlled current branch 1224 such that the controlled current branch current remains below or at the desired clamping level, or to limit another current component to within the desired clamping level of that current component, in different embodiments. This ensures that the current, or the particular current component, in the protected branch 1208 stays at or below or within the desired clamping level.

RF generator 1200 may contain a driver 1220 for driving a power device 1216. RF generator may be connected to an RF load 1214, such as a plasma load in plasma chamber, which may also have a matching network attached between RF generator 1200 and the plasma chamber, in some embodiments. Power device 1216 may channel a reference signal through RF generator 1200 to drive RF load 1214, while the current clamp comprising rectifier module 1222 and power converter 1202 may divert any excess power to rail 1205 and DC power supply 1206 to limit a current or other current component along protected branch 1208 to at or below the desired current component clamping level. RF generator 1200 may thus be configured to respond to a current component in the protected branch reaching a current component limit by diverting power to the power converter, thereby limiting the current component in the protected branch, and the power converter may be configured to output at least a portion of the power to a power sink, in various embodiments. RF generator 1200 may apply power to a protected branch coupled in series to a rectifier module, wherein the rectifier module is coupled to a power converter; limit a current component on the protected branch to no higher than a current component limit; and divert excess power from the limiting of the current component from the power converter to a power sink, in various embodiments. The current clamp comprising rectifier module 1222 and power converter 1202 may thus perform effective current clamping with useful power recovery in RF generator 1200, in various embodiments.

Figure 12B:
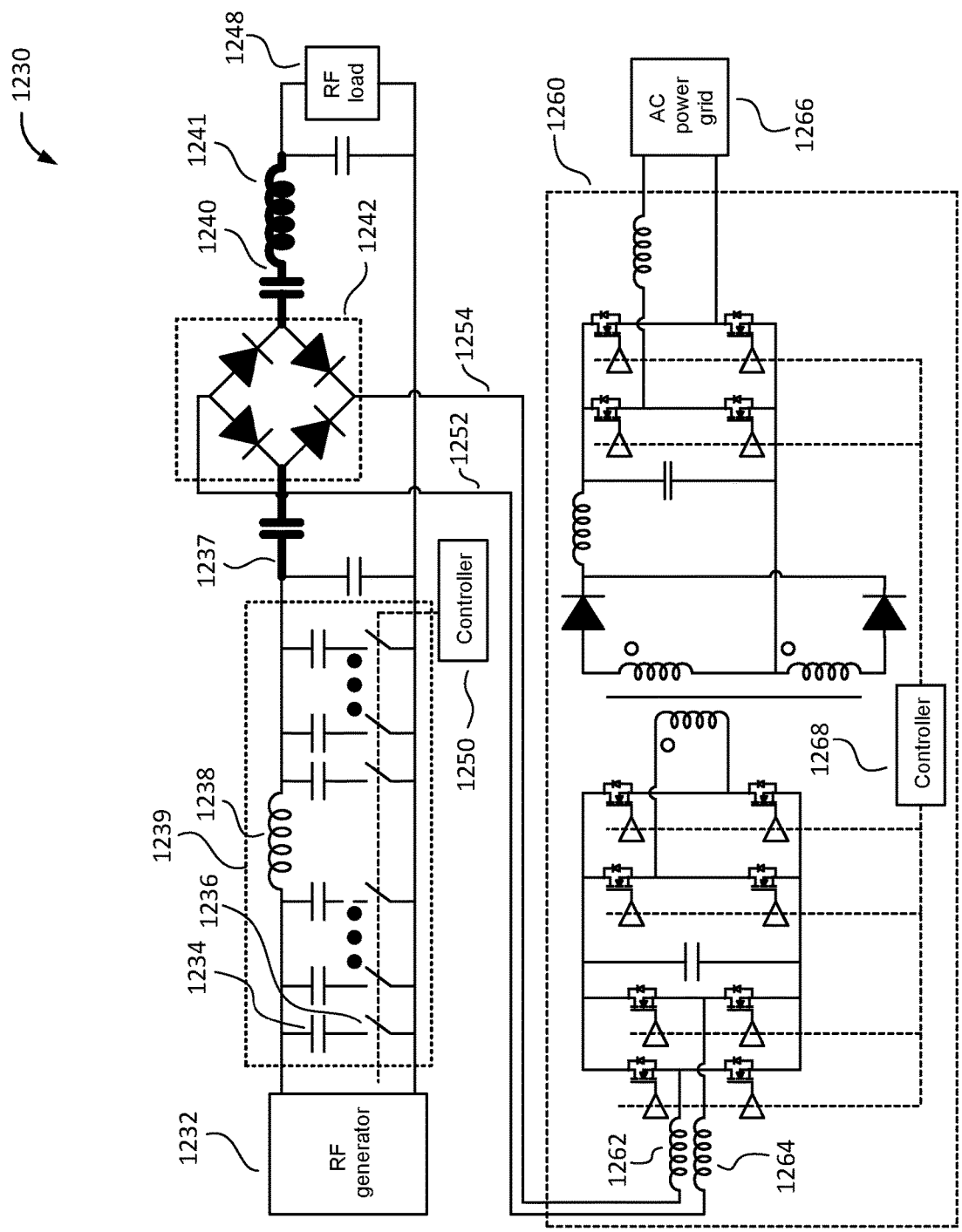
FIG. 12B illustrates the use of a current clamp with power recovery in an RF solid state impedance matching network according to another embodiment of the present disclosure.

FIG. 12B shows a match network 1230, which is a solid-state impedance matching network system with current clamping with power recovery, in accordance with another illustrative embodiment. FIG. 12B shows the use of a current clamp with power recovery to limit the current or another current component in a protected branch 1237 and return branch 1240 (shown in thick lines) in match network 1230, in this illustrative embodiment. Match network 1230 connects an RF generator 1232 to an RF load 1248. A controller 1250 in the solid-state matching network controls switches 1236 to connect and disconnect parallel switched capacitors 1234 in switched capacitor array 1239 from the network. The solid-state network also contains fixed components such as inductor 1238. In this embodiment, the switched capacitor array 1239 is divided into two variable capacitors, with one variable capacitor to the left of inductor 1238 in FIG. 12B and the second variable capacitor to the right of inductor 1238 in FIG. 12B. The current clamp includes rectifier module 1242 and power converter 1260, in this embodiment. Rectifier module 1242 includes four diodes in a full-bridge configuration, analogous to the rectifier modules of FIGS. 10C, 10D, and 12A, in this embodiment. Rectifier module 1242 is connected to power converter 1260. Power converter 1260 is configured to deliver recovered power to a single-phase AC utility supply, analogous to the power converter of FIG. 11E, and is coupled to AC utility supply 1266 (e.g., an AC power grid connection), to deliver recovered power to the single phase AC utility supply 1266, in this embodiment. Other embodiments of rectifier module and power converter may be used in other embodiments of a match network with current clamping and power recovery.

The current clamp comprising rectifier module 1242 and power converter 1260 protects components in the protected branch 1237 and protected return branch 1240 such as the two capacitors shown in thick lines and inductor 1241 from overcurrent events or current component outside of the current component limit imposed by the current clamp, as the protected devices of the current clamp, analogously as described above with respect to protected device 111 in the embodiment of FIG. 1C. That is, the current clamp comprising rectifier module 1242 and power converter 1260 may protect inductor 1241 as its protected device in match network 1230. In addition to protecting inductor 1241, limiting current in the protected branch 1237 may afford protection to other components in the match network. For example, limiting current in protected branch 1237 may protect switched capacitor array 1239 from experiencing overvoltage conditions.

Without the current clamp, during operation of the circuit sudden changes in the characteristics of RF load 1248, which may be a plasma load, could cause overcurrent conditions in the protected branch 1237 and return branch 1240. Return branch 1240 is configured with a capacitor and an inductor coupled in series along return branch 1240, in this embodiment, as shown in FIG. 12B. Power converter 1260 may include input inductors 1262 and 1264. Controller 1268 of power converter 1260 operates power converter 1260 to maintain a constant current in the controlled current branch 1254 and controlled current return branch 1252, that is equal to or less than the desired current clamping limit, or other current component limit, in various embodiments. Controller 1268 also controls the circuitry of power converter 1260 to transfer the excess power from current clamping to a single phase AC utility supply 1266 which acts as a power sink, in this embodiment. Rectifier module 1242 and power converter 1260 of match network 1230, in accordance with the embodiment of FIG. 12B and various further embodiments, thus provide effective current clamping with useful power recovery for a match network.

Match network 1230 may thus be configured to respond to a current component reaching a current component limit by diverting power to a power converter, thereby limiting the current component in the match network, and the power converter may be configured to output at least a portion of the power to a power sink. A RF generator may apply power to a match network connecting the RF generator to a load; the match network may respond to a current component of a current in the match network reaching a current component limit by diverting power from the match network via a rectifier module to a power converter, thereby limiting the current component in the match network; and output the power from the power converter to a power sink, in various embodiments.

In additional embodiments, a generator with voltage component clamping and power recovery as in FIG. 4A or current component clamping and power recovery as in FIG. 12A, or having both voltage component clamping and current component clamping, may be combined or integrated with a match network with voltage component clamping as in FIG. 4B or current component clamping and power recovery as in FIG. 12B or having both voltage component clamping and current component clamping, and integrated into a single system or device in some embodiments, with various levels of integration, analogously to how a generator with voltage component clamping and power recovery as in FIG. 4A may be combined or integrated with a match network with voltage component clamping and power recovery as in FIG. 4B, as in the integrated generator and match network with voltage component clamping and power recovery as in FIG. 4C. In general, an integrated generator and match network may include both voltage and current clamping at various locations in the integrated system, in various examples. In various embodiments, an integrated generator plus match network with current component or voltage component clamping or both and power recovery may have separate, dedicated power converters, or a single integrated power converter that may be configured to connect to separate rectifier modules integrated with both the generator and the match network and to convert power from multiple rectifier modules for output in useful form to a single power sink.

Figure 13A:
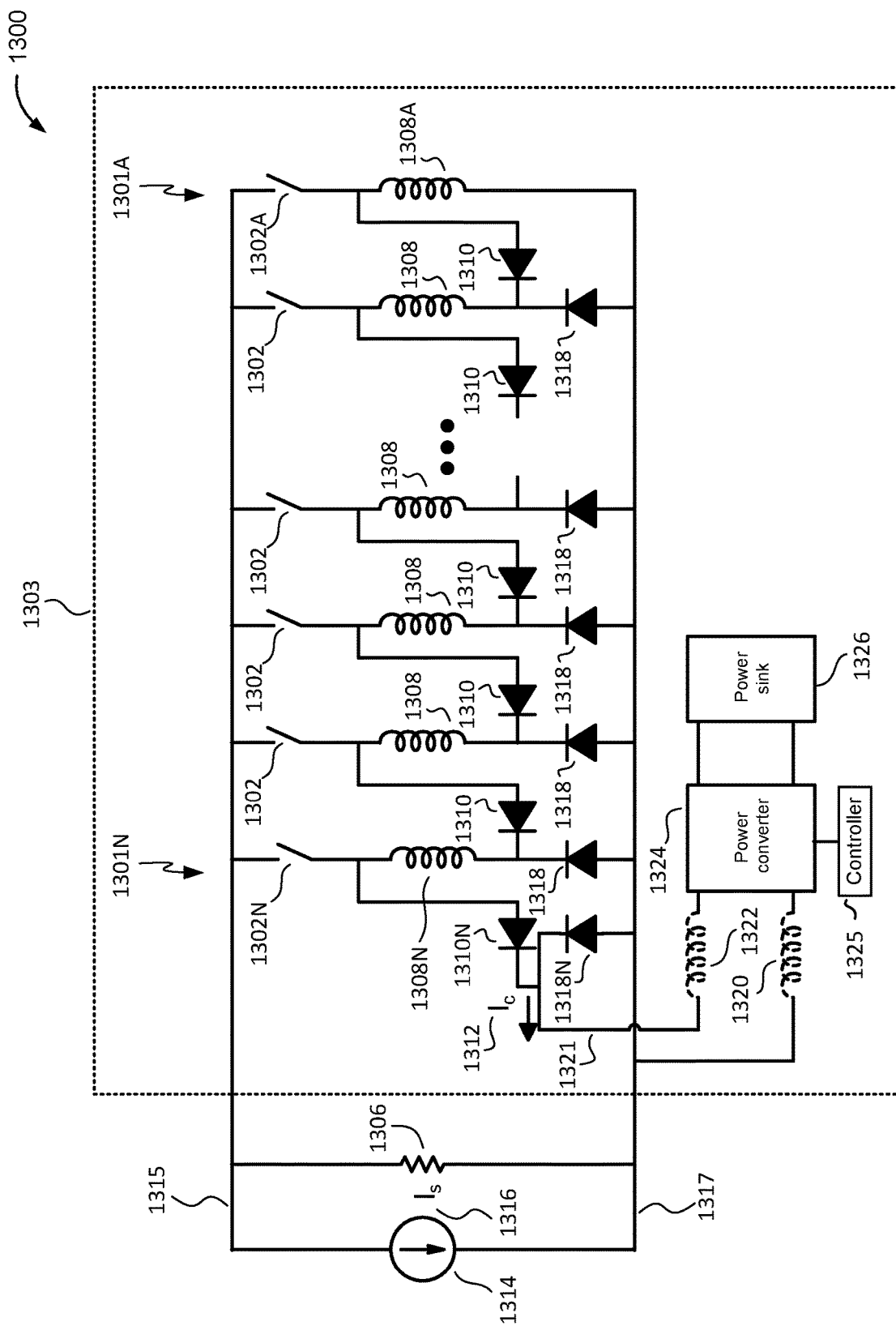
FIG. 13A illustrates an example implementation of current clamps with power recovery in a parallel switch circuit according to one embodiment of the present disclosure.

FIG. 13A shows an implementation of a generator 1300 incorporating current clamping with power recovery in a parallel switch circuit 1303, according to an embodiment of the present disclosure. In FIG. 13A, the parallel switch circuit 1303 of generator 1300 includes several switches 1302 connected in parallel between a first common node 1315 and a second common node 1317. Generator 1300 is powered by a current source 1314 delivering a source current $I_s$ 1316. In this embodiment a load 1306 is disposed parallel to the switch modules between first and second common nodes 1315, 1317. The load 1306 drawn as a resistor may also be any other type of load, such as a plasma load, for example. Any number of local switch modules 1301 may be included in the switch circuit 1303 of generator 1300, as indicated by the ellipsis in the center-right of the switch circuit as shown in FIG. 13A. In other embodiments, switch circuit 1303 of generator 1300 may include fewer local switch modules than are depicted in FIG. 13A, or any number of two or more local switch modules, including a first switch module 1301A, a last switch module 1301N, and any number of intermediate switch modules 1301 (not individually labeled) disposed in parallel between first switch module 1301A and last switch module 1301N. Each respective switch 1302 is associated with local circuitry components that together form a local switch module; these components may include a respective switch 1302 a local inductor 1308, a local bypass diode 1318, and a local rectifier 1310. A first node of each switch 1302 connects to the first common node. A first node of a respective rectifier local to the respective switch 1302—in this case a single respective local rectifier diode 1310—connects to a second node of the respective switch and a second node of the rectifier connects to a first node of a respective local bypass diode 1318. A second node of each respective bypass diode 1318 connects to the second common node 1317. The bypass diodes 1318 and rectifier diodes 1310 are oriented so that the current through each switch 1302 flows from anode to cathode through the bypass diodes 1318 and from cathode to anode through at least one diode in the local rectifier 1310 as long as the net current through the rectifier diode is positive from anode to cathode.

In the first switch module 1301A (first in order from right to left in the depiction of FIG. 13A), the local inductor 1308A is coupled directly between the second node of the local switch 1302A and the second common node 1317; in each of the other local switch modules, the local inductor 1308 is coupled between the second node of the local switch 1302 and the second terminal of the rectifier diode 1310 (or other rectifier) associated with the prior switch 1302, i.e. the rectifier diode 1310 to the lower right of the respective local inductor 1308 in the depiction of FIG. 13A. In the last switch module 1301N (last in order from right to left in the depiction of FIG. 13A), the second terminal of the local rectifier, rectifier diode 1310N is connected to power converter 1324 via a controlled current branch 1321, which forms one of the inputs of the power converter 1324, while the other input to power converter 1324 is connected to second common node 1317. Controlled current branch 1321 of FIG. 13A may be analogous to controlled current branch 912 of FIG. 9, in that power converter 1324 may directly impose a current limit on controlled current branch 1321, and thereby impose a current limit on the current through each individual switch 1302.

Thus, in each respective switch module of the switch modules other than the last switch module 1301N, the rectifier, rectifier diode 1310, is coupled to a first node between the switch 1302 and the inductor 1308 of the respective switch module, and to a second node between the bypass diode 1318 of the switch module being discussed and the inductor 1308 of a subsequent switch module (i.e., of the switch module to the left of rectifier diode 1310 as shown in FIG. 13A.) In the last switch module 1301N, the rectifier, rectifier diode 1310N, is coupled to a first node between the switch 1302N and the inductor 1308N of the last switch module 1301N, and to a second node between the bypass diode 1318N of the last switch module, and the controlled current branch 1321 and power converter 1324, wherein power converter 1324 is also connected to second common node 1317. In each respective switch module of the switch modules in this embodiment, the rectifier comprises a rectifier diode 1310, and the rectifier diode 1310 is a first diode, and the respective switch module further comprises a second diode, bypass diode 1318, coupled in series between the local inductor 1308 of the subsequent switch module and the second common node 1317 except for the last switch module where the bypass diode 1318N is coupled in series between the junction of the rectifier diode 1310N and the controlled current branch 1321 and the second common node 1317. The inductor 1308 and the rectifier, i.e., rectifier diode 1310, of the respective switch module locally contribute to limiting the current or other current component of the local switch module to no higher than the current component limit.

During the time that the switches are open, current 1312 flows in a loop through inductors 1308, rectifier diodes 1310, and optional inductor 1322 (in embodiments in which it is included) to power converter 1324, and from power converter 1324 through optional inductor 1320 (in embodiments in which it is included). During time that the switches are open, power converter 1324 maintains the current in this loop at or below the desired current clamping level by directing any excess power to a power sink 1326. Power converter 1324 may be coupled to and controlled by controller 1325. The power sink 1326 may be a DC rail, an AC utility supply, or the current source 1314 supplying power to the circuit (i.e., instead of a separate power sink 1326 as depicted in FIG. 13A, the output nodes of power converter 1324 route to current source 1314, configured to supply power to current source 1314, in this example embodiment).

When switches 1302 close, any one of switches 1302 can draw current through its corresponding local rectifier 1310 and bypass diode 1318 up to a level that had been flowing in inductors 1308 just prior to the respective switch 1302 closing; but as soon as the current in a particular switch 1302 would otherwise exceed this level, the net current of the corresponding rectifier diode 1310 just left of the particular switch 1302 as shown in FIG. 13A drops to zero, and any further current increase through the particular switch 1302 is forced to go through the respective local inductor 1308 in series with the particular switch 1302. In embodiments in which inductor 1308 is suitably large, this may dramatically inhibit the ability of the current through the particular switch 1302 from increasing significantly above the level of current in the respective local inductor 1308 at the moment that the respective switch 1302 closed, which should have been governed to at or below the applicable current component clamping limit by power converter 1324. The architecture of the switch modules of the switch circuit, including inductors 1308 and rectifier diodes 1310 or other comparable rectifiers, may thus locally contribute to limiting the current or other current component of each local switch in the switch circuit to no higher than the current component clamping limit set by power converter 1324. Power converter 1324 is configured to keep its input current between zero and a desired clamping current by diverting power to power sink 1326 whenever the input current of power converter 1324 would otherwise exceed the desired clamping current, and the rest of the switch circuit 1303 of generator 1300 may help propagate this enforcement of current component clamping limit throughout the rest of the switch circuit 1303 of generator 1300. Power converter 1324 may thereby impose current clamping, with power recovery, on every switch 1302 of switch circuit 1303 of generator 1300, and the switch circuit 1303 of generator 1300 may contribute to maintaining that current clamping limit on every switch 1302 of generator 1300 and on generator 1300, with power recovery. Under most circumstances only one or a few of the switches 1302 will have a current limit imposed and any further increase in current through the switch circuit will be through increasing the current through switches that are not at the current limit, except for a slow increase in current through the inductors 1308 corresponding to the switches that are in a current limit. If the total current through the switch circuit 1303 keeps increasing, eventually all the switches 1302 will be in a current limit and the total current through the switch circuit 1303 will be limited to the product of the number of the switches and the current limit imposed on each switch module. In this state, total current through the switch circuit 1303 will slowly increase as the current through the inductors 1308 slowly increases.

While power converter 1324 is coupled to second common node 1317 in this embodiment, power converter 1324 may also be coupled to first common current node 1315 in other embodiments. Other embodiments may include a first power converter coupled between the switch modules and the first common node, and a second power converter coupled between the switch modules and the second common node. In these embodiments, both power converters may have outputs connected to a common power sink, or to first and second power sinks. Generator 1300 may thus implement effective current clamping, and power recovery, in accordance with various embodiments.

Generator 1300 may be configured to output current-clamped power to a load 1306 connected between the first common node and the second common node, which may be a load such as a plasma chamber. Generator 1300 may thus power a load while implement effective current clamping and power recovery. In various other embodiments, a generator incorporating current clamping with power recovery in a parallel switch circuit may incorporate any of the current clamping elements, techniques, architectures, embodiments, or technologies described above with reference to other current clamping with power recovery, and circuits and generators comprising current clamping with power recovery, as may be applicable together with a parallel switch circuit.

Generator 1300 may thus include a current source, a switch circuit, and a load, all connected between two common nodes, wherein the generator is configured to output power to the load. The switch circuit may include a plurality of switch modules, connected in parallel between the first and second common nodes, wherein each of the switch modules comprises a switch, a rectifier, and an inductor; and a power converter, connected to the switch modules and to one of the common nodes, and configured to couple to a power sink. The switch circuit may be configured to respond to a current component in the switch circuit reaching a current component limit by diverting power from the power converter to a power sink, thereby limiting the current component in the switch circuit to the current component limit, in various embodiments. Generator 1300 may thus apply a current through a switch circuit that includes a plurality of switch modules and a power converter, wherein the switch modules are connected in parallel between two common nodes, and the power converter is connected to the switch modules and to one of the common current nodes. Generator 1300 may respond to a current component in the switch circuit reaching a current component limit by diverting power from the power converter to a power sink, thereby limiting the current component in the switch circuit to the current component limit, in various embodiments.

In further embodiments, elements and features of any of the systems described above may also be combined to provide for both voltage component clamping and current component clamping in the same system. Various embodiments may include combined voltage and current clamps, RF generators with both voltage component clamping and current component clamping, eV-like generators with both voltage component clamping and current component clamping, series switch circuits with both voltage component clamping and current component clamping, match networks with both voltage component clamping and current component clamping, and other systems with both voltage component clamping and current component clamping, in accordance with various embodiments.

Figure 13B:
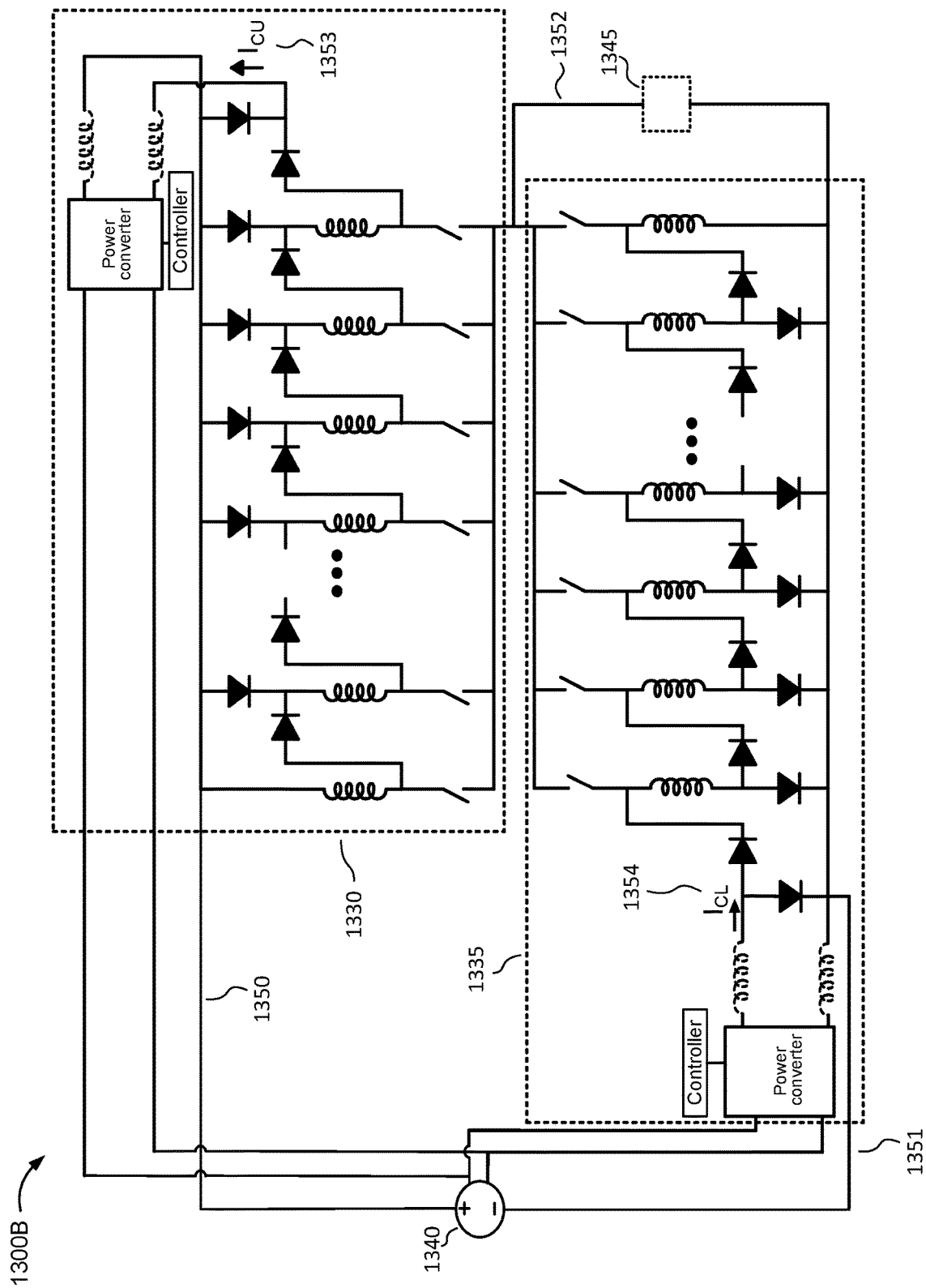
FIG. 13B illustrates a generator that incorporates the use of two parallel switch circuits with current clamps with power recovery in a half-bridge configuration according to an example of the present disclosure.

FIG. 13B illustrates a generator 1300B that incorporates the use of two parallel switch circuits 1330, 1335 with current clamps with power recovery in a half-bridge configuration according to an embodiment of the present disclosure. Switch circuit 1335 may be identical to the switch circuit 1303 described previously and is connected between an output node 1352 and a ground reference node 1351. Switch circuit 1335 may impose a current limit $I_{CL}$ 1354 on every switch module in switch circuit 1335. Switch circuit 1330 is analogous to switch circuit 1335 except that it is turned upside down in relation to switch circuit 1335 and the polarity of the diodes in switch circuit 1330 is reversed compared to those of switch circuit 1335. These changes of switch circuit 1330 relative to switch circuit 1335 may be beneficial in various applications because, with these changes, the input of the power converter of switch 1330 is referenced to the rail, node 1350, which is stable in relation to ground reference node 1351. I.e., rail node 1350 in this application remains at a fixed voltage with respect to the ground reference 1351. Some examples may duplicate switch 1335 and use the circuit of switch 1335 for switch 1330, but in that case the power converter of switch 1330 is referenced to output node 1352 which is not stable with respect to ground reference 1351, which may pose challenges to take into account in implementation of the power converter of switch 1330. With the chosen circuits for switches 1335 and 1330, beneficially the power sinks for the power converters of both switches can be the DC power supply 1340. As depicted in FIG. 13B, the power sink is internal to DC supply 1340, which may for example be a bus voltage such as a rectified AC utility input to DC supply 1340. In other implementations, the power sink may be the output of DC supply 1340, i.e., the outputs of the power converters of switches 1330 and 1335 could also be connected to the rail 1350 and the ground reference 1351. Switch circuit 1330 may impose a current limit $I_{CU}$ 1353 on every switch module in switch 1330. This limit may be different from current limit $I_{CL}$ 1354. A load 1345, which may be a plasma load, may be connected between the output node 1352 and the ground reference node 1351. The load may also be connected between the output node and the rail voltage node 1350 if so desired. Additional circuitry (not shown) such as a DC block, a filter, or a measurement system may be connected between the output node 1352 and the load.

Figure 14:
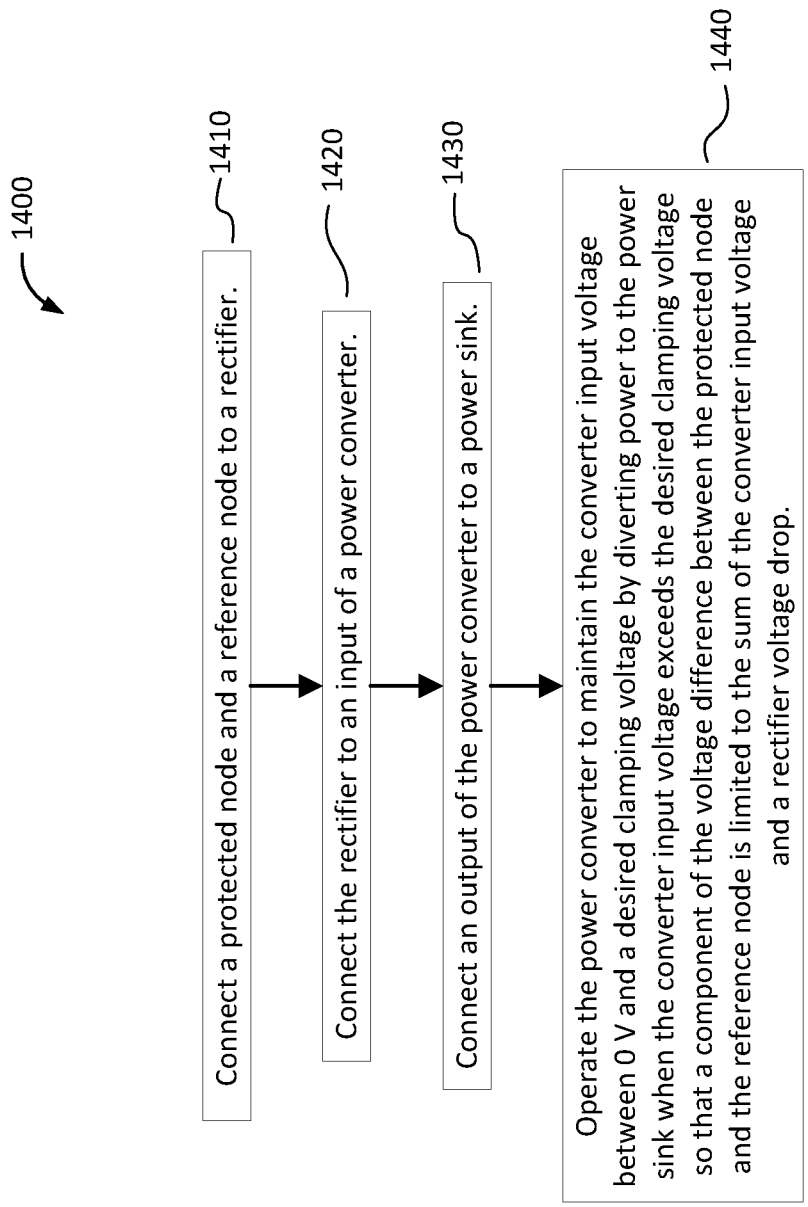
FIG. 14 depicts a flowchart for an example method embodiment of the disclosure.

FIG. 14 depicts a flowchart for an example method 1400, in another embodiment of the present disclosure. Method 1400 includes connecting a protected node and a reference node to a rectifier (1410). Method 1400 further includes connecting the rectifier to an input of a power converter (1420). Method 1400 further includes connecting an output of the power converter to a power sink (1430). Method 1400 further includes operating the power converter to maintain the converter input voltage between zero volts (0 V) and a desired clamping voltage by diverting power to the power sink when the converter input voltage exceeds the desired clamping voltage, so that a component of the voltage difference between the protected node and the reference node is limited to the sum of the converter input voltage and a rectifier voltage drop (1440).

Figure 15:
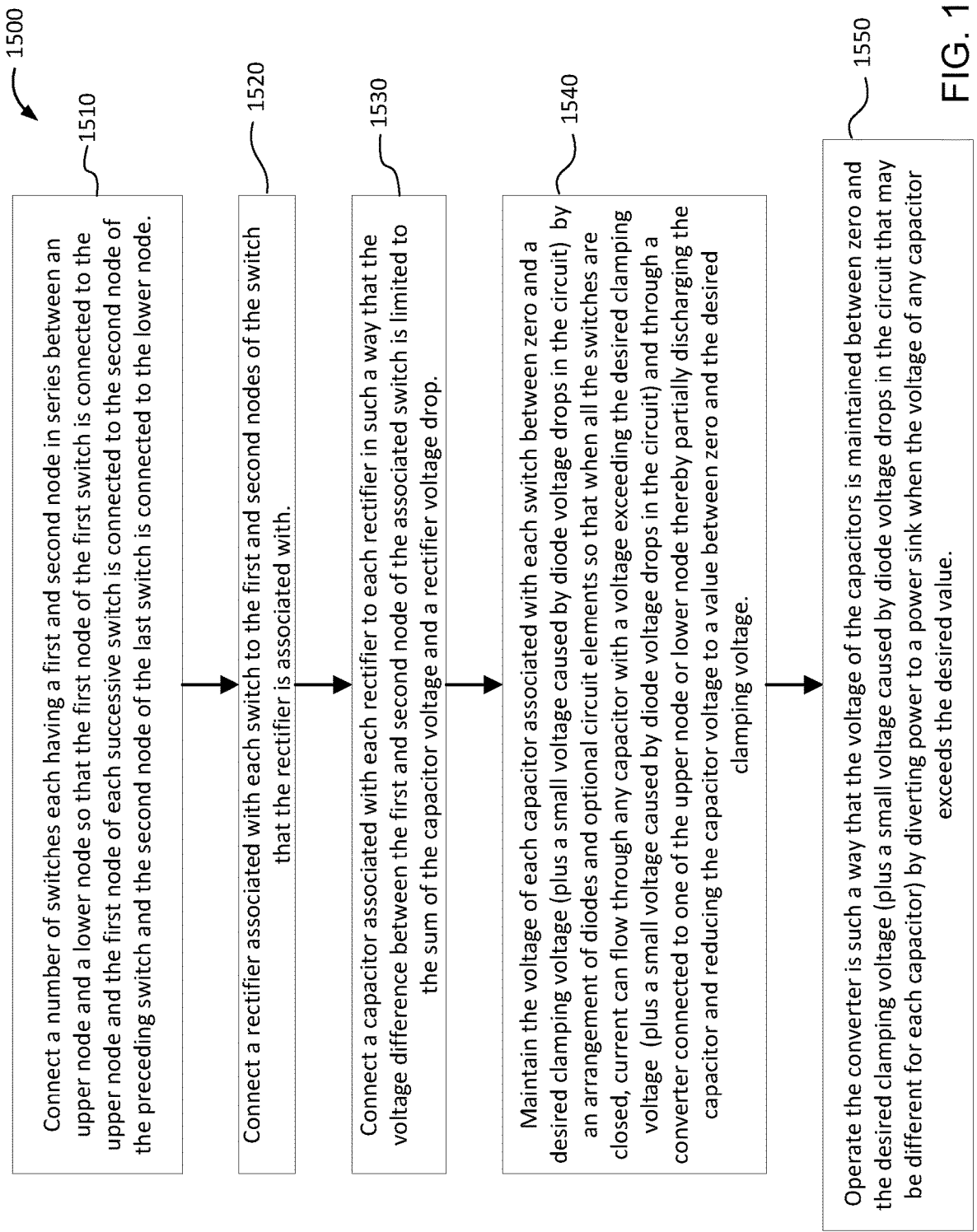
FIG. 15 depicts a flowchart for an example method embodiment of the disclosure.

FIG. 15 depicts a flowchart for an example method 1500, in another embodiment of the present disclosure. Method 1500 includes connecting a number of switches each having a first and second node in series between an upper node and a lower node so that the first node of the first switch is connected to the upper node and the first node of each successive switch is connected to the second node of the preceding switch and the second node of the last switch is connected to the lower node (1510). Method 1500 further includes connecting a rectifier associated with each switch to the first and second nodes of the switch that the rectifier is associated with (1520). Method 1500 further connecting a capacitor associated with each rectifier to each rectifier in such a way that the voltage difference between the first and second node of the associated switch is limited to the sum of the capacitor voltage and a rectifier voltage drop (1530). Method 1500 further includes maintaining the voltage of each capacitor associated with each switch between zero and a desired clamping voltage (plus a small voltage caused by diode voltage drops in the circuit) by an arrangement of diodes and optional circuit elements so that when all the switches are closed, current can flow through any capacitor with a voltage exceeding the desired clamping voltage (plus a small voltage caused by diode voltage drops in the circuit) and through a converter connected to one of the upper node or lower node thereby partially discharging the capacitor and reducing the capacitor voltage to a value between zero and the desired clamping voltage (1540). Method 1500 further includes operating the converter is such a way that the voltage of the capacitors is maintained between zero and the desired clamping voltage (plus a small voltage caused by diode voltage drops in the circuit that may be different for each capacitor) by diverting power to a power sink when the voltage of any capacitor exceeds the desired value (1550).

Figure 16:
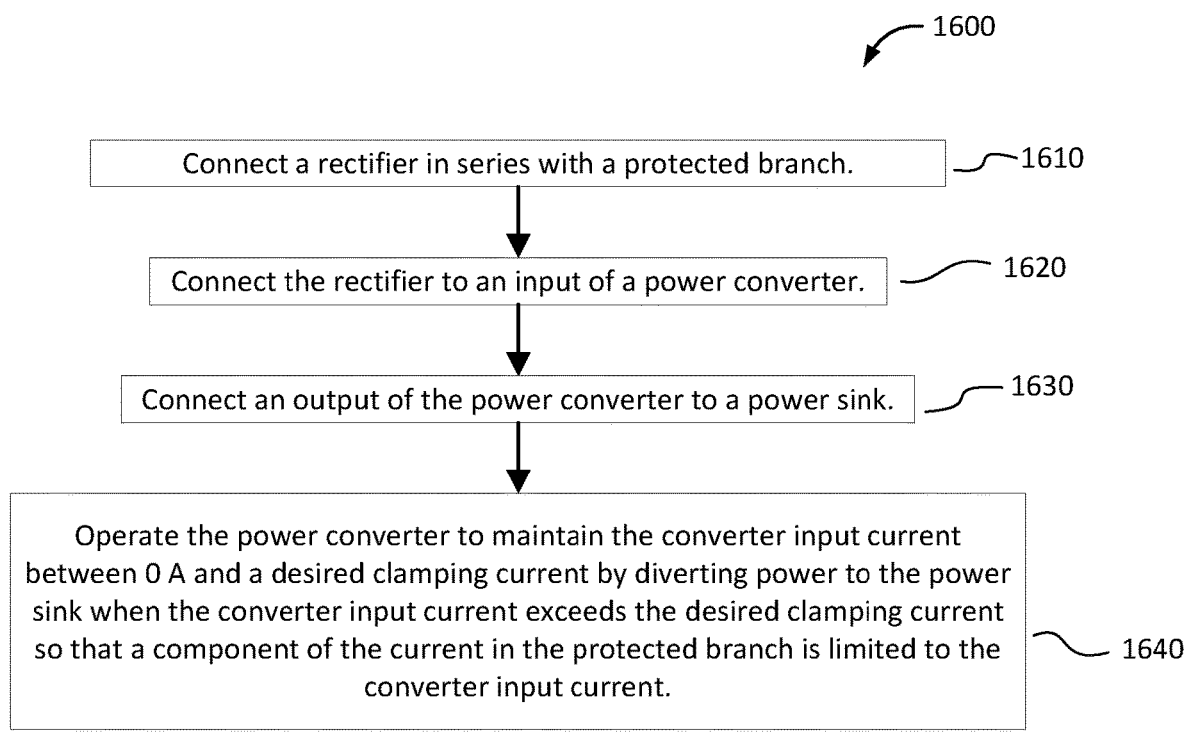
FIG. 16 depicts a flowchart for an example method embodiment of the disclosure.

FIG. 16 depicts a flowchart for an example method 1600, in another embodiment of the present disclosure. Method 1600 includes connecting a rectifier in series with a protected branch (1610). Method 1600 further includes connecting the rectifier to an input of a power converter (1620). Method 1600 further includes connecting an output of the power converter to a power sink (1630). Method 1600 further includes operating the power converter to maintain the converter input current between zero ampere (0 A) and a desired clamping current by diverting power to the power sink when the converter input current exceeds the desired clamping current so that a component of the current in the protected branch is limited to the converter input current (1640).

Figure 17:
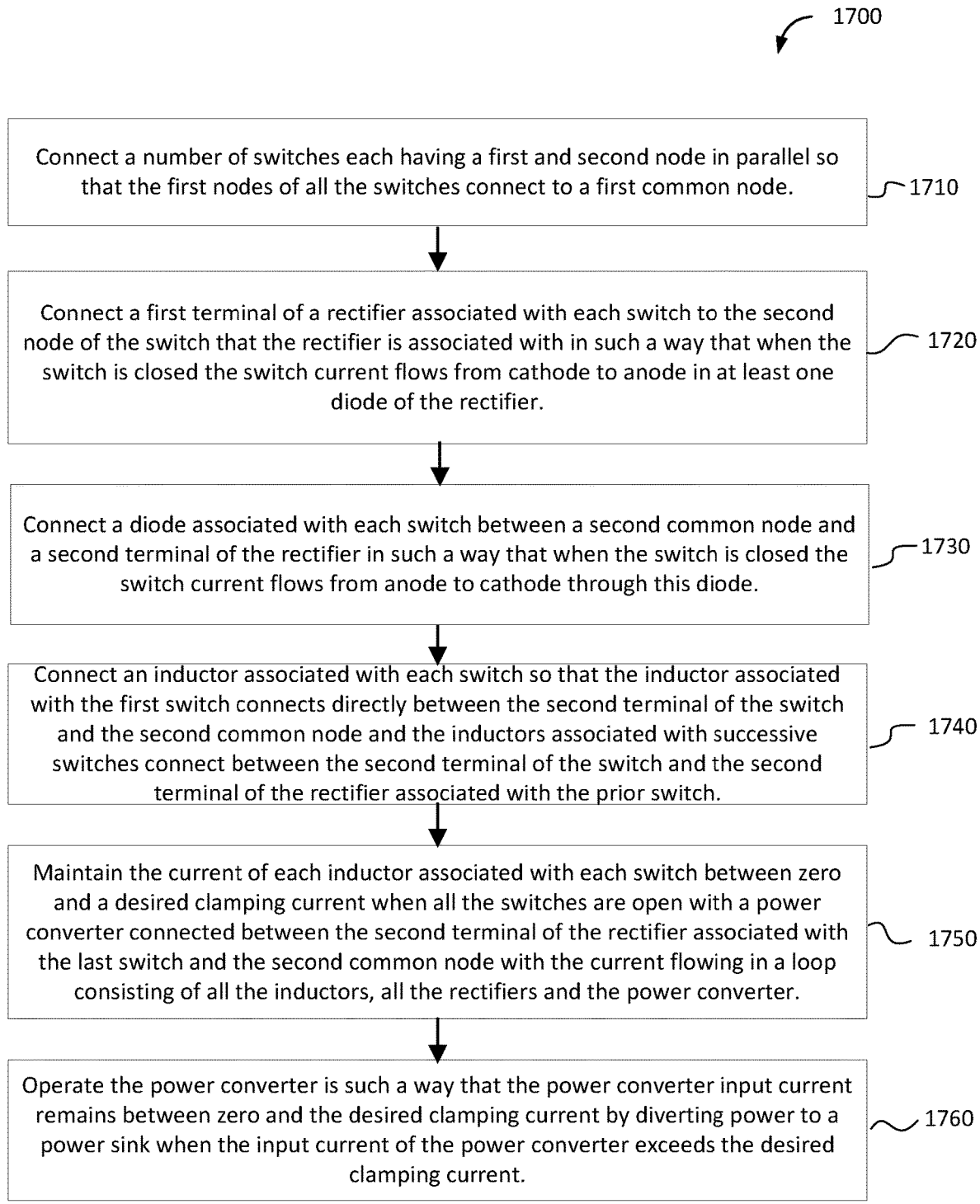
FIG. 17 depicts a flowchart for an example method embodiment of the disclosure.

FIG. 17 depicts a flowchart for an example method 1700, in another embodiment of the present disclosure. Method 1700 includes connecting a number of switches each having a first and second node in parallel so that the first nodes of all the switches connect to a first common node (1710). Method 1700 further includes connecting a first terminal of a rectifier associated with each switch to the second node of the switch that the rectifier is associated with in such a way that when the switch is closed the switch current flows from cathode to anode in at least one diode of the rectifier (1720). Method 1700 further includes connecting a diode associated with each switch between a second common node and a second terminal of the rectifier in such a way that when the switch is closed the switch current flows from anode to cathode through this diode (1730). Method 1700 further includes connecting an inductor associated with each switch so that the inductor associated with the first switch connects directly between the second terminal of the switch and the second common node and the inductors associated with successive switches connect between the second terminal of the switch and the second terminal of the rectifier associated with the prior switch (1740). Method 1700 further includes maintaining the current of each inductor associated with each switch between zero and a desired clamping current when all the switches are open with a power converter connected between the second terminal of the rectifier associated with the last switch and the second common node with the current flowing in a loop consisting of all the inductors, all the rectifiers and the power converter (1750). Method 1700 further includes operating the power converter is such a way that the power converter input current remains between zero and the desired clamping current by diverting power to a power sink when the input current of the power converter exceeds the desired clamping current (1760).

Figure 18:
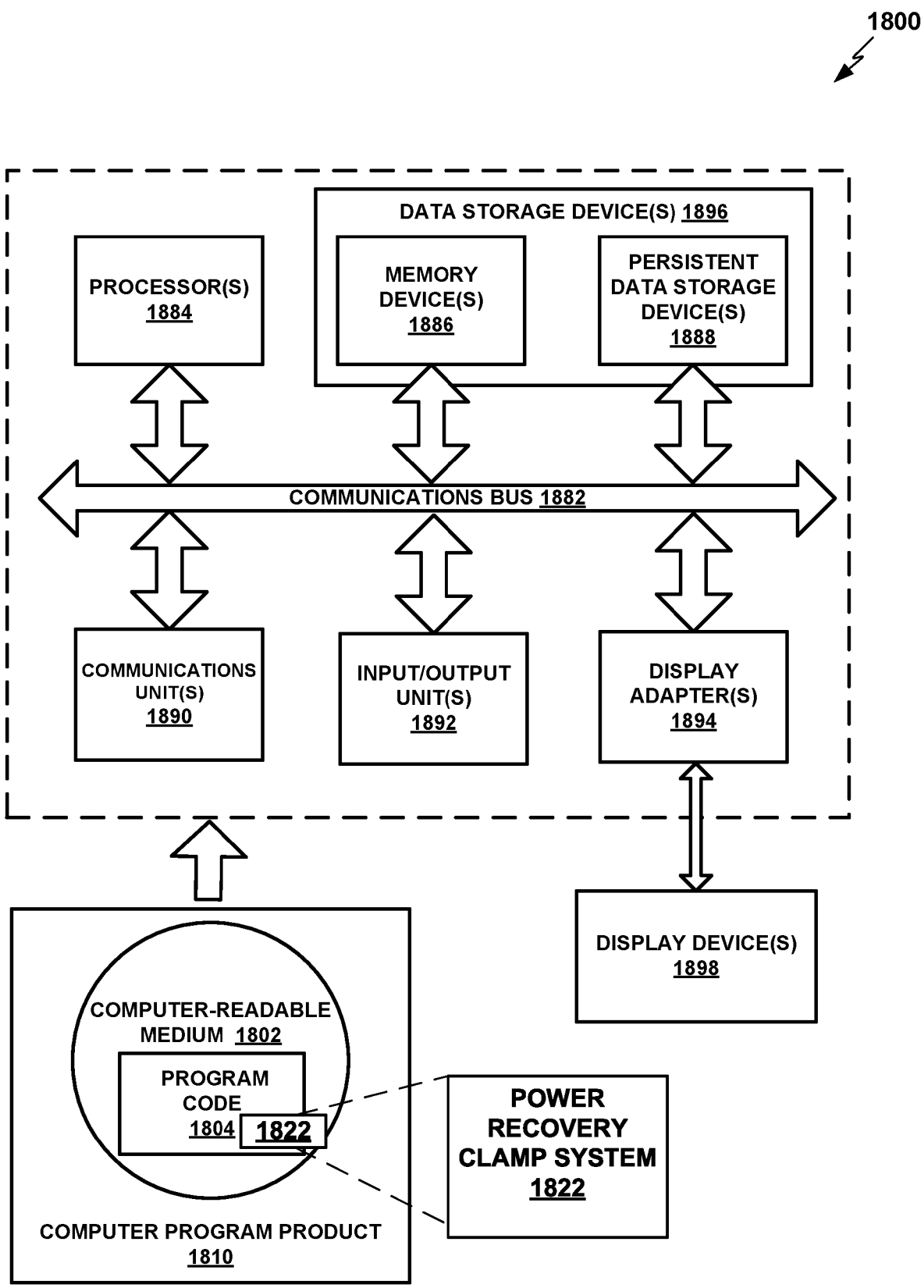
FIG. 18 depicts a block diagram of an example computing system that may control systems and execute methods in some embodiments of the disclosure.

FIG. 18 depicts a block diagram of an example computing system 1800 that may embody, control, or execute any of the various embodiments of voltage clamps, current clamps, generators, matching networks, and other systems, methods, and apparatus disclosed herein, in various embodiments of this disclosure. For example, computing system 1800 may serve as an embodiment of controller 412, controller 450, controller 468, controller 1212, controller 1250, or controller 1268 as depicted in FIGS. 4A, 4B, 12A, and 12B, respectively, and as described above with reference thereto. As further examples, computing system 1800 may perform, execute, or embody any of methods 1400, 1500, 1600, 1700, 2000, 2100, 2200, 2300, 2400, 2500, 2600, or 2700, as depicted in FIGS. 14-17 and 20-27, respectively, and as described above with reference thereto. Computing system 1800 may be a server such as a web server or an application server. Computing system 1800 may also be any server for providing a power recovery clamp application in various examples, including a virtual server that may be run from or incorporate any number of computing devices. A computing device may operate as all or part of a real or virtual server, and may be or incorporate a workstation, server, mainframe computer, notebook or laptop computer, desktop computer, tablet, smartphone, or other programmable data processing apparatus of any kind. Other implementations of a computing system 1800 may include a computer having capabilities or formats other than or beyond those described herein.

In the illustrative example of FIG. 18, computing system 1800 includes communications bus 1882, which provides communications between one or more processor unit 1884, one or more memory device(s) 1886, one or more persistent data storage device(s) 1888, one or more communications unit(s) 1890, and one or more input/output (I/O) unit(s) 1892. Communications bus 1882 may include a dedicated system bus, a general system bus, multiple buses arranged in hierarchical form, any other type of bus, bus network, switch fabric, or other interconnection technology. Communications bus 1882 supports transfer of data, commands, and other information between various subsystems of computing system 1800.

Processor unit 1884 may be a programmable central processing unit (CPU) configured for executing programmed instructions stored in one or more memory device(s) 1886. In another illustrative example, processor unit 1884 may be implemented using one or more heterogeneous processor systems in which a main processor is present with secondary processors on a single chip. In another illustrative example, processor unit 1884 may be a symmetric multi-processor system containing multiple processors of the same type. Processor unit 1884 may be a reduced instruction set computing (RISC) microprocessor, an x86 compatible processor, or any other suitable processor. In various examples, processor unit 1884 may include a multi-core processor, for example. Processor unit 1884 may include multiple processing chips on one die, and/or multiple dies on one package or substrate, for example. Processor unit 1884 may also include one or more levels of integrated cache memory, for example. In various examples, processor unit 1884 may comprise one or more CPUs distributed across one or more locations.

Data storage 1896 includes one or more memory device(s) 1886 and one or more persistent data storage device(s) 1888, which are in communication with processor unit 1884 through communications bus 1882. A memory device 1886 may include one or more random access semiconductor memory (RAM) devices for storing application data, i.e., computer program data, for processing. While memory device 1886 is depicted as a single monolithic block, in various examples, memory device 1886 may be arranged in a hierarchy of caches and in other memory devices, in a single physical location, or distributed across a plurality of physical systems in various forms. While memory device 1886 is depicted physically separated from processor unit 1884 and other elements of computing system 1800, memory device 1886 may refer equivalently to any intermediate or cache memory at any location throughout computing system 1800, including cache memory proximate to or integrated with processor unit 1884 or individual cores of processor unit 1884.

A persistent data storage device 1888 may include one or more hard disc drives, solid state drives, flash drives, rewritable optical disc drives, magnetic tape drives, or any combination of these or other data storage media. Persistent data storage device 1888 may store computer-executable instructions or computer-readable program code for an operating system, application files comprising program code, data structures or data files, and any other type of data. These computer-executable instructions may be loaded from persistent data storage device 1888 into memory device 1886 to be read and executed by processor unit 1884 or other processors. Data storage 1896 may also include any other hardware elements capable of storing information, such as, for example and without limitation, data, program code in functional form, and/or other suitable information, either on a temporary basis and/or a permanent basis.

Persistent data storage device 1888 and memory device 1886 are examples of physical, tangible, non-transitory computer-readable data storage devices. Data storage 1896 may include any of various forms of volatile memory that may require being periodically electrically refreshed to maintain data in memory, while those skilled in the art will recognize that this also constitutes an example of a physical, tangible, non-transitory computer-readable data storage device. Executable instructions may be stored on a non-transitory medium when program code is loaded, stored, relayed, buffered, or cached on a non-transitory physical medium or device, including if only for only a short duration or only in a volatile memory format.

Processor unit 1884 can also be suitably programmed to read, load, and execute computer-executable instructions or computer-readable program code for a power recovery clamp system 1822, as described in greater detail above. This program code may be stored on memory device 1886, persistent data storage device 1888, or elsewhere in computing system 1800. This program code may also take the form of executable program code 1804 stored on computer-readable medium 1802 comprised in computer program product 1810, and may be transferred or communicated, through any of a variety of local or remote means, from computer program product 1810 to computing system 1800 to be enabled to be executed by processor unit 1884, as further explained below.

The operating system may provide functions such as device interface management, memory management, and multiple task management. The operating system can be a Unix-based operating system, a non-Unix based operating system, a network operating system, a real-time operating system (RTOS), or any other suitable operating system. Processor unit 1884 can be suitably programmed to read, load, and execute instructions of the operating system.

A communications unit 1890, in this example, provides for communications with other computing or communications systems or devices. Communications unit 1890 may provide communications through the use of physical and/or wireless communications links. Communications unit 1890 may include a network interface card for interfacing with a local area network (LAN), an Ethernet adapter, a Token Ring adapter, a modem for connecting to a transmission system such as a telephone line, or any other type of communication interface. Communications unit 1890 may be used for operationally connecting many types of peripheral computing devices to computing system 1800, such as printers, bus adapters, and other computers. Communications unit 1890 may be implemented as an expansion card or be built into a motherboard, for example.

An input/output unit 1892 can support devices suited for input and output of data with other devices that may be connected to computing system 1800, such as keyboard, a mouse or other pointer, a touchscreen interface, an interface for a printer or any other peripheral device, a removable magnetic or optical disc drive (including CD-ROM, DVD-ROM, or Blu-Ray), a universal serial bus (USB) receptacle, or any other type of input and/or output device. Input/output unit 1892 may also include any type of interface for video output in any type of video output protocol and any type of monitor or other video display technology, in various examples. Some of these examples may overlap with each other, or with example components of communications unit 1890 or data storage 1896. Input/output unit 1892 may also include appropriate device drivers for any type of external device, or such device drivers may reside elsewhere on computing system 1800 as appropriate.

Computing system 1800 also includes a display adapter 1894 in this illustrative example, which provides one or more connections for one or more display devices, such as display device 1898, which may include any of a variety of types of display devices. Some of these examples may overlap with example components of communications unit 1890 or input/output unit 1892. Input/output unit 1892 may also include appropriate device drivers for any type of external device, or such device drivers may reside elsewhere on computing system 1800 as appropriate. Display adapter 1894 may include one or more video cards, one or more graphics processing units (GPUs), one or more video-capable connection ports, or any other type of data connector capable of communicating video data, in various examples. Display device 1898 may be any kind of video display device, such as a monitor, a television, or a projector, in various examples.

Input/output unit 1892 may include a drive, socket, or outlet for receiving computer program product 1810, which comprises a tangible, non-transitory computer-readable medium 1802 having executable program code 1804 stored thereon. For example, computer program product 1810 may be a CD-ROM, a DVD-ROM, a Blu-Ray disc, a magnetic disc, a USB stick, a flash drive, or an external hard disc drive, as illustrative examples, or any other suitable data storage technology.

Computer-readable medium 1802 may include any type of optical, magnetic, or other physical medium that physically encodes executable program code 1804 as a binary series of different physical states in each unit of memory that, when read by computing system 1800, induces a physical signal that is read by processor unit 1884 that corresponds to the physical states of the basic data storage elements of computer-readable medium 1802, and that induces corresponding changes to the physical state of processor unit 1884. That physical program code signal may be modeled or conceptualized as computer-readable instructions at any of various levels of abstraction, such as a high-level programming language, assembly language, or machine language, but ultimately constitutes a series of electrical and/or magnetic interactions that physically induce a change in the physical state of processor unit 1884, thereby physically reconfiguring processor unit 1884 and causing or configuring processor unit 1884 to generate physical outputs that correspond to the computer-executable instructions, in a way that causes computing system 1800 to physically assume new capabilities that it did not have until its physical state was changed by loading the executable instructions comprised in executable program code 1804.

In some illustrative examples, executable program code 1804 may be downloaded over a network to data storage 1896 from another device or computer system for use within computing system 1800. Executable program code 1804 comprising computer-executable instructions may be communicated or transferred to computing system 1800 from computer-readable medium 1802 through a hard-line or wireless communications link to communications unit 1890 and/or through a connection to input/output unit 1892. Computer-readable medium 1802 comprising executable program code 1804 may be located at a separate or remote location from computing system 1800, and may be located anywhere, including at any remote geographical location anywhere in the world or in orbit, and may relay executable program code 1804 to computing system 1800 over any type of one or more communication links, such as the Internet and/or other packet data networks. Executable program code 1804 may be transmitted over a wireless Internet connection, or over a shorter-range direct wireless connection such as wireless LAN, Bluetooth™, Wi-Fi™, or an infrared connection, for example. Any other wireless or remote communication protocol may also be used in other implementations.

The communications link and/or the connection may include wired and/or wireless connections in various illustrative examples, and executable program code 1804 may be transmitted from a source computer-readable medium 1802 over non-tangible media, such as communications links or wireless transmissions containing the executable program code 1804. Executable program code 1804 may be more or less temporarily or durably stored on any number of intermediate tangible, physical computer-readable devices and media, such as any number of physical buffers, caches, main memory, or data storage components of servers, gateways, network nodes, mobility management entities, or other network assets, en route from its original source medium to computing system 1800.

Various example embodiments of this disclosure may be in the form of a system, a method, and/or a computer program product. The computer program product may include a computer readable storage medium (or media) having computer readable program instructions thereon for causing a processor to carry out aspects of embodiments of this disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including object-oriented programming languages such as C++ or Java; imperative programming languages, such as C; a specialized language such as hardware description language (HDL); Lisp programming languages, such as Common Lisp, Racket, or Clojure; other functional programming languages, such as Haskell or Erlang; or multi-paradigm languages, such as Python or Rust. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider (ISP)). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of embodiments of this disclosure.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions, acts, or steps specified in the flowchart and/or block diagram block or blocks.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur in a different order than that noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, may also be implemented by special purpose hardware-based systems that perform the specified functions or acts or carry out combinations of special purpose hardware and computer instructions.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 19:
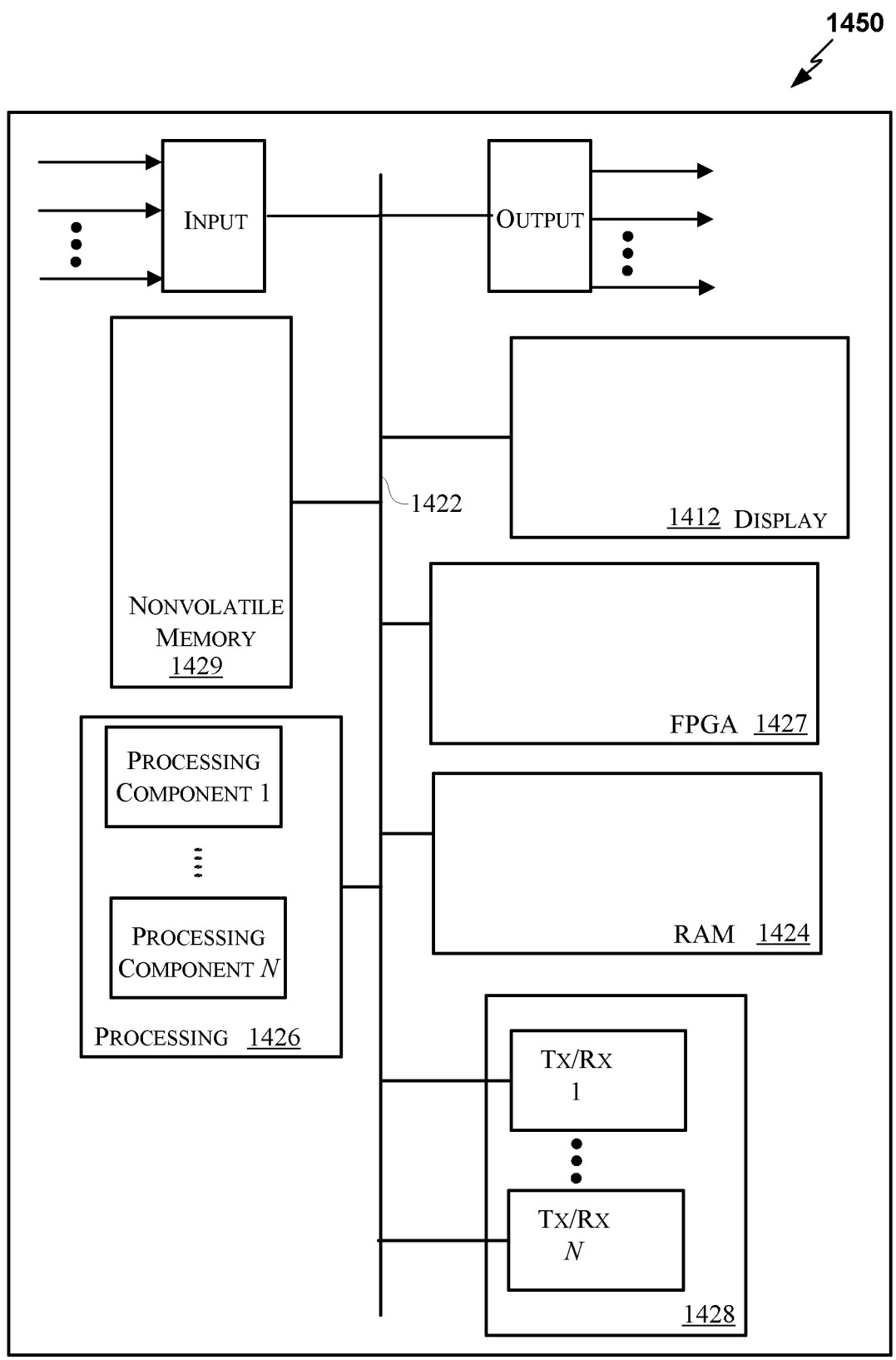
FIG. 19 depicts a block diagram of an example computing system that may control systems and execute methods in some embodiments of the disclosure.
Figure 26:
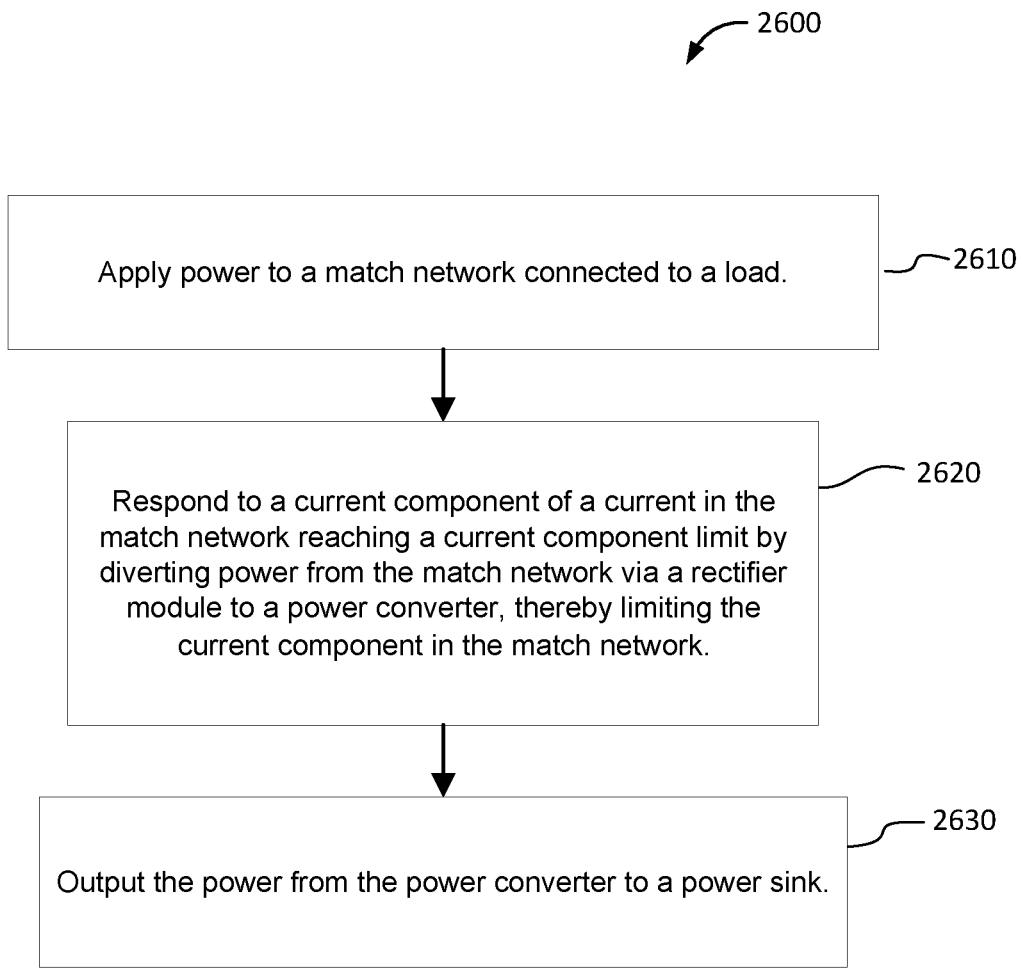
FIG. 26 depicts a flowchart for an example method embodiment of the disclosure.

FIG. 19 depicts a conceptual block diagram of example physical components of a system 1450 that may perform, execute, or embody one or more aspects of various embodiments of voltage clamps, current clamps, generators, matching networks, and other systems, methods, and apparatus disclosed herein. As shown, in this embodiment a display 1412 and nonvolatile memory 1429 are coupled to a bus 1422 that is also coupled to random access memory ("RAM") 1424, a processing portion (which includes N processing components) 1426, a field programmable gate array (FPGA) 1427, and a transceiver component 1428 that includes N transceivers. Although the components depicted in FIG. 26 represent physical components, FIG. 26 is not intended to be a detailed hardware diagram; thus, many of the components depicted in FIG. 26 may be realized by common constructs or distributed among additional physical components. Moreover, it is contemplated that other existing and yet-to-be developed physical components and architectures may be utilized to implement the functional components described with reference to FIG. 26.

A display 1412 generally operates to provide a user interface for a user, and in several implementations, the display 1412 is realized by a touchscreen display. For example, display 1412 can be used to control and interact with the components described herein. In general, the nonvolatile memory 1429 is non-transitory memory that functions to store (e.g., persistently store) data and machine readable (e.g., processor executable) code (including executable code that is associated with effectuating the methods described herein). In some embodiments, for example, the nonvolatile memory 1429 includes bootloader code, operating system code, file system code, and non-transitory processor-executable code to facilitate the execution of the methods described herein.

In many implementations, the nonvolatile memory 1429 is realized by flash memory (e.g., NAND or ONENAND memory), but it is contemplated that other memory types may be utilized as well. Although it may be possible to execute the code from the nonvolatile memory 1429, the executable code in the nonvolatile memory is typically loaded into RAM 1424 and executed by one or more of the N processing components in the processing portion 1426.

In operation, the N processing components in connection with RAM 1424 may generally operate to execute the instructions stored in nonvolatile memory 1429 to realize the functionality of the power recovery circuits described herein. For example, non-transitory processor-executable instructions to effectuate the methods described herein may be persistently stored in nonvolatile memory 1429 and executed by the N processing components in connection with RAM 1424. As one of ordinary skill in the art will appreciate, the processing portion 1426 may include a video processor, digital signal processor (DSP), graphics processing unit (GPU), and other processing components.

In addition, or in the alternative, the field programmable gate array (FPGA) 1427 may be configured to effectuate one or more aspects of the methodologies described herein. For example, non-transitory FPGA-configuration-instructions may be persistently stored in nonvolatile memory 1429 and accessed by the FPGA 1427 (e.g., during boot up) to configure the FPGA 1427.

The input component may operate to receive signals (e.g., from a voltage amplitude measurement circuit and/or the current amplitude measurement circuit associated with a controller such as controllers 162, 412, 450, 468, 1212, 1250, 1268 as described above) that are indicative of voltage and/or current. The output component generally operates to provide one or more analog or digital signals (e.g., to prompt drive signals to switch(es) in power converter 118, or other switches or circuitry of voltage clamp systems or current clamp systems as described herein) to effectuate operational aspects of a voltage clamp or current clamp with power recovery, or other system described herein.

The depicted transceiver component 1428 includes N transceiver chains, which may be used for communicating with external devices (e.g., external controllers) via wireless or wireline networks. Each of the N transceiver chains may represent a transceiver associated with a particular communication scheme (e.g., WiFi, Ethernet, Profibus, etc.).

Figure 20:
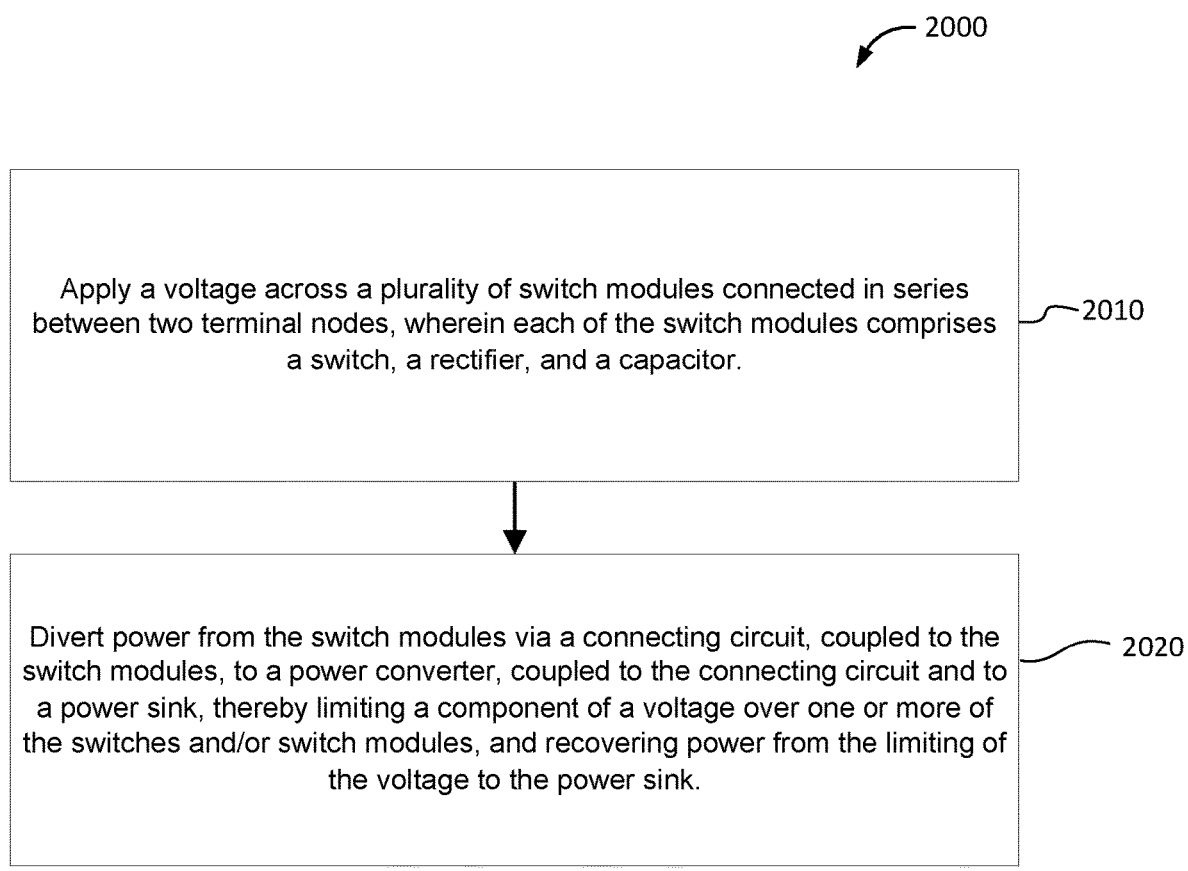
FIG. 20 depicts a flowchart for an example method embodiment of the disclosure.

FIG. 20 depicts a flowchart for an example method 2000, in another embodiment of the present disclosure. Method 2000 includes applying a voltage across a plurality of switch modules connected in series between two terminal nodes, wherein each of the switch modules comprises a switch, a rectifier, and a capacitor (2010). Method 2000 further includes diverting power from the switch modules via a connecting circuit, coupled to the switch modules, to a power converter, coupled to the connecting circuit and to a power sink, thereby limiting a component of a voltage over one or more of the switches and/or switch modules, and recovering power from the limiting of the voltage to the power sink (2020). The power converter may also be coupled to one of the terminal nodes, in some examples.

Figure 21:
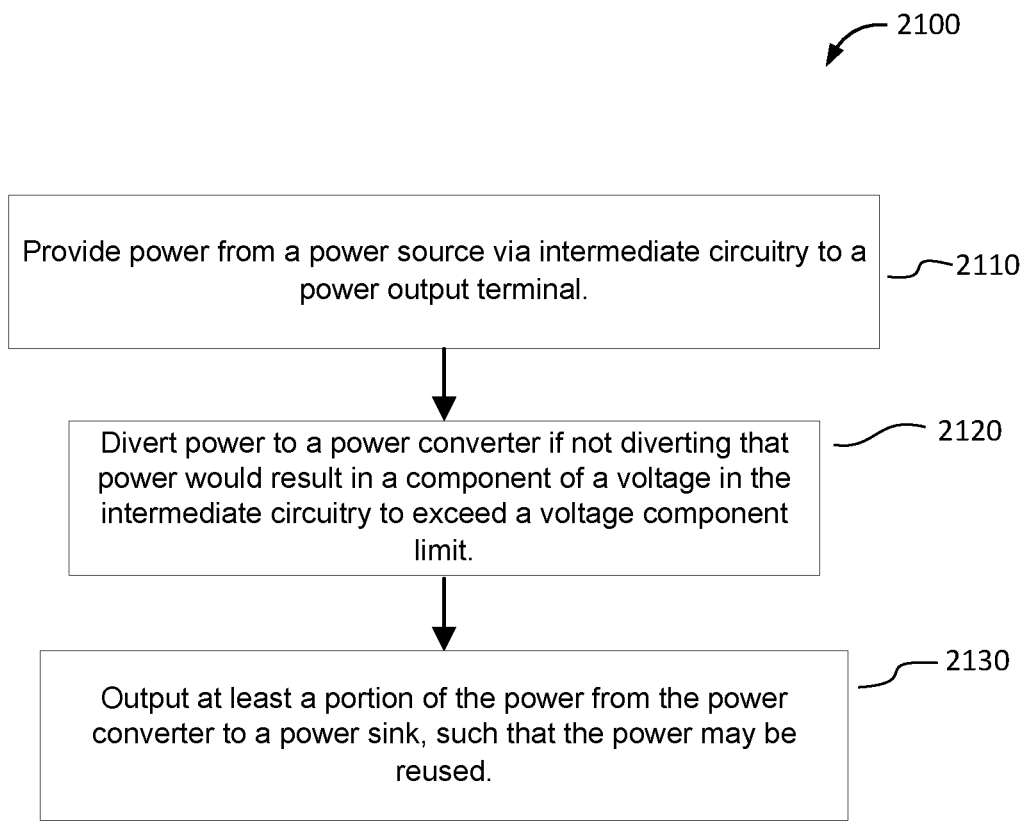
FIG. 21 depicts a flowchart for an example method embodiment of the disclosure.

FIG. 21 depicts a flowchart for an example method 2100, in another embodiment of the present disclosure. Method 2100 includes providing power from a power source via intermediate circuitry to a power output terminal (2110). Method 2100 further includes diverting power to a power converter if not diverting that power would result in a component of a voltage in the intermediate circuitry to exceed a voltage component limit (2120). Method 2100 further includes outputting at least a portion of the power from the power converter to a power sink, such that the power may be reused (2130). Method 2100 may include other steps or variations in various other embodiments.

Figure 22:
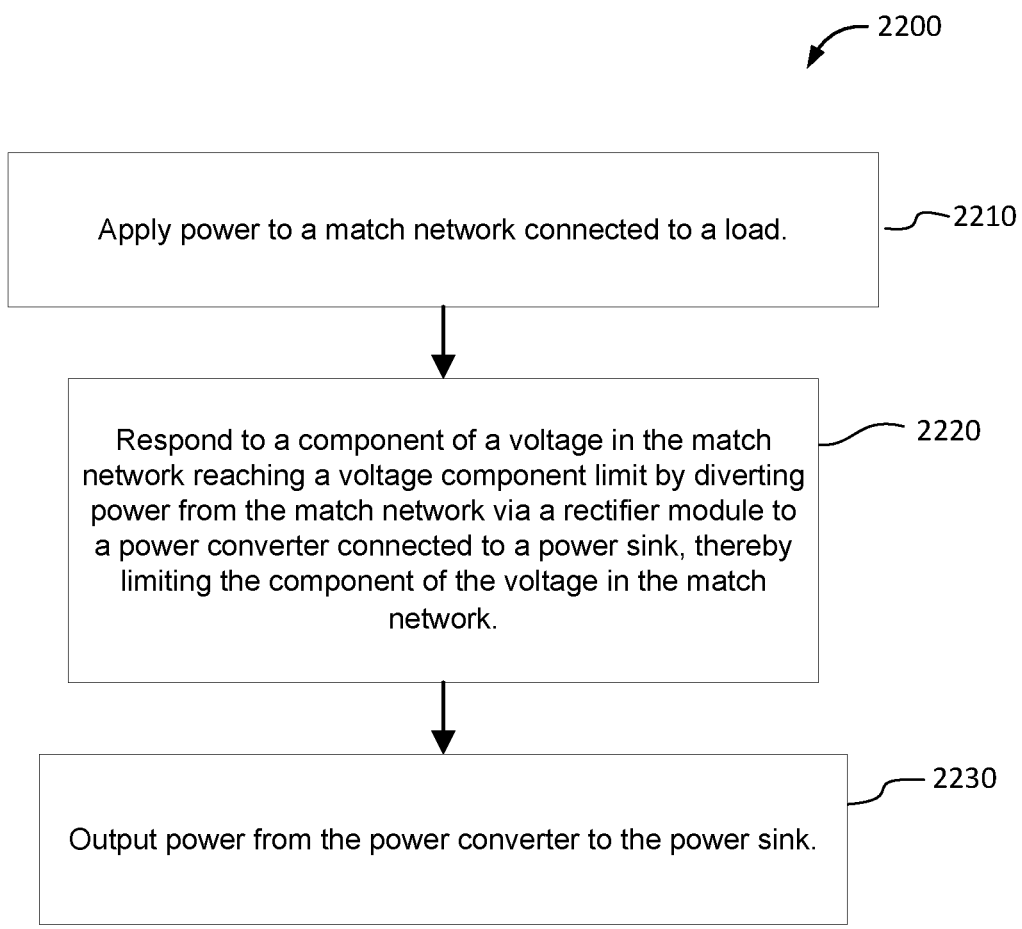
FIG. 22 depicts a flowchart for an example method embodiment of the disclosure.

FIG. 22 depicts a flowchart for an example method 2200, in another embodiment of the present disclosure. Method 2200 includes applying power to a match network connected to a load (2210). Method 2200 further includes responding to a component of a voltage in the match network reaching a voltage component limit by diverting power from the match network via a rectifier module to a power converter connected to a power sink, thereby limiting the component of the voltage in the match network (2220). Method 2200 further includes outputting the power from the power converter to the power sink (2230). Method 2200 may include other steps or variations in various other embodiments.

Figure 23:
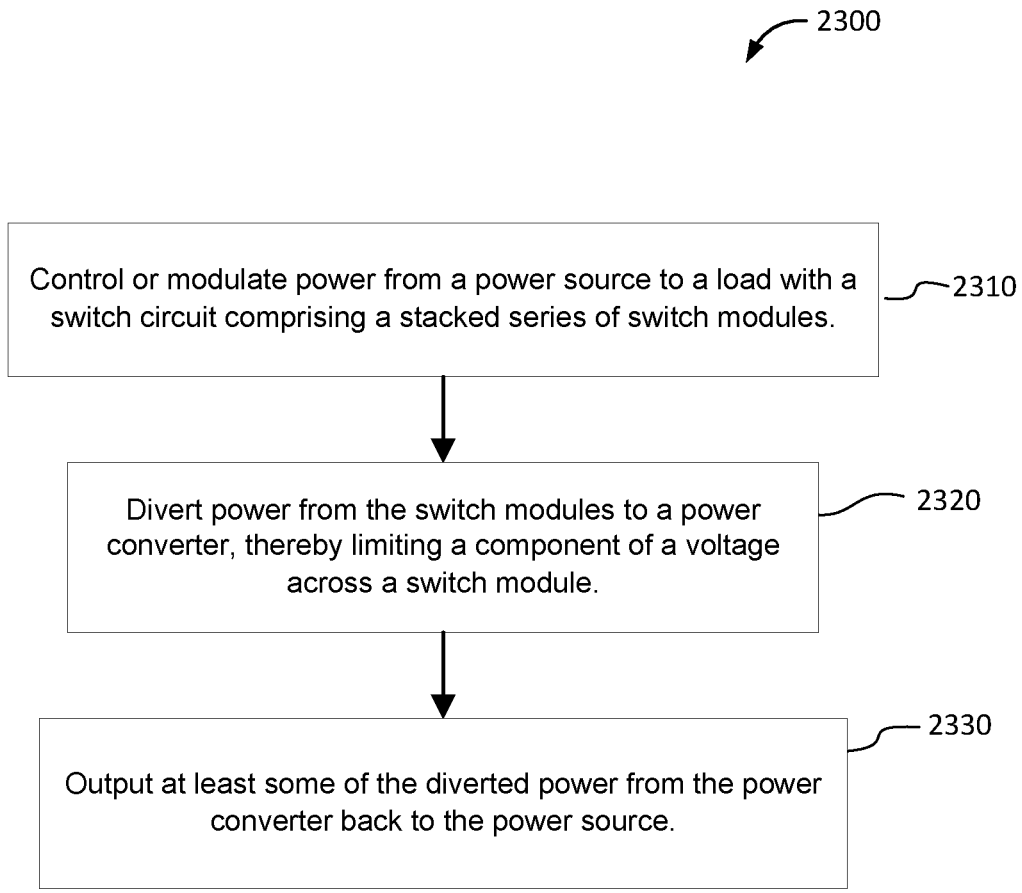
FIG. 23 depicts a flowchart for an example method embodiment of the disclosure.

FIG. 23 depicts a flowchart for an example method 2300, in another embodiment of the present disclosure. Method 2300 includes controlling or modulating power from a power source to a load with a switch circuit comprising a stacked series of switch modules (2310). Method 2300 further includes diverting power from the switch modules to a power converter, thereby limiting a component of a voltage across a switch module (2320). Method 2300 further includes outputting at least some of the diverted power from the power converter back to the power source (2330). Method 2300 may include other steps or variations in various other embodiments.

Figure 24:
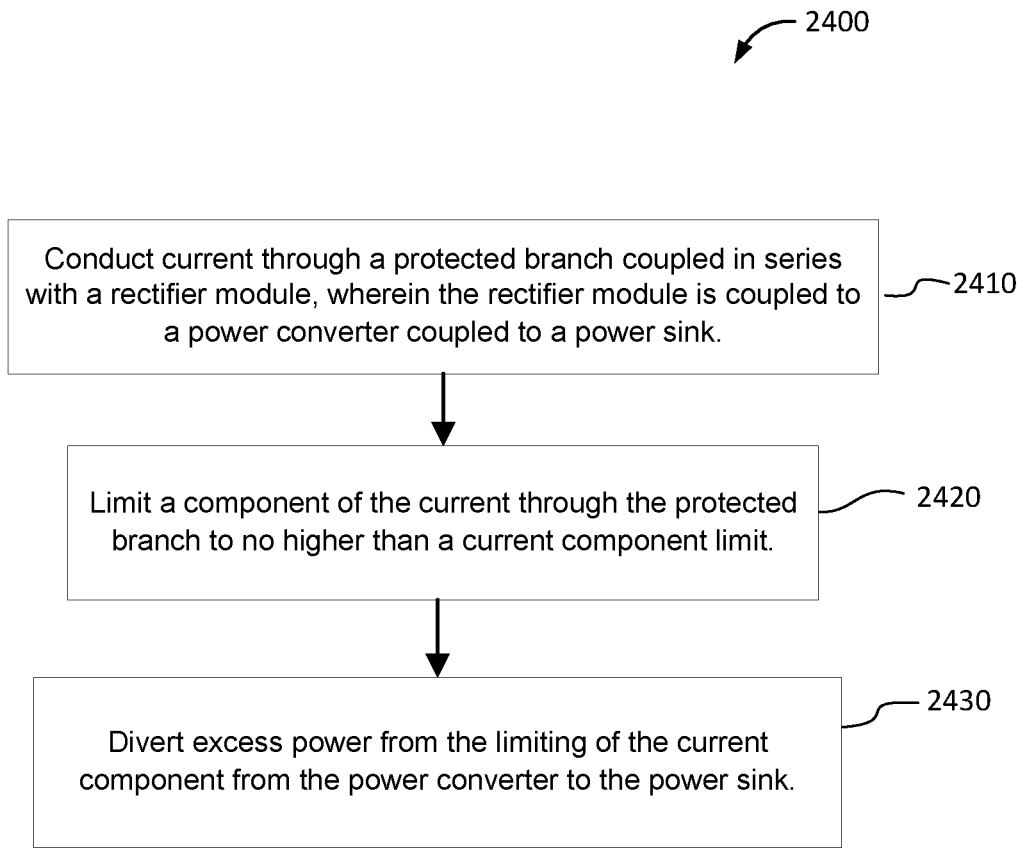
FIG. 24 depicts a flowchart for an example method embodiment of the disclosure.

FIG. 24 depicts a flowchart for an example method 2400, in another embodiment of the present disclosure. Method 2400 includes conducting current through a protected branch coupled in series with a rectifier module, wherein the rectifier module is coupled to a power converter coupled to a power sink (2410). Method 2400 further includes limiting a component of the current through the protected branch to no higher than a current component limit (2420). Method 2400 further includes diverting excess power from the limiting of the current component from the power converter to the power sink (2430). Method 2400 may include other steps or variations in various other embodiments.

Figure 25:
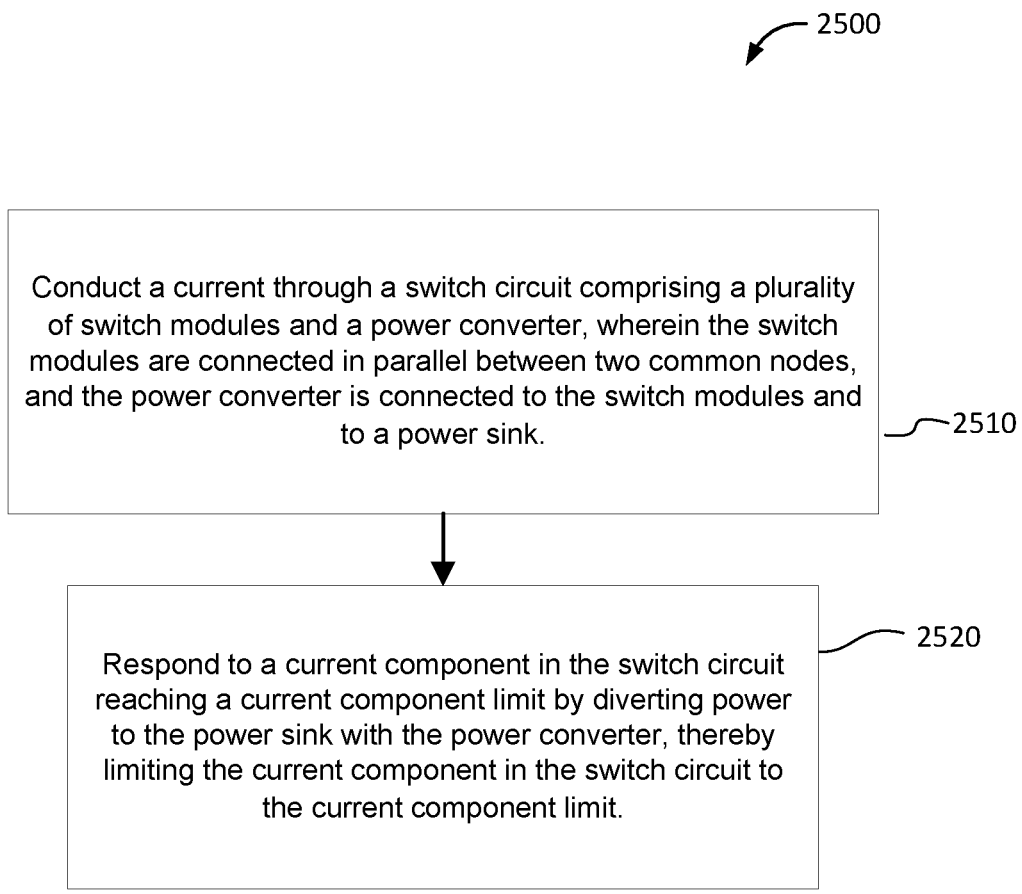
FIG. 25 depicts a flowchart for an example method embodiment of the disclosure.

FIG. 25 depicts a flowchart for an example method 2500, in another embodiment of the present disclosure. Method 2500 includes conducting a current through a switch circuit comprising a plurality of switch modules and a power converter, wherein the switch modules are connected in parallel between two common nodes, and the power converter is connected to the switch modules and to a power sink (2510). Method 2500 further includes responding to a current component in the switch circuit reaching a current component limit by diverting power to the power sink with the power converter, thereby limiting the current component in the switch circuit to the current component limit (2520). Method 2500 may include other steps or variations in various other embodiments.

FIG. 26 depicts a flowchart for an example method 2600, in another embodiment of the present disclosure. Method 2600 includes applying power to a match network connected to a load (2610). Method 2600 further includes responding to a current component of a current in the match network reaching a current component limit by diverting power from the match network via a rectifier module to a power converter, thereby limiting the current component in the match network (2620). Method 2600 further includes outputting the power from the power converter to a power sink (2630). Method 2600 may include other steps or variations in various other embodiments.

Figure 27:
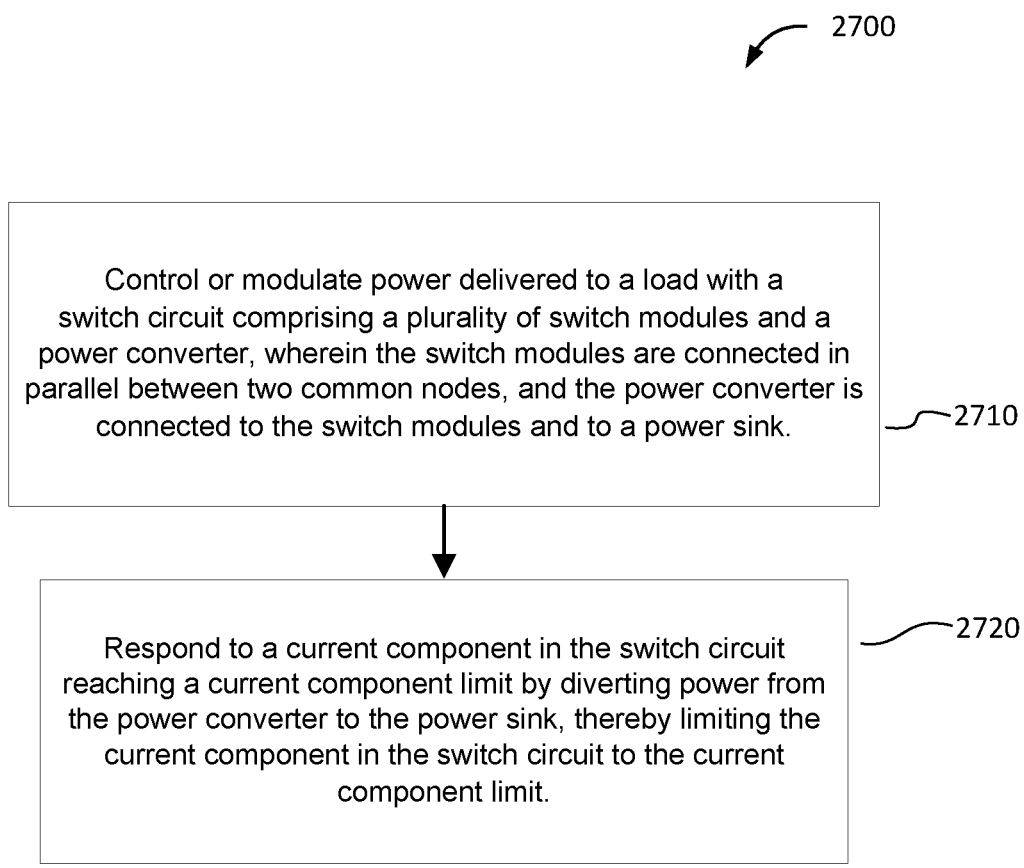
FIG. 27 depicts a flowchart for an example method embodiment of the disclosure.

FIG. 27 depicts a flowchart for an example method 2700, in another embodiment of the present disclosure. Method 2700 includes controlling or modulating power delivered to a load with a switch circuit comprising a plurality of switch modules and a power converter, wherein the switch modules are connected in parallel between two common nodes, and the power converter is connected to the switch modules and to a power sink (2710). Method 2700 further includes responding to a current component in the switch circuit reaching a current component limit by diverting power from the power converter to the power sink, thereby limiting the current component in the switch circuit to the current component limit (2720). Method 2700 may include other steps or variations in various other embodiments.

Methods 1400, 1500, 1600, 1700, 2000, 2100, 2200, 2300, 2400, 2500, 2600, 2700, may include other steps or variations in various other embodiments. Some or all of any of methods 1400, 1500, 1600, 1700, 2000, 2100, 2200, 2300, 2400, 2500, 2600, or 2700 may be performed by or embodied in hardware, and/or performed or executed by a controller, a CPU, an FPGA, a SoC, a measurement and control multi-processor system on chip (MPSoC), which may include both a CPU and an FPGA, and other elements together in one integrated SoC, or other processing device or computing device processing executable instructions, in controlling other associated hardware, devices, systems, or products in executing, implementing, or embodying various subject matter of the method.

Voltage clamping with power recovery and current clamping with power recovery are thus shown and described herein, in various foundational aspects and in various selected illustrative applications, architectures, techniques, and methods for voltage clamping and current clamping with power recovery. Those persons skilled in the relevant arts will be well-equipped by this disclosure with an understanding and an informed reduction to practice of a wide panoply of further applications, architectures, techniques, and methods for voltage clamping and current clamping with power recovery encompassed by the present disclosure and by the claims set forth below.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include a wide range of embodiments encompassing any such changes.

While the present disclosure has been described with reference to various embodiments, it will be understood that these embodiments are illustrative and that the scope of the disclosure is not limited to them. Many variations, modifications, and additions are possible within the scope of the embodiments of the disclosure. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A switch circuit comprising:
two terminal nodes, comprising an upper node and a lower node;
a plurality of switch modules, connected in series between the upper node and the lower node, wherein each of the switch modules comprises a switch, a rectifier, and a capacitor;
a connecting circuit, coupled to the switch modules; and
a power converter, coupled to the connecting circuit and to a power sink, wherein the switch circuit is configured to limit a voltage or a component of a voltage in the switch circuit, and to recover power from the limiting of the voltage, wherein recovering the power comprises diverting power from the switch modules via the connecting circuit to the power converter, and the power converter outputting the power to the power sink.

2. The switch circuit of claim 1, wherein the switch circuit is further configured to limit a voltage or a component of a voltage across one or more respective switches of the switch modules.

3. The switch circuit of claim 2, wherein the switch circuit is further configured to limit the voltage across the one or more respective switches, of one or more respective switch modules, to a sum of a nominal capacitor voltage of the capacitor of the respective switch module, and a rectifier voltage drop of the rectifier of the respective switch module.

4. The switch circuit of claim 1, wherein the connecting circuit comprises a series stack of diodes, wherein the diodes are coupled to the switch modules.

5. The switch circuit of claim 4, wherein the connecting circuit further comprises a plurality of switches coupled to the diodes, and wherein the power converter comprises a distributed power converter, and the distributed power converter comprises the switches comprised in the connecting circuit.

6. The switch circuit of claim 1, wherein the connecting circuit further comprises at least one of a plurality of inductors and a plurality of resistors coupled to the switch modules.

7. The switch circuit of claim 1, wherein the connecting circuit is coupled to each respective switch module of the switch modules at a node of the respective switch module between the rectifier and the capacitor of the respective switch module.

8. The switch circuit of claim 1, wherein the power converter is coupled to the upper node.

9. The switch circuit of claim 1, wherein the power converter is coupled to the lower node.

10. The switch circuit of claim 1, further comprising a first stacked switch circuit, a second stacked switch circuit, and an output node, wherein the first stacked switch circuit comprises a first portion of the switch modules, the second stacked switch circuit comprises a second portion of the switch modules, and the output node is coupled between the first stacked switch circuit and the second stacked switch circuit.

11. The switch circuit of claim 10, wherein the power converter is a first power converter, the switch circuit further comprising a second power converter, wherein the first power converter is coupled to the connecting circuit and to the upper node, and the second power converter is coupled to the connecting circuit and to the lower node.

12. The switch circuit of claim 1, further comprising the power sink coupled to the power converter, wherein the power sink comprises an alternating current (AC) power supply, and wherein the switch circuit is configured to output the recovered power from the power converter to the AC power supply.

13. The switch circuit of claim 1, further comprising the power sink coupled to the power converter, wherein the power sink comprises at least one of a direct current (DC) power supply and a DC rail, and wherein the switch circuit is configured to output the recovered power from the power converter to at least one of the DC power supply or the DC rail.

14. The switch circuit of claim 1, wherein the plurality of switch modules comprises a first stacked switch circuit, a second stacked switch circuit, and a midpoint node, wherein the first stacked switch circuit comprises a first portion of the switch modules, the second stacked switch circuit comprises a second portion of the switch modules, and the midpoint node is coupled between the first stacked switch circuit and the second stacked switch circuit, wherein the first stacked switch circuit is configured to sustain a positive voltage between the upper node and the midpoint node in the off state, and the second stacked switch circuit is configured to sustain a positive voltage between the lower node and the midpoint node in the off state, and wherein the switch circuit further comprises a power converter coupled to the midpoint node, a connecting circuit of one of the first or second stacked switch circuit, and a capacitor of a switch module in the other of the first or second stacked switch circuit.

15. A method comprising:
applying voltage across a plurality of switch modules connected in series between two terminal nodes, comprising an upper node and a lower node, wherein each of the switch modules comprises a switch, a rectifier, and a capacitor; and
diverting power from the switch modules via a connecting circuit, coupled to the switch modules, to a power converter, coupled to the connecting circuit and to a power sink, thereby limiting a component of a voltage over one or more of the switches, and recovering power from the limiting of the voltage to the power sink.

16. The method of claim 15, wherein applying voltage across the plurality of switch modules comprises applying voltage across a first stacked switch circuit comprising a first portion of the switch modules, a second stacked switch circuit comprising a second portion of the switch modules, and an output node coupled between the first stacked switch circuit and the second stacked switch circuit.

17. The method of claim 15, wherein applying voltage across the plurality of switch modules comprises applying voltage across a first stacked switch circuit comprising a first portion of the switch modules, a second stacked switch circuit comprising a second portion of the switch modules, and a midpoint node coupled between the first stacked switch circuit and the second stacked switch circuit, wherein the first stacked switch circuit can sustain a positive voltage between the upper node and the midpoint node and the second stacked switch circuit can sustain a positive voltage between the lower node and the midpoint node, and connecting a power converter to the midpoint node, a connecting circuit of one of the first or second stacked switch circuit, and a capacitor of a switch module in the other of the first or second stacked switch circuit.

18. A computing system comprising:
one or more processing devices, one or more tangible computer-readable memory devices, and one or more tangible computer-readable data storage devices;
program instructions, stored on the one or more data storage devices for execution by the one or more processing devices using the one or more memory devices, to configure a switch circuit applying voltage across a plurality of switch modules connected in series between two terminal nodes, comprising an upper node and a lower node, wherein each of the switch modules comprises a switch, a rectifier, and a capacitor; and program instructions, stored on the one or more data storage devices for execution by the one or more processing devices using the one or more memory devices, to configure the switch circuit to divert power from the switch modules via a connecting circuit, coupled to the switch modules, to a power converter, coupled to the connecting circuit and to a power sink, thereby limiting a component of a voltage in the switch circuit, and recovering power from the limiting of the voltage to the power sink.

19. The computing system of claim 18, wherein the program instructions to configure the switch circuit to apply voltage across the plurality of switch modules comprises program instructions to configure the switch circuit to apply voltage across a first stacked switch circuit, a second stacked switch circuit, and an output node, wherein the first stacked switch circuit comprises a first portion of the switch modules, the second stacked switch circuit comprises a second portion of the switch modules, and the output node is coupled between the first stacked switch circuit and the second stacked switch circuit.

20. The computing system of claim 18, wherein the program instructions to configure the switch circuit to apply voltage across the plurality of switch modules comprises:

program instructions to configure the switch circuit to apply voltage across a first stacked switch circuit, a second stacked switch circuit, and a midpoint node, wherein the first stacked switch circuit comprises a first portion of the switch modules, the second stacked switch circuit comprises a second portion of the switch modules, and the midpoint node is coupled between the first stacked switch circuit and the second stacked switch circuit, and wherein the first stacked switch circuit is configured to sustain a positive voltage between the upper node and the midpoint node and the second stacked switch circuit is configured to sustain a positive voltage between the lower node and the midpoint node; and program instructions to configure the power converter connected to the midpoint node, a connecting circuit of one of the first or second stacked switched circuits and a capacitor of a switch module in the other of the first or second stacked switch circuits to transfer power to the capacitor of the switch module.

\* \* \* \* \*